United States Patent
Kondratyev

(10) Patent No.: US 6,526,542 B2
(45) Date of Patent: Feb. 25, 2003

(54) MULTI-RAIL ASYNCHRONOUS FLOW WITH COMPLETION DETECTION AND SYSTEM AND METHOD FOR DESIGNING THE SAME

(75) Inventor: Alex Kondratyev, Campbell, CA (US)

(73) Assignee: Theseus Logic, Inc., Maitland, FL (US)

( * ) Notice: Subject to any disclaimer, the term of this patent is extended or adjusted under 35 U.S.C. 154(b) by 0 days.

(21) Appl. No.: 09/849,312

(22) Filed: May 7, 2001

(65) Prior Publication Data

US 2002/0188912 A1 Dec. 12, 2002

(51) Int. Cl.$^7$ .............................................. G06F 17/50
(52) U.S. Cl. ........................................................ 716/2
(58) Field of Search ............................................ 716/2

(56) References Cited

U.S. PATENT DOCUMENTS 5,638,290 A * 6/1997 Ginetti et al. .................. 29/847
6,269,468 B1 * 7/2001 Dean et al. ...................... 716/2

OTHER PUBLICATIONS

E. Grass et al., "Activity–Monitoring Completion–Detection (AMCD): A new single rail approach to achieve self–timing". IEEE, 1996, pp. 143–149.*

Harris Lampinen et al., "Circuit Design For Current–Sensing Completion Detection". IEEE, 1998, pp. II–185 to II–188.*

Jens Sparso et al., "Design of Delay Insensitive Circuits Using Multi–ring Structure". Integrations, the VLSIjournal, 15(3):313–340, pp. 15–20, Oct. 1993.

Christian D. Nielsen, "Evaluation of functionBlocks designs", In Proc. European Design Automation Conference (EURO–DAC), IEEE Computer Society Press, Sep. 1994, pp 1–43.

* cited by examiner

Primary Examiner—Tom Thomas
Assistant Examiner—Hung Kim Vu
(74) Attorney, Agent, or Firm—Steptoe & Johnson

(57) ABSTRACT

A method for designing a multi-rail asynchronous circuit is provided. The method includes providing a circuit having n circuit paths, defining a plurality of nodes, each node having an n-rail signal output and at least one n-rail signal input, each rail of the n-rail signal input being connected to a different one of the plurality of circuit paths, and adding completeness detection to each of the plurality of nodes, completion detection for a downstream one of the plurality of nodes being at least partially based on completion detection from an upstream one of the plurality of nodes. Signals propagate along the plurality of data paths independent of the completeness detection.

20 Claims, 69 Drawing Sheets

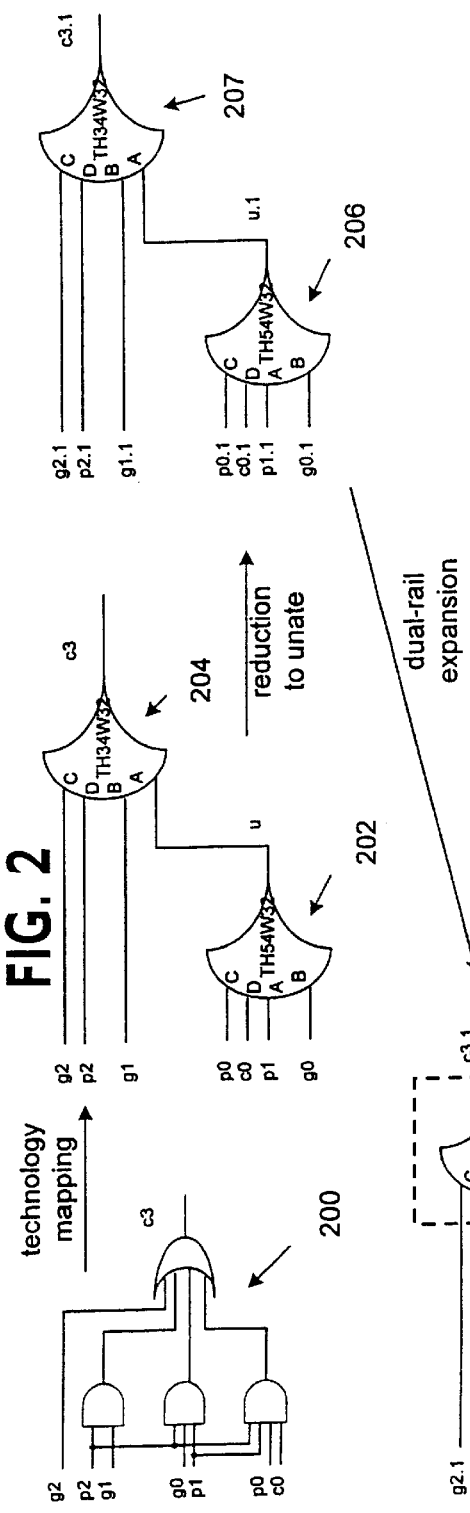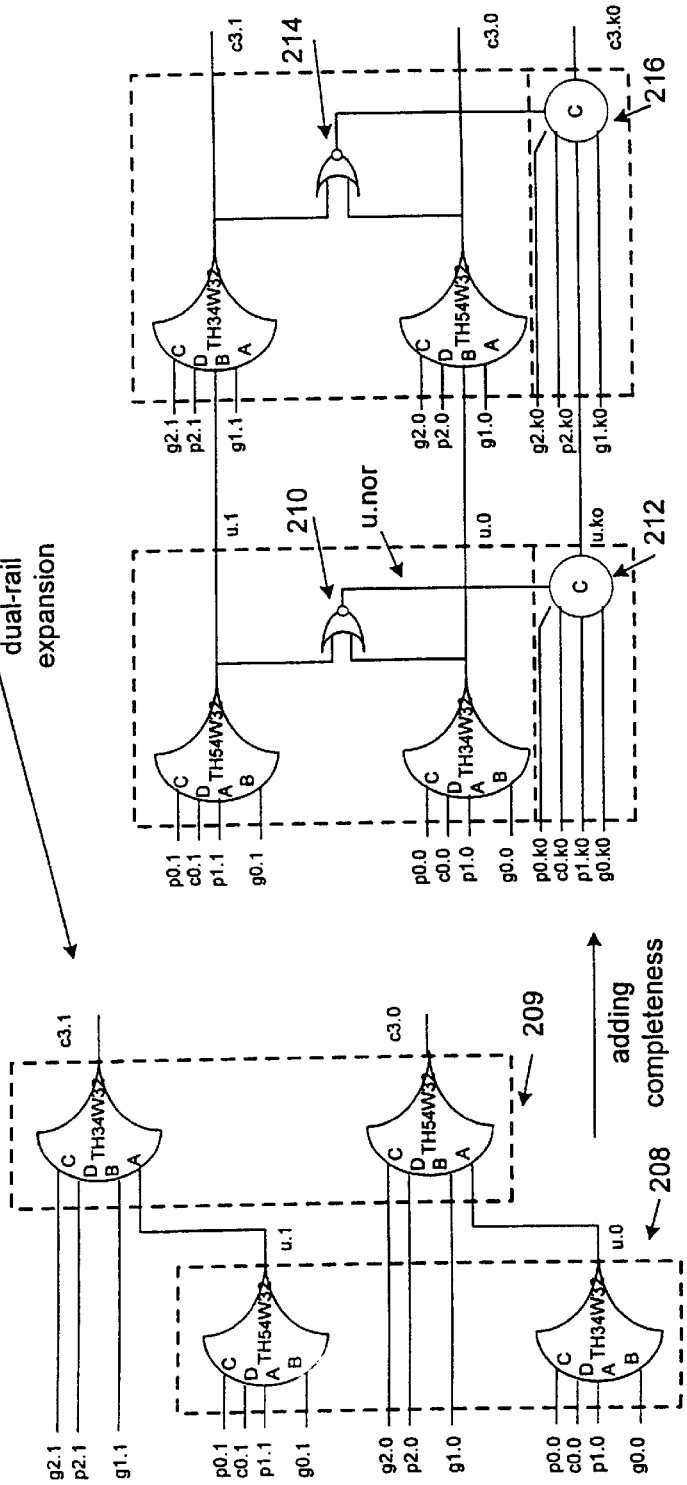
FIG. 2

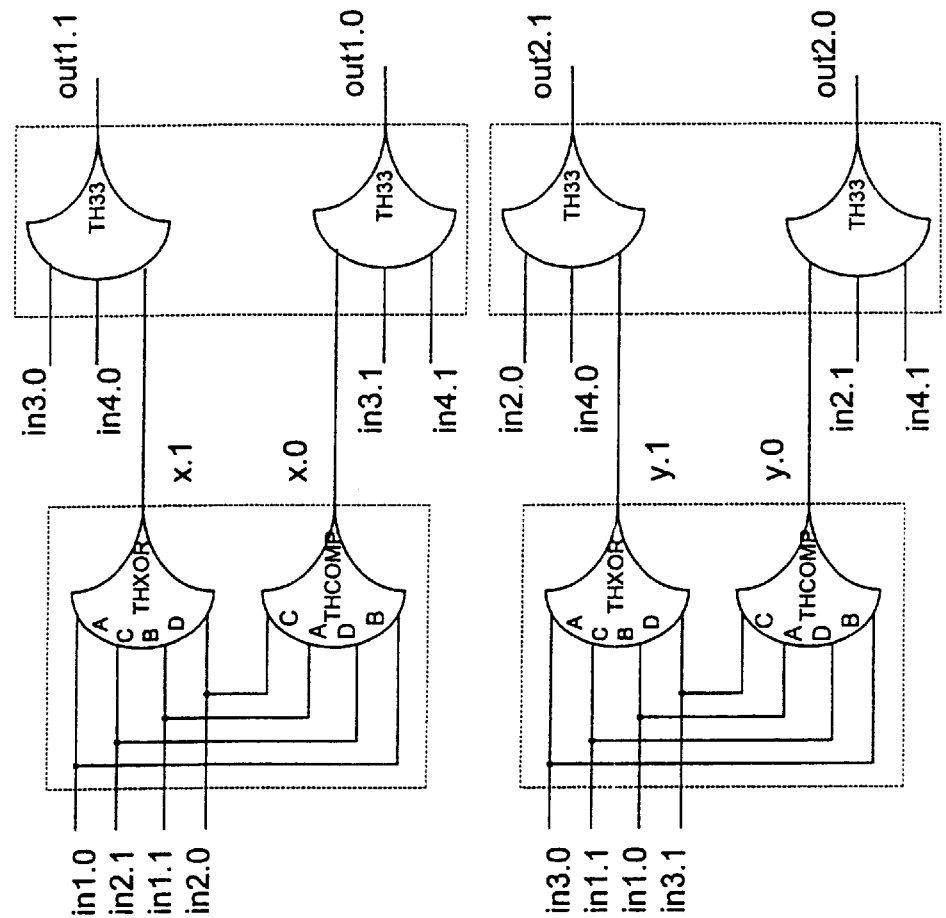
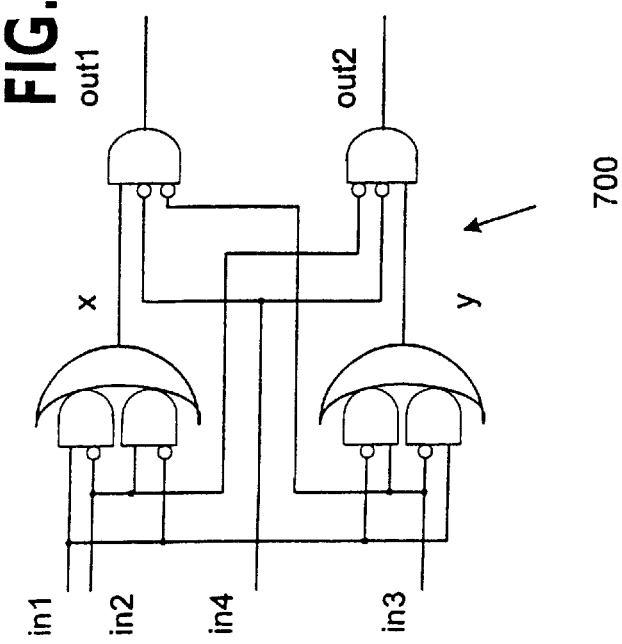
FIG. 7A

IH24

TH24W2

TH24W22

TH33W2

TH34

TH34W22

TH34W32

TH44

TH4N2

TH44W22

TH4W322

TH54W22

TH54W32

THAND0

THAND0

MULTI-RAIL ASYNCHRONOUS FLOW WITH COMPLETION DETECTION AND SYSTEM AND METHOD FOR DESIGNING THE SAME

BACKGROUND OF THE INVENTION

1. Field of the Invention

The present invention is directed to an asynchronous circuit with completion detection, and a system and method for designing the same. More specifically, the present invention is directed to conversion of a Boolean logic circuit to an asynchronous circuit, optimizing the completeness detection aspects of the circuit, and a system and method for designing the same.

2. Discussion of Background Information

Asynchronous circuits have been proposed that are intended to operate without a clock. One asynchronous logic paradigm is disclosed in U.S. Pat. No. 5,305,463 ("the '463 logic system"), issued Apr. 19, 1994, which is incorporated herein by reference in its entirety. Several data representations are discussed, but in one representation a signal may assume a DATA value or a NULL value. A DATA value, for example, might be a numeric value ZERO or ONE, or a logic value TRUE or FALSE, or another meaning not related to binary or Boolean logic representations.

In such a representation, a signal may take the form of two signal lines, with a first signal line designated to mean ZERO or FALSE, and the second signal line designated to mean ONE or TRUE. Each line may assume one of two states: "ASSERTED" or "NULL." The meaning of the pair of signal lines is determined by the states of the lines. The pair of lines together represents a single binary variable (such as a single bit of binary data) and have four possible states: (1) ASSERTED, ASSERTED, (2) ASSERTED, NULL, (3) NULL, ASSERTED, and (4) NULL, NULL.

The first state (ASSERTED/ASSERTED) is not permitted. The second state (NULL/ASSERTED) represents/signifies meaningful data of a value ZERO or FALSE. The third state (ASSERTED/NULL) represents/signifies meaningful data of value ONE or TRUE. The fourth state (NULL/NULL) can be thought of as indicating that the variable is in a NULL state and has not assumed a meaningful value.

This representation is known as a multi-rail representation of mutually exclusive assertion groups for asynchronous circuits. Dual-rail representation (i.e., two signal lines with three states: NULL, DATA ZERO and DATA ONE) is a specific subset of multi-rail representation. As used herein, DATA collectively refers to DATA ZERO and DATA ONE states for a dual rail representation (and for any other DATA X states for multi-rail lines with three or more signal lines).

Asynchronous circuits designed consistent with the above require some type of indication that the computations are completed. A circuit is "indicating" if each signal transition "a", on an input or internal signal in the circuit, is a cause of a transition "b", on an output signal, that could not occur without "a". If an asynchronous circuit is not "indicating," then additional circuitry may be necessary to ensure correct asynchronous operation. Delay Insensitive Minterm Synthesis (DIMS) is a method that uses C-elements as the basis of such additional "completeness" circuitry. A drawback of DIMS is that it requires a great deal of space and logic elements, with a correspondingly high cost. Further, since the functional aspects of the underlying circuit and the completion aspects are intertwined, it is difficult to reduce or optimize the completion aspects of the circuit without adversely affecting the functionality of the circuit.

At present, while the overwhelming majority of circuit designers can design circuits using Boolean logic, only a small number of designers exist who can design asynchronous circuits that operate using multi-rail signals. While there are certain available methodologies for converting a Boolean expression into an asynchronous circuit (such as DIMS), these methodologies result in large circuits with correspondingly high design and production costs.

SUMMARY OF THE INVENTION

The present invention addresses the drawbacks of the prior art.

According to an embodiment of the invention, a design methodology is provided for converting a Boolean logic circuit into an asynchronous circuit.

According to another embodiment of the invention, a design methodology is provided for adding and optimizing completeness detection in an asynchronous circuit.

According to an embodiment of the invention, a method for designing a multi-rail asynchronous circuit is provided. The method includes providing a circuit having n circuit paths, defining a plurality of nodes, each node having an n-rail signal output and at least one n-rail signal input, each rail of the n-rail signal input being connected to a different one of the plurality of circuit paths, and adding completeness detection to each of the plurality of nodes, completion detection for a downstream one of the plurality of nodes being at least partially based on completion detection from an upstream one of the plurality of nodes. Signals propagate along the plurality of data paths independent of the completeness detection.

According to another embodiment of the invention, a method is provided for designing a multi-rail asynchronous circuit that operates using n-rail signals, the circuit including at least one primary input, at least one primary output, and at least one intermediate output. The method includes providing a circuit having n circuit paths, defining a plurality of nodes, each node having at least one n-rail signal output and at least one n-rail signal input, each of the n circuit paths providing a rail of the n-rail signal input, adding completeness detection to at least those nodes that generate intermediate outputs, completion detection for a downstream one of the plurality of nodes being at least partially based on completion detection from an upstream one of the plurality of nodes; and optimizing the completeness detection. The circuit is capable of propagating signals along the plurality of circuit paths independent of the completeness detection.

According to yet another embodiment of the invention, a method is provided for designing a dual-rail asynchronous circuit from a Boolean expression. The method includes converting the Boolean expression into a corresponding first plurality of circuits along a first data path, converting each of the plurality of circuits into an unate circuit, providing a dual circuit along a second data path, each of the dual circuits being the dual of a corresponding unate circuit, each of the unate circuits and the corresponding one of the dual circuits defining a node, and adding completeness detection circuitry for at least each intermediate output between the nodes such that completion detection of at least one downstream node is based at least partially on completion detection of at least one upstream node. The completeness detection circuitry does not affect propagation of signals through the nodes.

According to still another embodiment of the invention, a method is provided for adding completeness to an n-rail asynchronous circuit including a plurality of nodes. The method includes assigning to a completion tree at least all primary inputs to the plurality of nodes and intermediate outputs between any of the plurality of nodes, optimizing the completion tree, comprising at least one of removing duplicate completion detection of any signal, testing whether the plurality of nodes is indicating for any primary input, testing whether the plurality of nodes is indicating for any intermediate output, removing completion detection circuitry that proves unnecessary in response to a result of the optimizing, and designing the circuit based on a result of the removing.

According to still yet another embodiment of the invention, a method is provided for adding completion to an n-rail circuit including a plurality of nodes, each node including n rail circuits that define an n-rail output, the n-rail circuit having k primary inputs. The method includes, for each node, providing circuit logic that can obtain a completion signal for each input to the node, providing circuit logic that can issue a data signal representing the presence of DATA on the n rails of the n-rail output, and inputting the output of the circuit logic for the data signal and completion signal for each input to the node into a completion detector, testing, for each of the k inputs, whether the n-rail circuit is indicating; and removing completion detection for any of the k inputs for which the n-rail circuit is indicating.

According to still yet another embodiment of the invention, an n-rail asynchronous circuit is provided. The circuit includes a plurality of primary inputs to the circuit, a plurality of nodes in a data path, each node representing at least one n-rail circuit, an output from an upstream node to a downstream node representing an intermediate output, and a completion detection circuit capable of receiving completion detection signals for each of the primary inputs to the circuit and each of the intermediate outputs for which the circuit is not inherently indicating.

According to an embodiment of the invention, a register for use in asynchronous n-rail circuits, is provided. The register includes an input side configured to receive at least one n-rail signal and at least one completion signal, an output side configured to output the at least one n-rail signal, a plurality of gates configured to provide a circuit path from the input side to the output side in response to receipt of an external signal, a first completion detector circuit configured to receive each of the at least one completion signal, for each of the at least one n-rail signal, an individual completion detection circuit configured to receive the n-rails of the at least one signal and to output a completion signal, and a second completion detection circuit configured to receive the output of the first completion detection circuit, each of the individual completion circuits. The second completion circuit is configured to provide a completion signal for each of the at least one rail signal on the output side.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIG. 2 illustrates the conversion of a Boolean circuit for a third bit carry adder into a dual rail asynchronous circuit with completeness detection;

FIGS. 7A and 7B illustrate the conversion of a Boolean circuit into a dual rail asynchronous circuit with completeness detection;

DETAILED DESCRIPTION OF THE EXEMPLARY EMBODIMENT

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
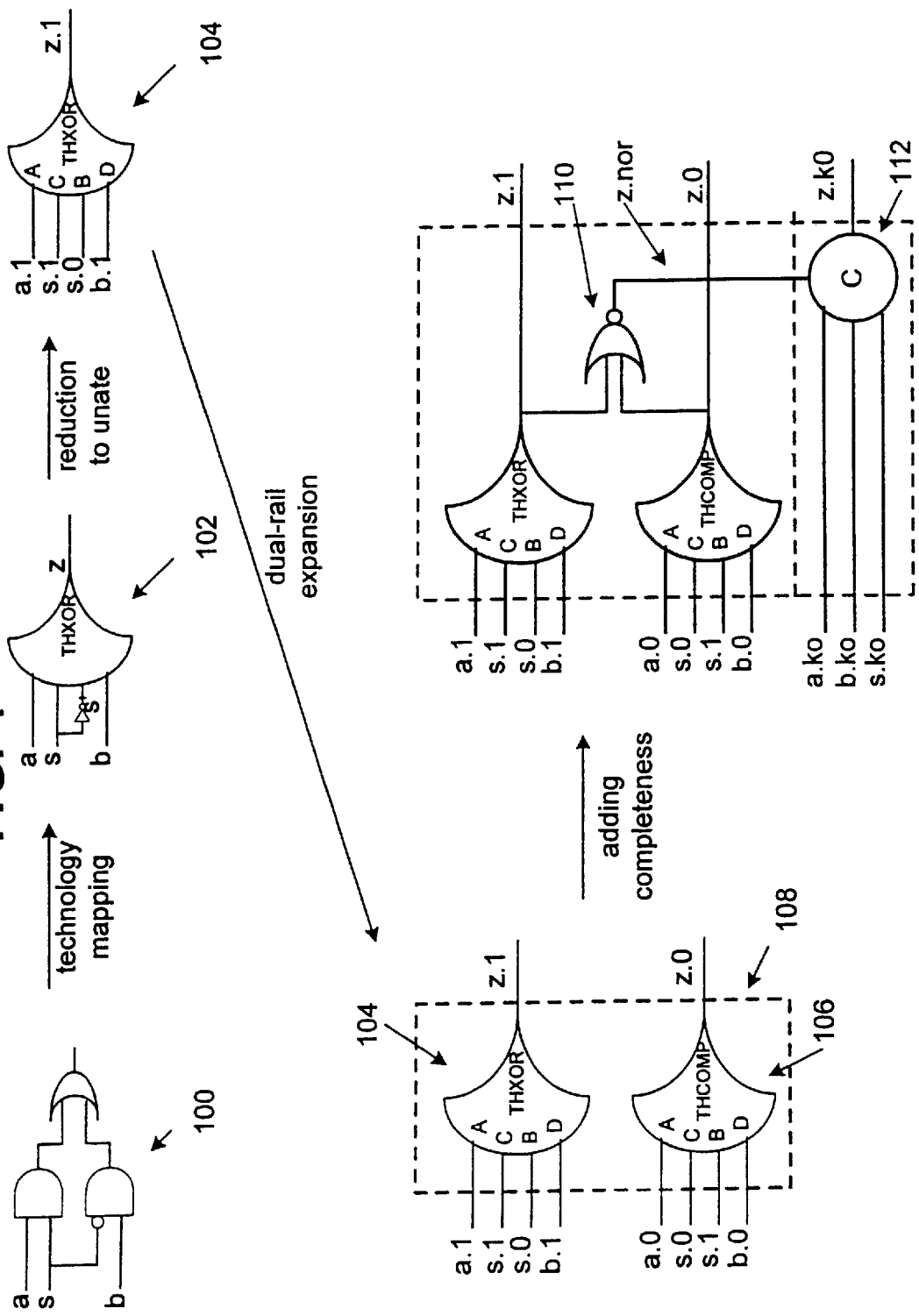
FIG. 1 illustrates the conversion of a Boolean circuit for a multiplexer into a dual rail asynchronous circuit with completeness detection.

FIG. 1 shows the conversion of a Boolean-function multiplexer 100 designed using Boolean gates into a corresponding asynchronous circuit. The signal naming convention used throughout this description assigns a name to a Boolean signal, such as "a", "b", or "s." A corresponding dual-rail signal requires two signals for the zero and one values (lines) which are denoted by the suffix ".0" and ".1", respectively. For example, a.0 signifies the zero signal line for variable a. Other signals use a similar naming convention.

The circuit is mapped into a library to convert the circuit into specific single circuit/gates or multiple circuits. The only formal requirements are that the gates/circuits execute functions without inversions (unate functions), and have a dual in the library. For purposes of reference, F is dual to G if it is derived from G by replacing every OR operation by AND, and vice versa, and replacing each literal of G on its dual (i.e., x.0 is replaced by x.1) and vice versa.

The library preferably includes circuit elements/gates for which it is simple to utilize completion signals.

| NCL gate | function | Dual NCL gate | function |
| --- | --- | --- | --- |
| TH11 | A | TH11 | A |
| TH22 | A*B | TH12 | A + B |
| TH33 | A*B*C | TH13 | A + B + C |
| TH44 | A*B*C*D | TH14 | A + B + C + D |
| TH23W2 | A + B*C | TH33W2 | AB + AC |
| TH23 | AB + BC + AC | TH23 | AB + BC + AC |
| TH24W22 | A + B + CD | TH54W22 | ABC + ABD |
| TH24W2 | A + BC + BD + CD | TH44W2 | ABC + ABD + ACD |
| TH24 | AB + AC + AD + BC + BD + CD | TH34 | ABC + ABD + ACD + BCD |
| TH34W22 | AB + AC + AD + BC + BD | TH44W22 | AB + ACD + BCD |
| TH34W2 | AB + AC + AD + BCD | TH34W2 | AB + AC + AD + BCD |
| TH34W32 | A + BC + BD | TH54W32 | AB + ACD |
| TH44W322 | AB + AC + AD + BC | TH54W322 | AB + AC + BCD |
| TH44W3 | AB + AC + AD | TH34W3 | A + BCD |
| THAND0 | AC + AD + BC | THAND0 | AC + AD + BC |
| THXOR0 | AC + BD | THCOMP | AB + AD + CB + CD |

Each of the above TH gates is a single gate in the library. One implementation of the above library is shown in FIGS. 41–69.

The threshold gate naming convention designates a threshold gate with a prefix "TH." Threshold gates can be characterized by the number of inputs and a threshold number such that, when the threshold number of inputs achieved meaningful values, the output switches to a meaningful value. When designating threshold gates, the prefix "TH" is followed by a first number signifying the threshold, and second number signifying the total number of inputs. For example, TH34 designates a threshold gate with four inputs and a threshold of three.

In some cases, an input signal may be given added weight. For example, when determining whether the threshold has been met, an input signal line, when meaningful, may count as two, rather than one; such additional weight is designated by "W2". For example, a four-input threshold gate having a threshold of three, by where one signal line has a weight of two, would be designated as "TH34W2". A four input gate having a threshold of three having one signal line with a weight of two and another signal line having a weight of three would be designated TH34W23.

Schematics of preferred implementations of the above gates are shown in FIGS. 12–40, although other implementations can be used. However, the invention is not limited to this library, and the library may include multiple gates that correspond to a particular Boolean circuit or equation (hereinafter "Boolean expression"). In addition, the library may be a Boolean-based library that uses Boolean gates to form the circuit in which the each gate is unate and has a dual.

In the library for this embodiment, multiplexer 100 maps onto the circuit 102, in this case a THXOR gate with an input inverter. The circuit 102 is then converted into an "unate" gate 104. For dual rail operations, a circuit will be needed for rail.1 and rail.0, respectively. The reduction to unate converts circuit 102 into rail.1 format by setting each of the uninverted inputs and outputs to one signal line (.1) of the dual rail, while each of the inverted inputs will be set at the other signal line of the dual rail (.0). Thus, to convert circuit 102 to unate gate 104, we note the following signal line assignments: inputs a, s and b are assigned the signal lines a.1, s.1, and b.1, respectively; output z is assigned line z.1, and the inverted input s' is assigned line s.0.

For THmm gates, the arrangement of input signals relative to the input gates are not of particular relevance, and thus not shown specifically in the accompanying drawings. However, the arrangement is fixed for certain gates, such that the input arrangement relative to the above-noted library is shown in the figures.

An appropriate dual gate 106 for the rail.0 is then selected from or by the library, in this case a THCOMP gate. As seen in FIG. 1, each of the inputs and outputs of the dual gate 106 are the opposite rail designation from unate gate 104. Unate gate 104 and dual gate 106 collectively define a node 108, as the two provide the z.1 and z.0 outputs that collectively form the dual rail output for z.

Completion detection is then added to determine when the output rail z is complete. A NOR gate 10 (a TH12 gate or an OR gate could also be used, although a NOR gate is preferred due to lower cost) receives the dual rail outputs z.1 and z.0. The output of NOR gate 110 (z.nor) will only be ASSERTED when z.1 and z.0 are NULL, i.e., z.nor will transition to NULL when the z rail outputs transition from NULL to DATA (i. e., either z.1 or z.0 transitions to ASSERTED). The output z.nor is input to a completion detection circuit, which is preferably a Muller C element.

Completion signals for a, s, and b (a.k0, s.k0, and b.k0) are also input into completion detection circuit 112. These completion signals are generated preferably by NOR gates (not shown in FIG. 1) connected to the rail lines (e.g., such that a.k0=a.nor), or otherwise generated by other upstream completion detection circuits 112 (not shown in FIG. 1).

In asynchronous circuits of this type, each wave of DATA is interspersed with a wave of NULL. Each of the completion signals will therefore be ASSERTED in response to a wave of NULL, such that the output of completion detection circuit 112 will also be ASSERTED. In the preferred embodiment, ASSERTED on any completion signal indicates that the signal is not complete (i.e., not finished processing).

Sometime after DATA propagates through the circuit, one signal line of each dual rail pair for each of a, b, s, and z will transition from NULL to DATA. Each respective completion signal will correspondingly change from ASSERTED to NULL. When all of the completion signals a.k0, b.k0, s.k0, and z.nor transition from ASSERTED to NULL, then completion detection circuit 112 will transition from ASSERTED to NULL, which represents that the z output is complete. Completion circuit 112 will therefore only output a completion signal for z.k0 (ack) when inputs a, s, and b are complete, and DATA is present on the z rail.

FIG. 2 shows the implementation for a $3^{rd}$ bit of a carry-in-carry-look-ahead adder 200. The function is specified in terms of carry generation (gi) and carry propagation (pi) functions for previous bits. The Boolean expression for the output c3 is c3=g2+p2g1+p2p1g0+p2p1p0c0.

Technology mapping of this Boolean expression results in an upstream circuit 202 and a downstream circuit 204 that collectively define a first circuit/data path. Upstream circuit 202 has inputs p0, c0 p1, and g0, and an intermediate output u. Downstream circuit 204 has inputs g2, p2, g1, and u, with c3 as an output.

Since all inputs and outputs are not inverted, each is assigned to the (.1) rail for conversion to unate for upstream unate circuit 206 and downstream unate circuit 207 to define a second circuit/data path. Dual circuits are selected by (or from) the library for the (.0) rail for the two-rail expansion. Each set of unate circuits and dual circuits collectively forms upstream node 208 and downstream node 209.

Completion detection is then added for each of the two outputs u and c3. For output u, a NOR gate 210 (producing output u.nor) connects to both rails of the u output. The output of the NOR gate 210 inputs to completion circuit 212 along with the completion signals for inputs p0, c0, p1, and g0 (p0.k0, c0.k0, p1.k0, and g0.k0). A completion signal u.k0 is generated when completion circuit 212 receives completion signals for the inputs to node 208 and the presence of DATA on the u rail.

For output c3, NOR gate 214 connects to both rails of the c3 output. The output of NOR gate 214 (c3.nor) inputs to a completion circuit 216 along with the completion signals for inputs p2, g2, g1, and u (p2.k0, g2.k0, g1.k0, and u.k0). A completion signal c3.k0 is generated when completion circuit 216 receives completion signals for the inputs and DATA is present on the c3 output rails.

Completion signals p0.k0, c0.k0, p1.k0, g0.k0, p2.k0, g2.k0 and g1.k0 are preferably (1) derived from NOR gates (not shown) that are either part of the circuit or built into an upstream register from which the corresponding rails are generated, or (2) from an upstream node that generates the completion signal. Completion signal u.k0 is an example of a completion signal from an upstream node being used to generate a completion signal for a downstream node.

As can be seen from the above, the completion signals are preferably generated by the nodes in the data path. Further, completion signals from upstream nodes can be used in determining completeness of downstream nodes (e.g., the completion signal u.k0 is an input to the completion detection circuit 216 for completion signal c3.k0). However, the completion signal plays no role in the propagation of DATA and NULL through the nodes.

Figure 3:
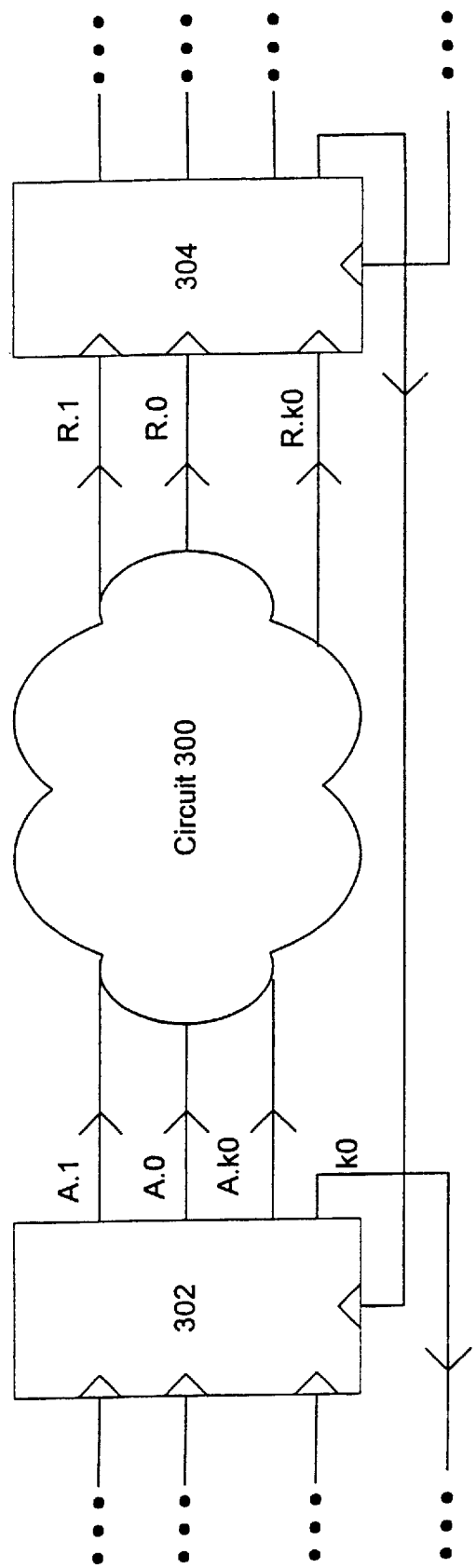
FIG. 3 illustrates the operating environment of the preferred embodiment of the invention.

FIG. 3 illustrates the environment in which these asynchronous circuits are used. A circuit 300 preferably has an associated upstream input register 302 and a downstream output register 304. Each register can support 0–n sets of inputs and 0–n sets of outputs (one set shown in FIG. 3), and may include as many inputs or outputs as are necessary or desirable. Circuit 300 may contain various nodes of computation circuitry, such as in FIGS. 1, 2 and 7.

Figure 4:
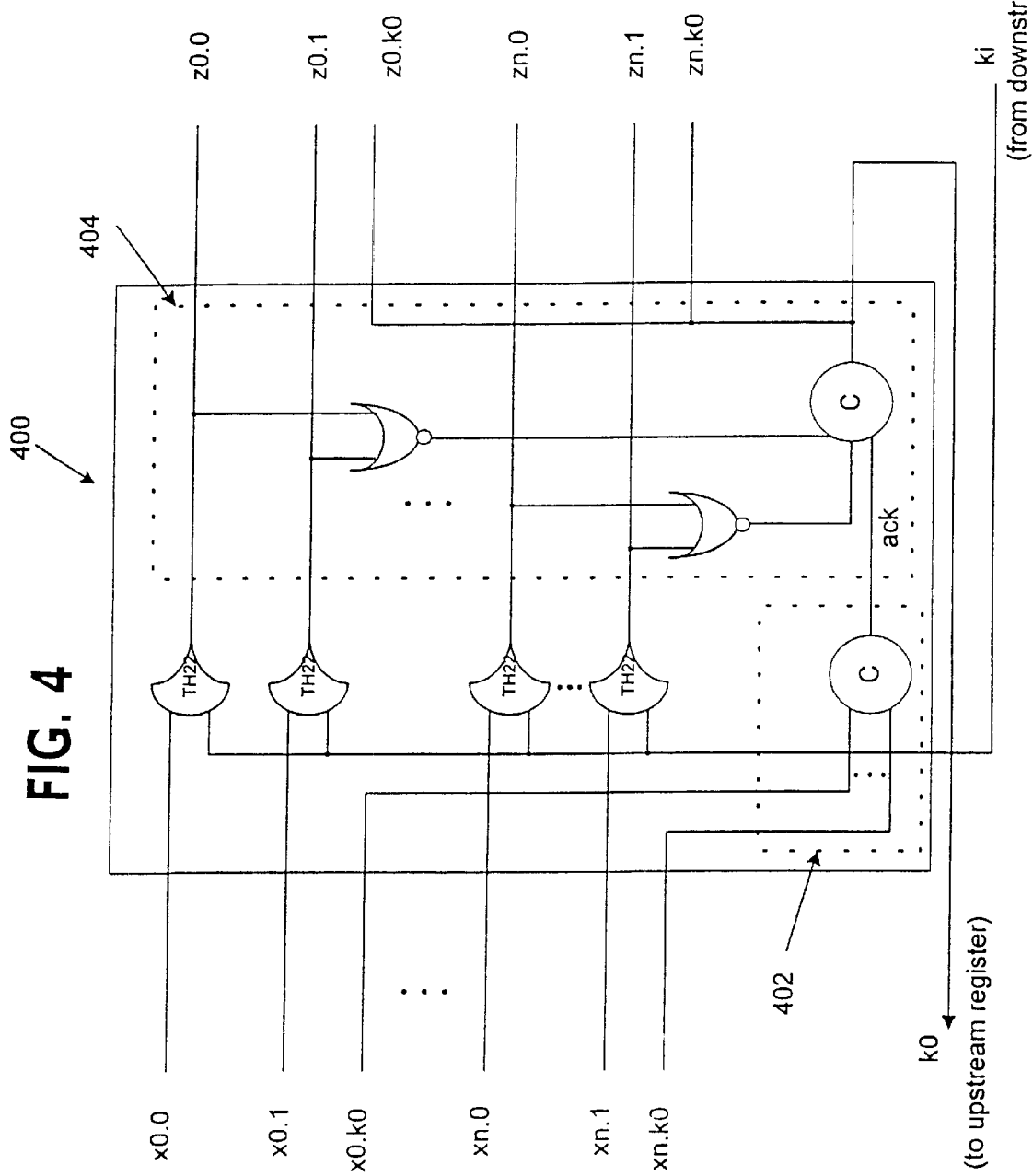
FIG. 4 illustrates a register for use in the preferred embodiment of the invention.

FIG. 4 illustrates the internal components of a register 400 (such as register 302 or 304). At the input side, register 400 receives rail signals (dual rail in this embodiment) along with the associated completion signal for each. Each rail line of the x signals are input into a TH22 (or 2-input C-element) with hysteresis along with the completion signal ki of the next downstream register. With reference to FIG. 3, a wave of DATA/NULL applied at to the input side of register 302 will only pass when the next downstream register (register 304) indicates that circuit 300 is complete and ready to accept the next wave of DATA/NULL.

Register 400 includes an input-completion circuit 402 and an output-completion circuit 404. Input-completion circuit 402 receives each of the completion signals for x0–xn to generate a completion signal ack. Output-completion circuit 404 receives ack and the NOR gate output of each set of rails z0–zn; the output of output-completion circuit 404 will serve as the completion signal (z0.k0–zn.k0) for each of z0–zn, as well as the completion signal k0 to the upstream register to indicate that the upstream circuit (that generated signals x0–xn) is ready to accept the next wave of DATA or NULL.

In theory, the number of completion detector elements used is largely a function of the size of the register and the size of the completion detection elements. Each of the individual completion elements in register 400 may include several sub-detectors; by way of non-limiting example, an 8-input register may use two 4-input C-elements and a 2-input C-element to provide the ack signal. For a small register, the input and output completion circuits 402 and 404 could be combined into a single circuit.

In an alternative to the above, the input completion circuit could be omitted if the completion elements are present in the upstream circuit to generate an ack signal directly, rather than deriving it from the primary inputs.

While register 400 is labeled to receive the completion signals for x0–xn, the actual completions signals input may not necessarily correspond to the inputs signal. For example, following optimization (discussed below), completion signals corresponding to the signal inputs x0–xn may not exist, such that the inputs for the completion signals will simply receive whatever completion signals that are being generated by the upstream circuit. Preferably, if register 400 is configured to receive n sets of inputs, then it will be configured to receive n completion signals.

Figure 5:
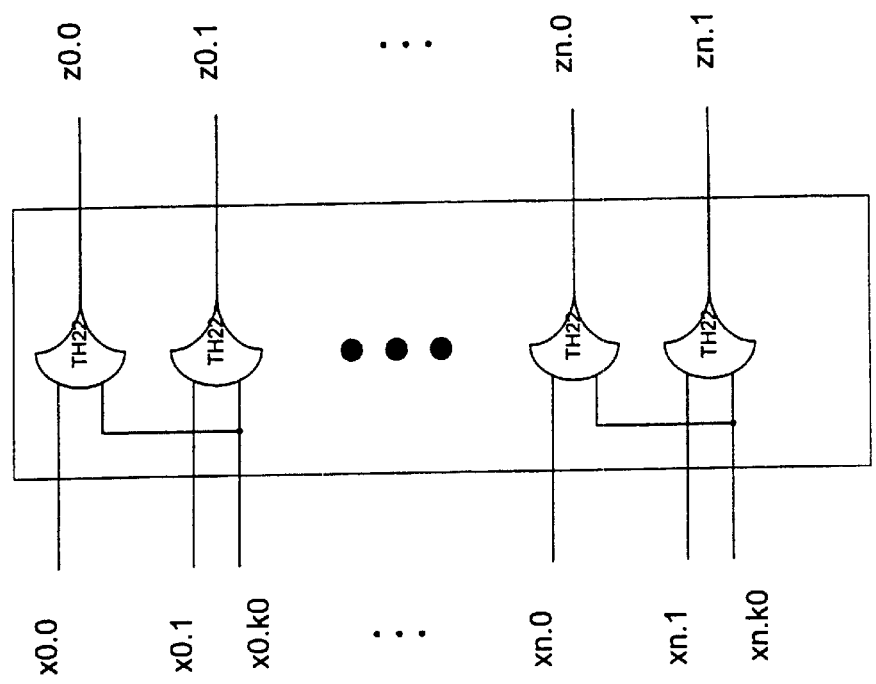
FIG. 5 illustrates an input signal converter.

It is not expected that a multi-rail signal external to the circuit will include an associated completion signal. In such a situation, interface circuitry may be necessary. As seen in FIG. 5, a completion signal for any multi-rail input can be derived by connecting the input to a NOR gate (or an OR gate). Such interface circuitry may be in the form of a distinct converter element, or as additional circuitry added to the main circuit. As discussed below, optimization of the circuit may call for elimination of some or all of these NOR gates, or the entire converter.

Figure 6:
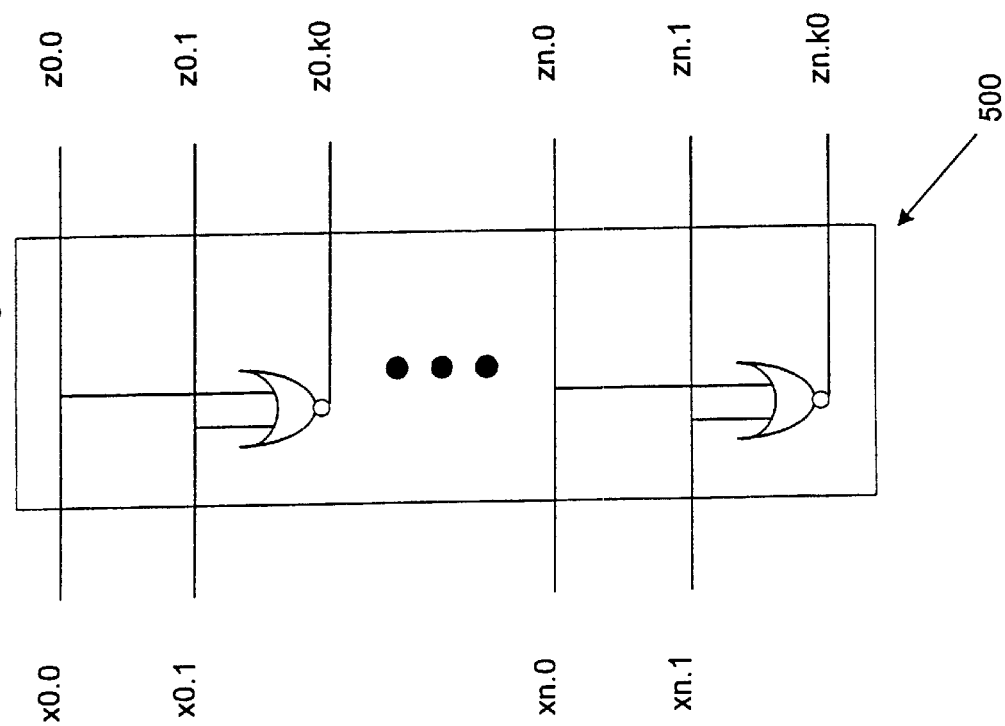
FIG. 6 illustrates an output signal converter.

Similarly, FIG. 6 shows interface circuitry for converting a multi-rail signal and associated completion signal into multi-rail format. Each rail and the associated completion signal is input into a TH22 gate with hysteresis (i.e., it will not transition from a meaningful state to NULL until all inputs transition to NULL).

Figure 7B:
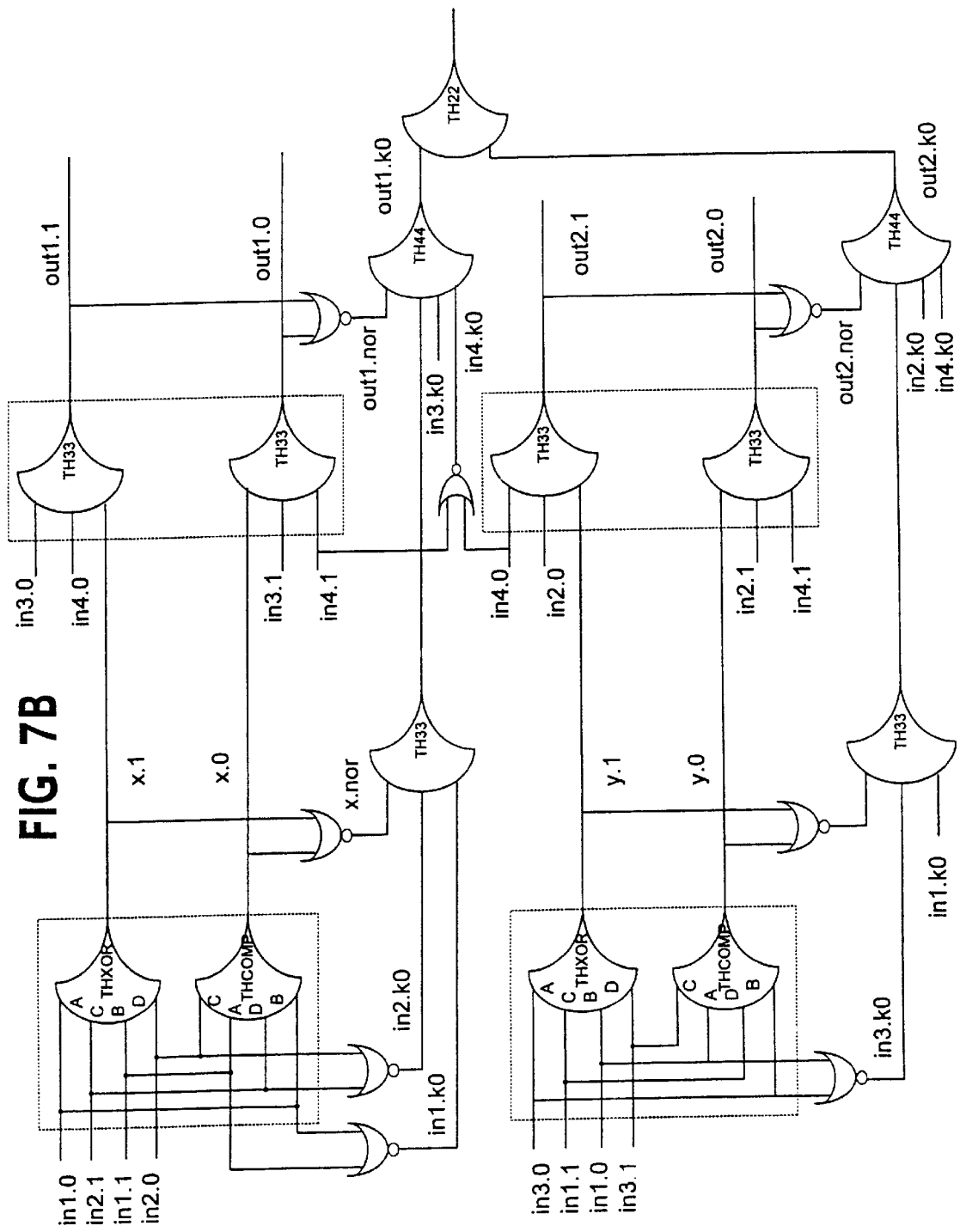

FIGS. 7A and 7B illustrates conversion of a Boolean expression of a circuit 700, where:

out1=in3'in4'(in1 in2'+in1'in2)

out2=in2'in4'(in1 in3'+in1'in3)

As in the previous embodiments, the Boolean expression is mapped into the library, converted into unate circuits, and assigned dual circuits to create nodes, and completeness is added. Each of the inputs in1–in4 are primary inputs to the circuit. Each pair of rails for each input is connected to a NOR gate (to form the initial interface circuitry), the output of which represents a ".k0" completion signal for the corresponding primary input. The output of each NOR gate is input to C element (e.g., THMM gates, where M is the number of inputs), along with the NOR output of the rails of the particular node. The completion signal ack is responsive to the presence of all of the completion signals of the various nodes in circuit 700, such that the presence of completion signal ack indicates that all of the nodes in circuit 700 have stably processed DATA on the primary inputs, and that DATA appears on the primary output(s).

The presence of completion in the above embodiments may be thought of as "explicit" completion in that every input, every intermediate output and preferably every primary output (if the configuration of FIG. 4) has a completion signal associated therewith. However, blind adherence to explicit completion may provide for duplicative completion detection of the same rails when only one completeness check is necessary. Various optimization techniques may therefore be used to optimize the overall completion circuit.

By way of non-limiting example, the completion detection circuits can be optimized using the same methodology as for optimization of a tree of AND gates ("AND-tree optimization"). In other words, if one node within the circuit has completeness detection for a particular signal, then it is not necessary for any other nodes to also check for completeness of that signal. By way of example, in circuit 700, the completion detection circuits for both the x and y nodes process in1.k0, which is ultimately duplicative.

Figure 8:
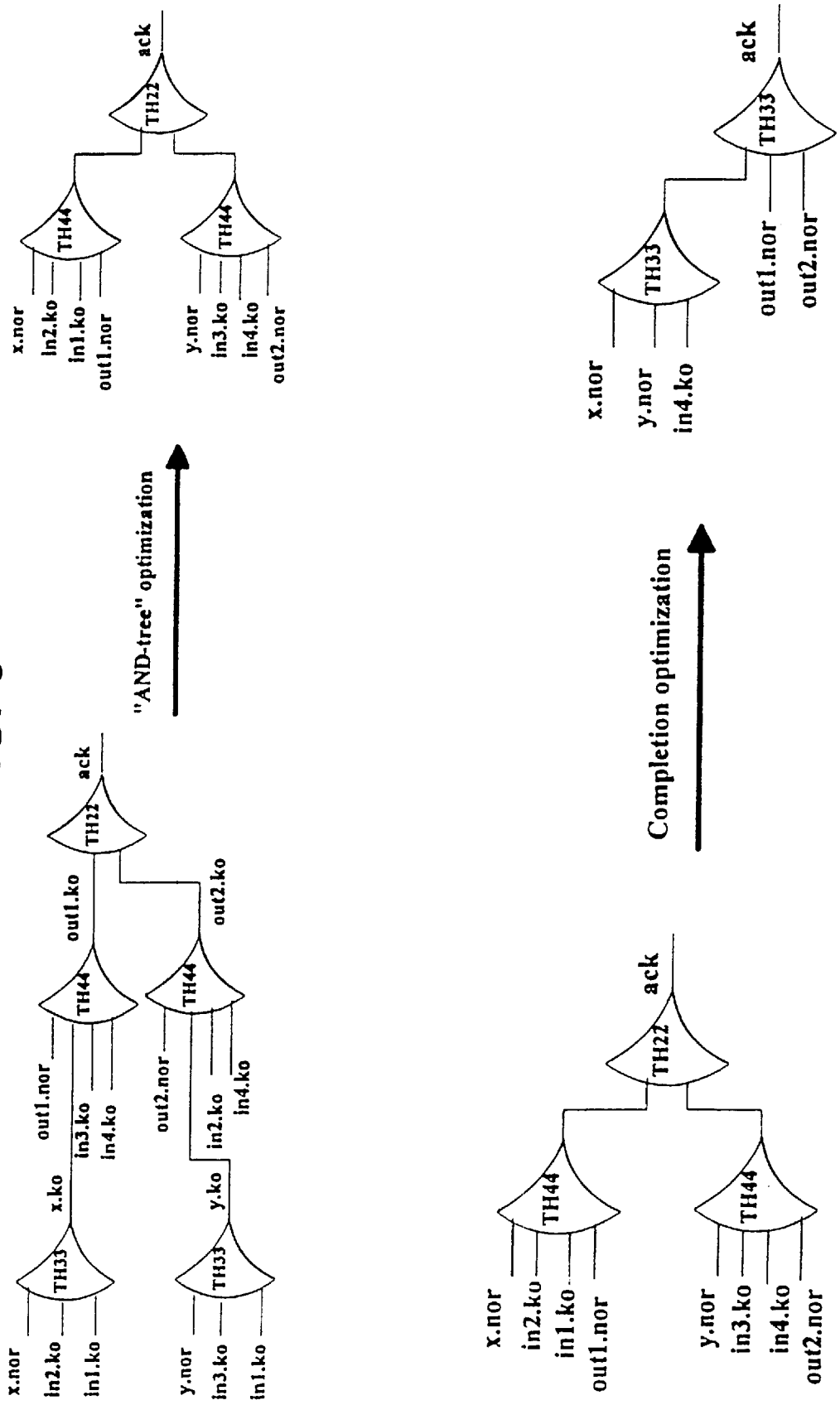
FIG. 8 illustrates the optimization of the completion circuit elements of the circuit of FIG. 7B using AND optimization.

FIG. 8 illustrates how the completion detection elements of circuit 700 of FIG. 7 can be optimized. Using AND-tree optimization, the completion circuit reduces to a completion check on at least each of the primary inputs and intermediate outputs, and preferably also the primary outputs. In other words, all of the primary inputs and the intermediate outputs need only be checked once. In theory, there should not be any duplication of primary outputs, such that AND-based optimization will not effect these outputs (although the methodology may or may not be applied to the primary outputs as part of optimizing the circuit as a whole). This optimization eliminates duplication of completeness detection by eliminating duplicative checks of the same multi-rail lines.

Still further optimization is possible by recognizing that circuit 700 may be globally "indicating" for various primary inputs and intermediate outputs. The procedure is based on the nature of multi-rail asynchronous circuits. As is known in multi-rail asynchronous circuits, each consecutive wave of DATA is interspersed with a wave of NULL. The application of NULL at the primary inputs of a circuit will likewise place each intermediate output and primary output at NULL. The resulting ASSERTED on the output of each NOR gate results in an ASSERTED for ack. After the subsequent application of a wavefront of DATA applied to the primary inputs, it would be expected for a typical circuit that (1) all of the primary outputs would transition from NULL to DATA, and (2) the ack signal(s) would change from ASSERTED to NULL to represent completion of the circuit (and thus a request to apply a wave of NULL to the primary inputs). The optimization process analyzes the circuit with respect to at least the primary inputs and intermediate outputs to identify completion detection circuitry that may be removed.

The analysis procedure for a particular primary input (test input) of the circuit begins by propagating a NULL wavefront through the circuit. The completion elements for that test input are disabled (e.g., by removing the corresponding NOR gate, or severing the output of the NOR gate as an input to the completion detector circuit, etc.). The test input is then held at NULL while combinations of DATA (preferably all combinations) are applied to the remaining primary inputs (each combination preferably being separated by a clearing wave of NULL). If, as a result of any of the combinations of DATA, both ack changes to NULL and all of the primary outputs transition to DATA, then this evidences a "false positive." In other words, even though the tested primary input was held at NULL, circuit 700 still produced a meaningful (albeit incorrect) output and an incorrect completion signal. The circuit 700 is therefore not indicating for the tested primary input, such that the completeness circuitry is required for the tested primary input.

On the other hand, if ack remains unchanged at ASSERTED, then the configuration of the circuit is "indicating" for the tested input, such that no completion circuitry is required for that input. In other words, since ack cannot transition if the tested input is not allowed to transition, then the ack signal will inherently represent the status (completeness or incompleteness) of the tested primary input.

Applying this principle to the circuit of FIG. 7, in1.k0 is disabled from the completeness detection circuit. Following a propagation of NULL through circuit 700, in1.1 and in1.0 are held at NULL while all combinations of DATA are applied to the remaining primary inputs. For circuit 700, regardless of the combination of DATA applied to primary inputs in2–in4, x.1 and x.0 remain at NULL; x.nor remains at ASSERTED; x.k0 remains ASSERTED (incomplete); out1.k0 remains ASSERTED (incomplete); and ack remains ASSERTED (incomplete). The completion signal ack therefore never indicates that circuit 700 is complete, such that completeness circuitry for in1 can be omitted. Testing of primary inputs in2 and in3 demonstrates that circuit 700 is also indicating for these inputs.

Testing for primary input in4 yields a different result. With in4 held at NULL, the application of certain combinations of DATA to the remaining primary inputs will transition ack to NULL and produce DATA on all of the primary outputs. This false positive demonstrates that the circuit 700 is not indicating for the in4 input, and completion circuitry must be retained.

The above procedure can be applied to intermediate outputs in the same manner as primary inputs. The NOR gate for the intermediate output is disabled from the completion circuit, the intermediate output is held at NULL, and all variations of DATA are applied to the primary inputs. As with the primary inputs, if ack transitions to NULL and all of the primary outputs transition to DATA, then this false positive demonstrates that the circuit will not inherently account for completion of the particular intermediate output. Application of this optimization process to the intermediate outputs in circuit 700 (x and y) shows that various combinations of DATA will produce false positives. Circuit 700 is therefore not indicating for these intermediate outputs, such that the associated completion circuitry must be retained.

Based on the logic paradigm, converters, registers and other circuit elements, false positives may be generated in a manner other than as discussed above. By way of non-limiting example, for the outputs of a DEMUX, by definition no situation would exist where DATA is present on all of its outputs. Nonetheless, such circuit elements, and the circuits that incorporate them, should operate in a predictable manner such that false positives can be detected. Since the functional aspects of the circuit follow a different path than the completeness aspects of the circuit, the completeness aspects can still be optimized using the same principles discussed herein. In addition, if completeness detection for the primary outputs is based on register 400 (such that ack is not generated by the circuit itself), the resulting optimization may be different.

For any input or intermediate output for which the circuit is indicating, then the completeness circuitry can be removed for the same. In theory, each NOR gate and connecting wire that generates a completion signal for which the circuit is indicating can be removed. In addition, the completion detection circuits can be minimized to deal with the reduced number of inputs (e.g., a 4-input C-element can be replaced with a 2-input C-element). However, it may not be preferable to remove all of the noted "unnecessary" circuit elements. For example, in circuit 700, if a converter 500 or register 400 is being used to generate completion signals for in1–in4, then circuitry that generates completion signals in1–in3 will not be removed because the converter/register will remain in the circuit; the resulting optimization would simply remove the physical connection from the converter/register to the downstream C-elements. Of course, the circuit designers would have the option of removing converter 500 or registers 400 in favor of a single NOR gate for in4, which may result in a smaller/cheaper circuit than keeping the converter. Optimization should therefore be thought of in flexible terms, which is founded on the tests discussed herein but which are elastic to the needs of a specific circuit configuration.

Figure 9:
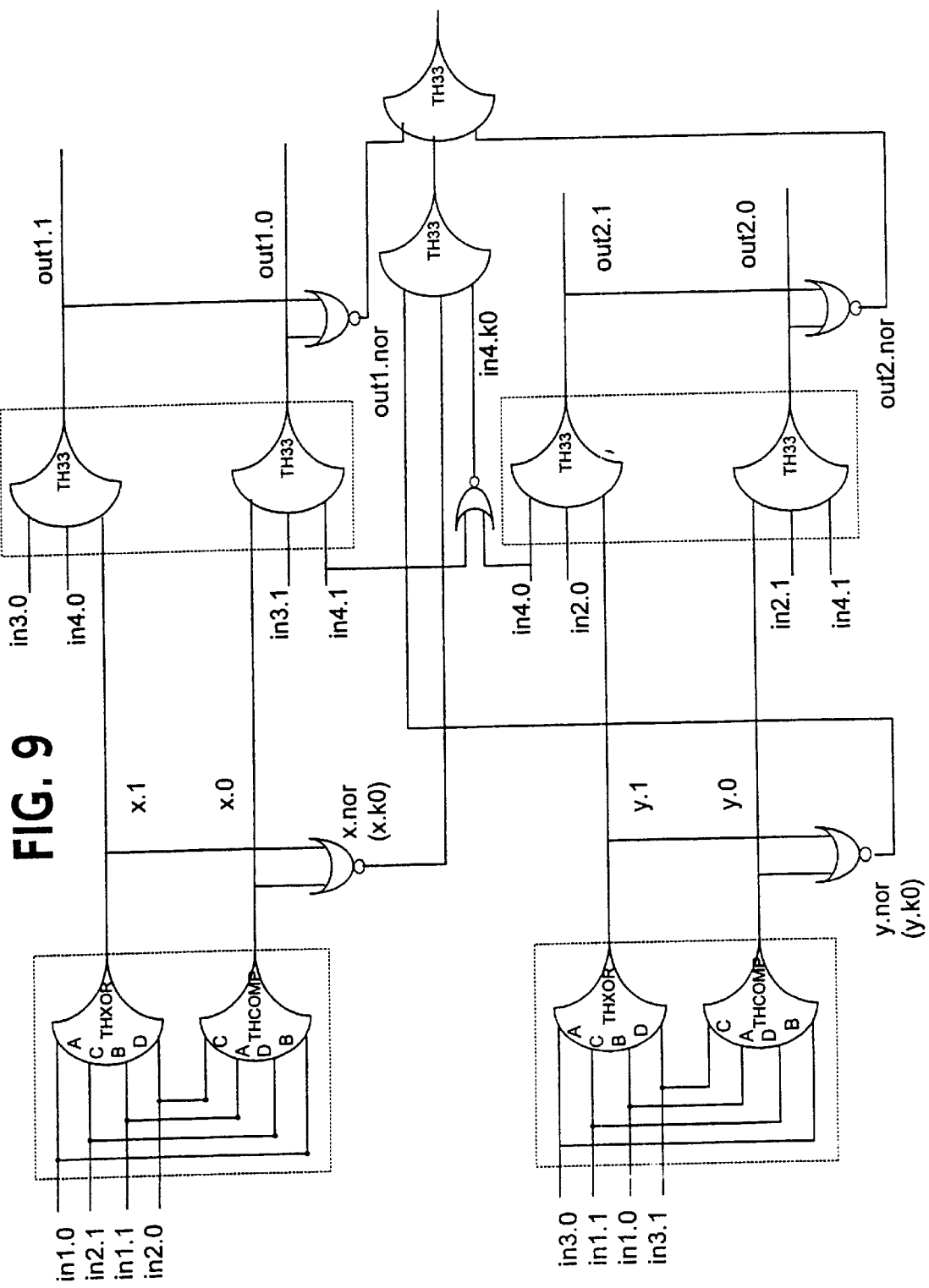
FIG. 9 illustrates the optimization of the completion circuit elements of the circuit of FIG. 7B using global completeness optimization.

FIG. 8 illustrates how the completion tree for circuit 700 reduces from AND optimization and global completeness optimization. The completion elements of circuit 700 can now be optimized. FIG. 9 illustrates a possible resulting optimized configuration, in which the connections and NOR gates for in1.k0–in3.k0 have been removed, three of the five completeness detection circuit elements have been removed, and the remaining two completeness detector elements have been replaced with smaller 3-input completeness detector elements. Based on AND-tree optimization principles, these remaining "non-indicating" primary inputs and intermediate outputs can be organized as desired (albeit preferably with minimized space and cost requirements).

Figure 10:
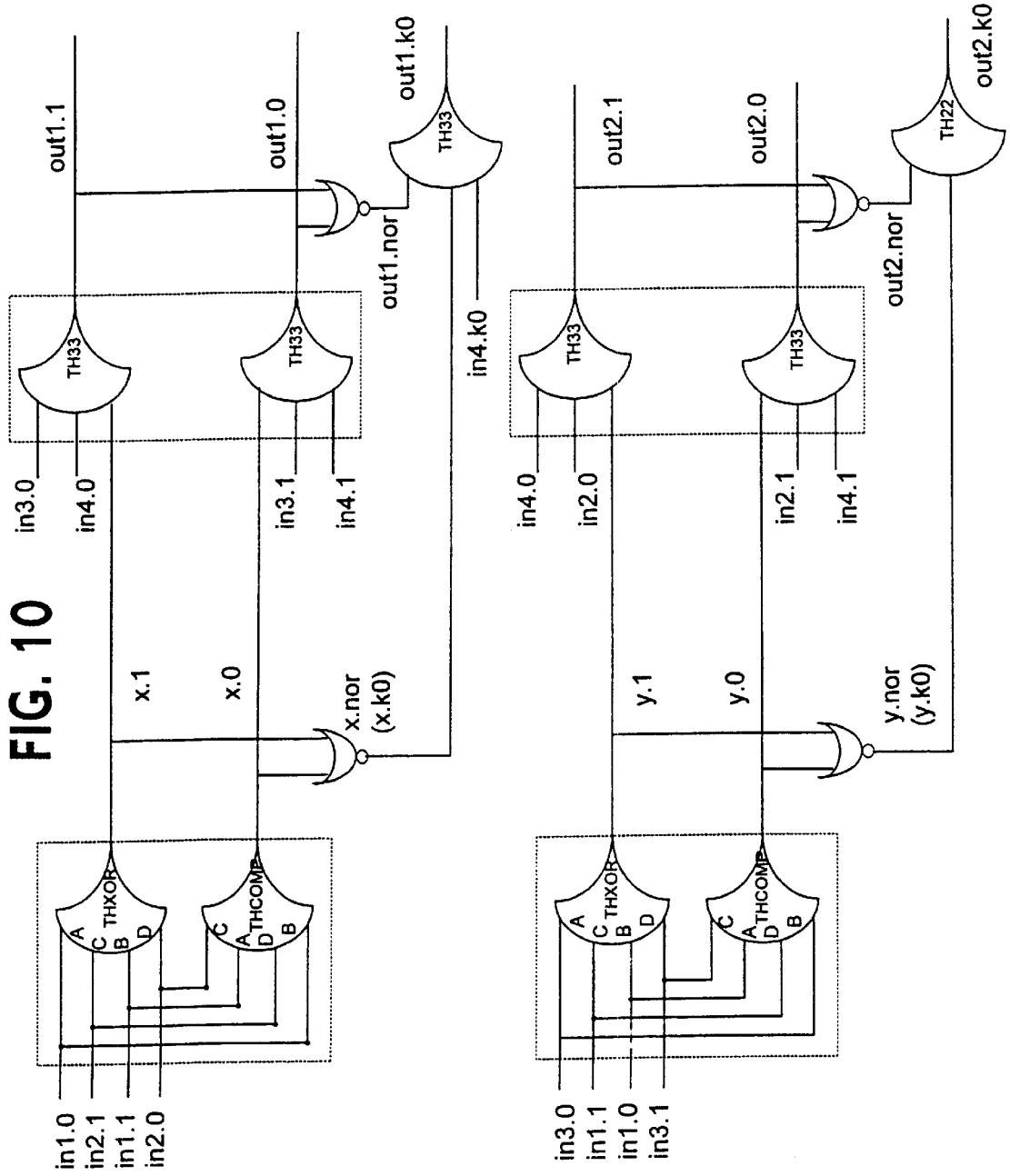
FIG. 10 illustrates an embodiment of the circuit of FIG. 7B where completion signals for primary inputs and primary outputs are processed by external elements.

FIG. 10 illustrates the configuration of circuit 700 (from FIG. 7B) in which the primary inputs are provided by an upstream converter 500 and a downstream register 400 (both not shown in FIG. 10). In this situation, all of the NOR gates are present in the upstream converter 500, such that they are not present in circuit 700. Similarly, the TH22 gate that outputs the ack is inherent in the downstream register 400. As a result of the optimization, the connections for in1.k0–in3.k0 have been removed, two of the four completeness detection circuit elements have been removed, and the remaining two 4-input completeness detector elements have been replaced with smaller 3-input and 2-input completeness detector elements. It is noted that although the remaining completion detection signals are organized in accordance with their input, the inputs could be organized in any preferable manner. Further, since completeness signals in1.k0–in3.k0 have been removed as indicating, optimization may show that the converter 500 can be removed in favor of a single NOR gate for in4.k0. Optimization may also show that the 3-input and 2-input completeness detector elements can be further reduced and/or removed by using the completeness detector signal inputs in the downstream register 400.

Since x.nor and y.nor were the only remaining inputs to the completion detection elements that comprise the completion detection circuits for x.k0 and y.k0, these completion detection circuits were removed. The x.nor and y.nor signals will serve as completion detection signals (x.k0 and y.k0) for the corresponding nodes. Indeed, had the circuit proven indicating for the x or y nodes, then the corresponding NOR gate(s) could also be removed.

Removal of any circuit elements may occur during the optimization process or at the conclusion thereof.

The above principles can also be applied to local completeness detection, i.e., optimizing completeness of one or more nodes rather than an entire circuit. The inputs to the one or more nodes can be thought of as the primary inputs, and the outputs of the one or more nodes can be thought of as primary outputs (this may also entail one or more completion detection signals). The completion signal can be removed for any input or intermediate output for which the one or more nodes are inherently indicating.

Since the completion circuitry is distinct from the functional aspects of the circuit, the completion circuit can be optimized without affecting the functional aspects, or otherwise optimizing, the underlying circuit, which is not the case with DIMS (for which attempted optimization of the completeness aspects could introduce hazards into the functional aspects). Use of the present completion methodology is believed to result in a reduction in the resulting size of the circuit by approximately 25 percent relative to DIMS.

The above design and completeness optimization may be performed manually or by a design automation tool, such as by DESIGN COMPILER sold by Synopsys.

The above optimization examples are directed toward a dual rail implementation of asynchronous circuits. The same process may be applied to other multi-rail implementations. Completion detection is incorporated into the design in the same manner as discussed above. For example, in a 4-rail implementation, all four rails would input to a NOR gate, the output of which would be used for completeness purposes.

While the preferred embodiment uses the particular elements for completion detection (e.g., NOR gates and C-elements as used herein), other elements as may be appropriate for generating completion detection signals may also be used. In addition, other types of elements may be necessary if the logic paradigm for the multi-rail system changes, such elements and their configuration being within the skill of the art in view of the teachings herein.

By way of example, a so called "negative" paradigm can be used. Under such a paradigm, The first state (ASSERTED/ASSERTED) indicates the lack of a meaningful value. The second state (NULL/ASSERTED) represents/signifies meaningful data of a value ONE or TRUE. The third state (ASSERTED/NULL) represents/signifies meaningful data of value ZERO or FALSE. The fourth state (NULL/NULL) is not permitted. FIGS. 12–40 illustrate a library that may be used with such a paradigm. Completion detection would be added using NAND gates (or AND gates) rather than NOR gates (or OR gates).

Figure 11:
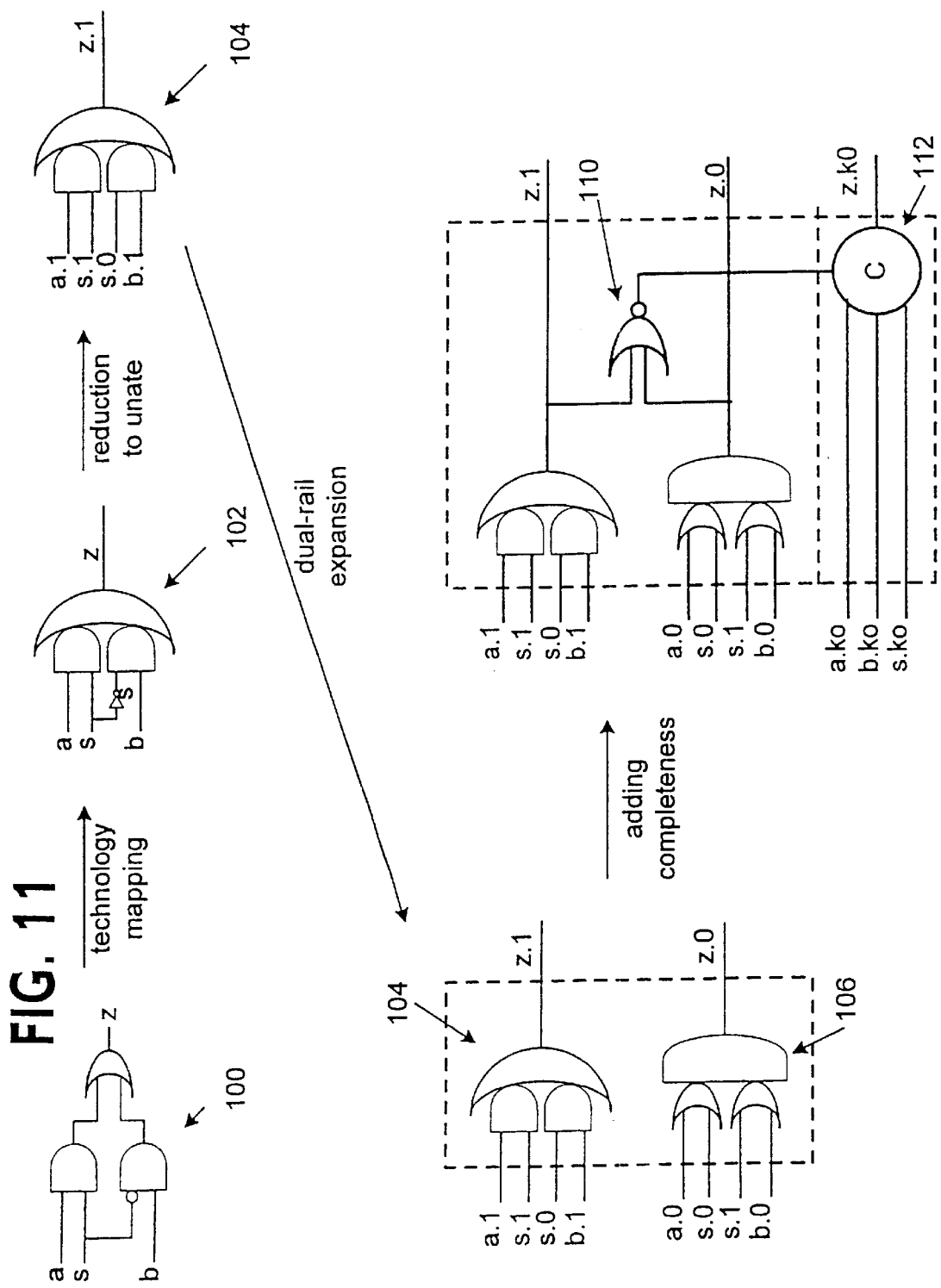
FIG. 11 illustrates the conversion of a Boolean circuit for a multiplexer into a dual rail asynchronous circuit with completeness detection using a Boolean-based library.
Figure 12:
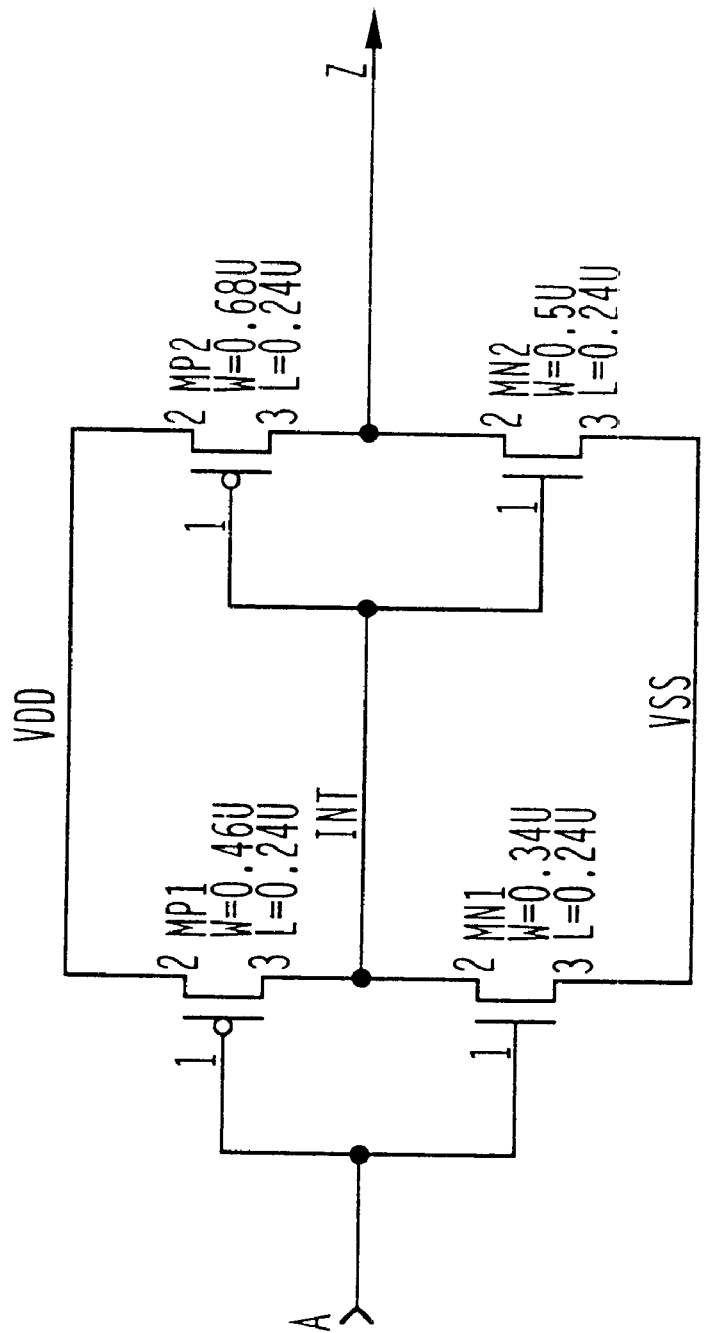
FIGS. 12–40 are schematics of a preferred implementation of a negative library used in conjunction with an embodiment of the invention.
Figure 13:
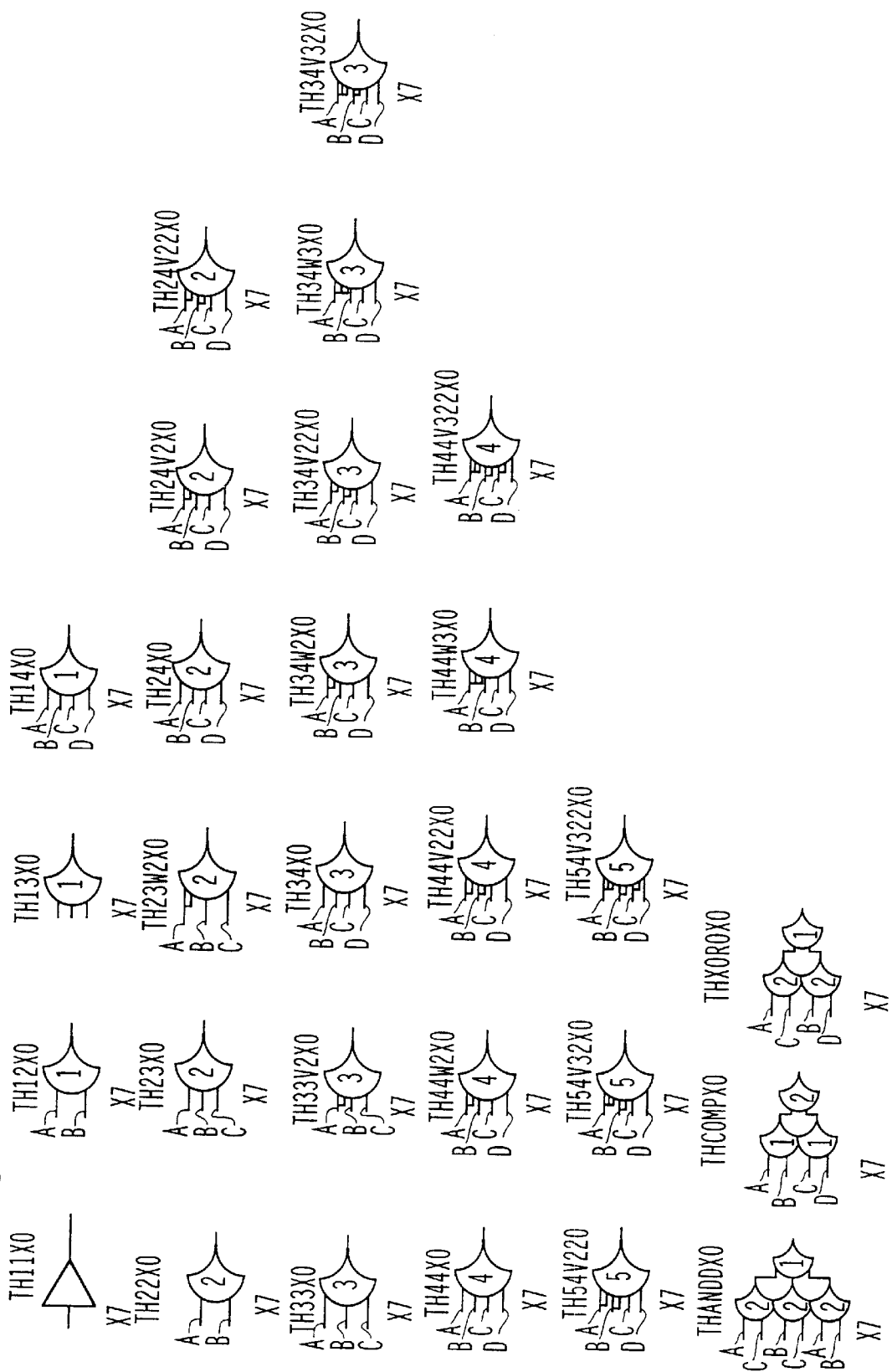
Figure 14:
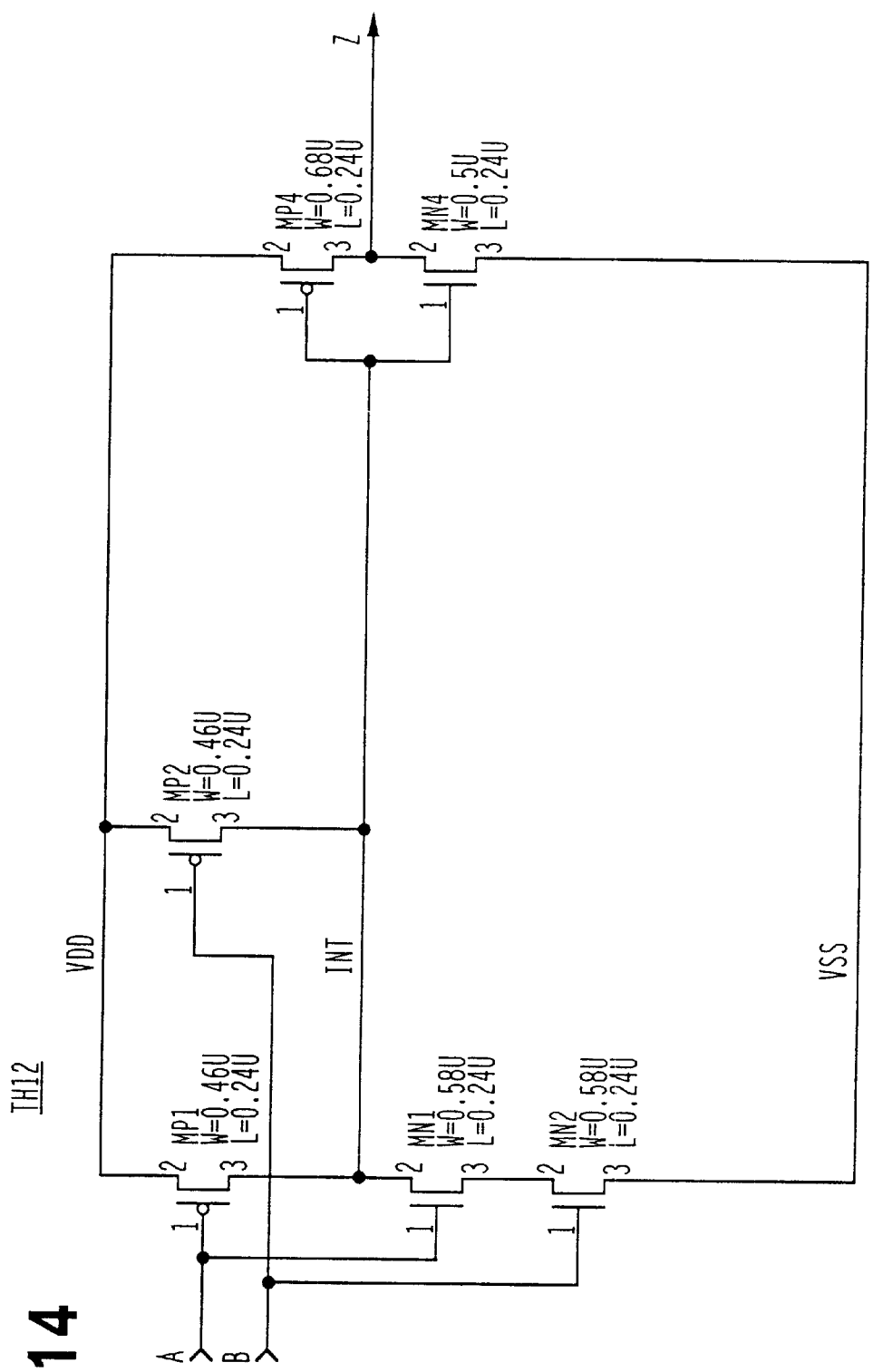
Figure 15:
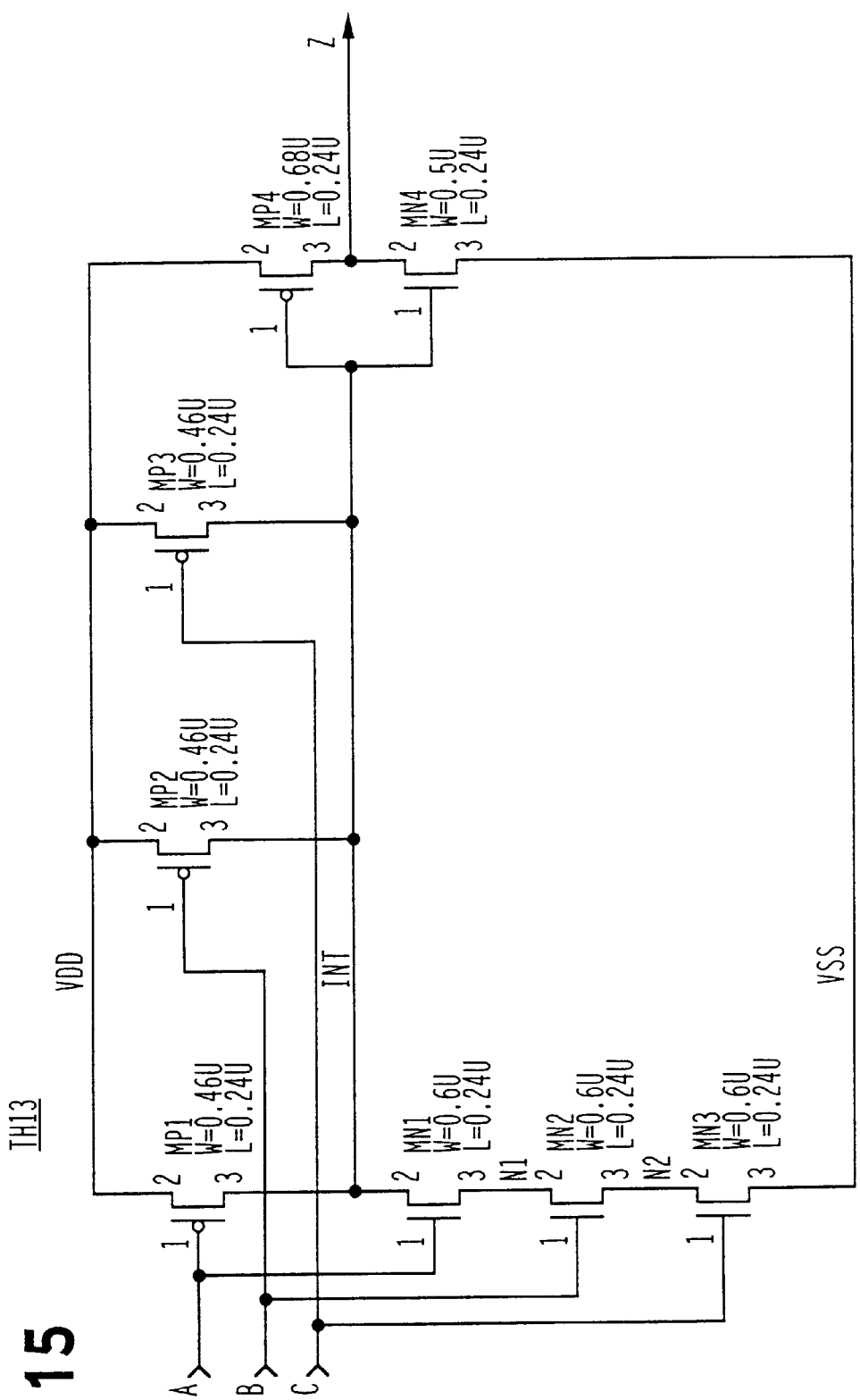
Figure 16:
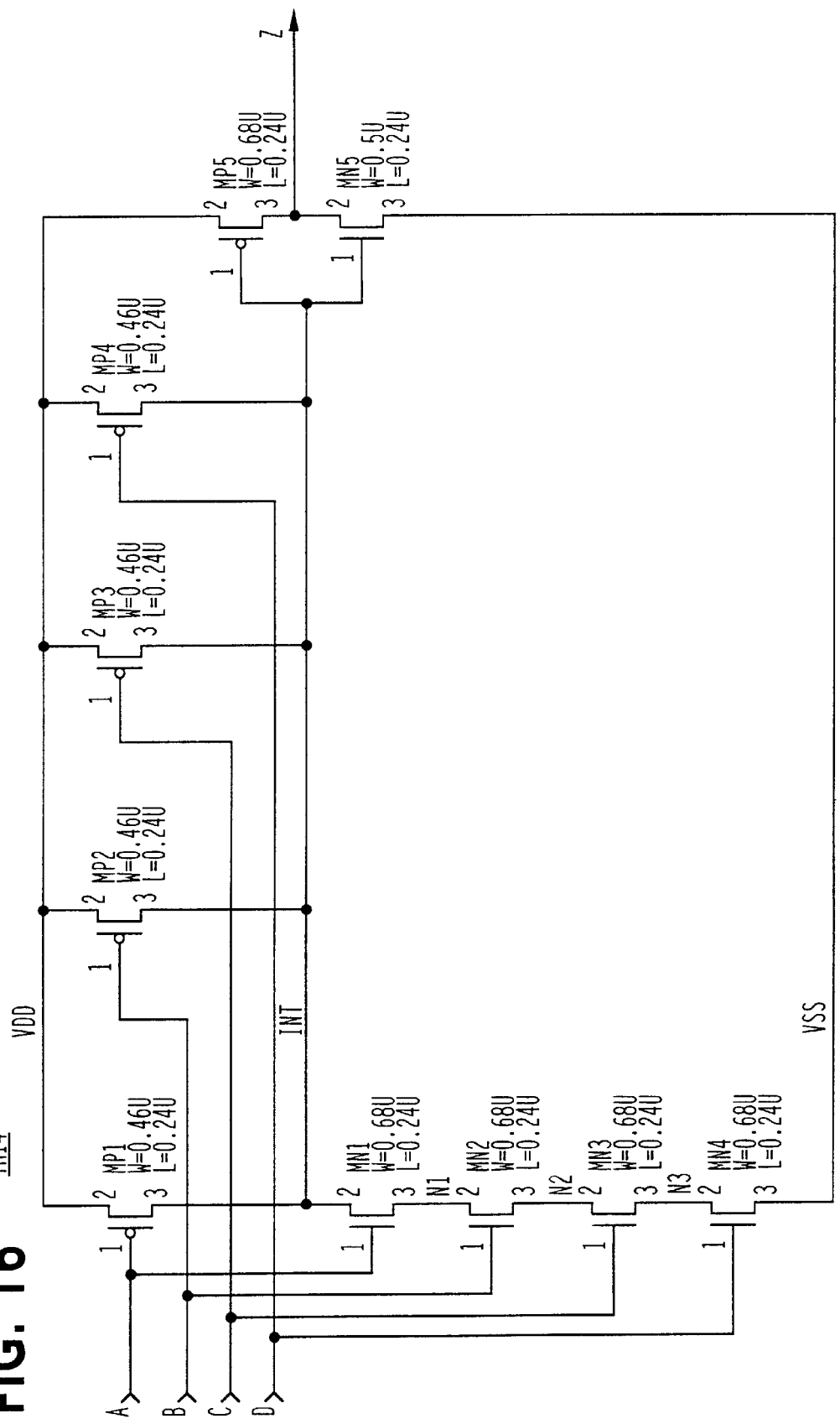
Figure 17:
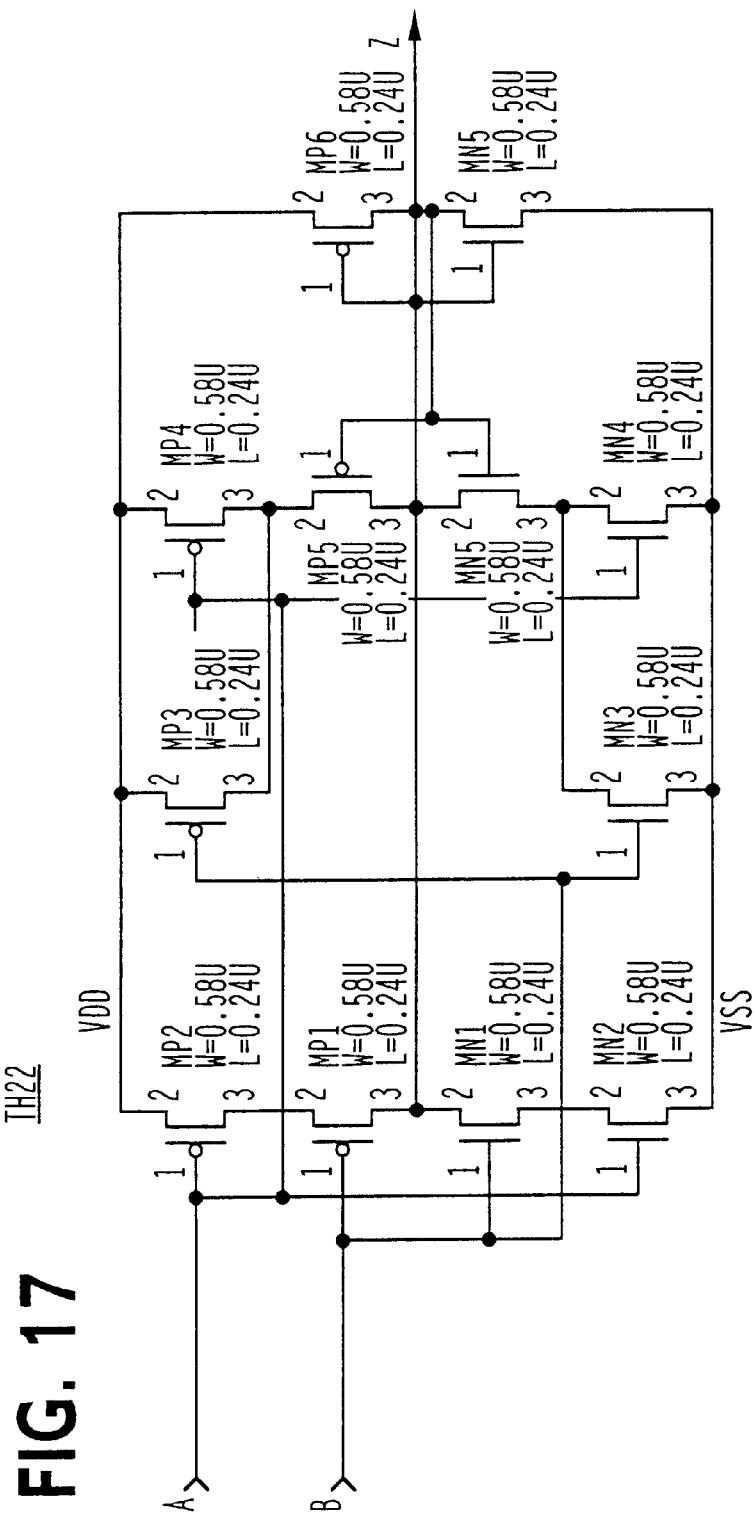
Figure 18:
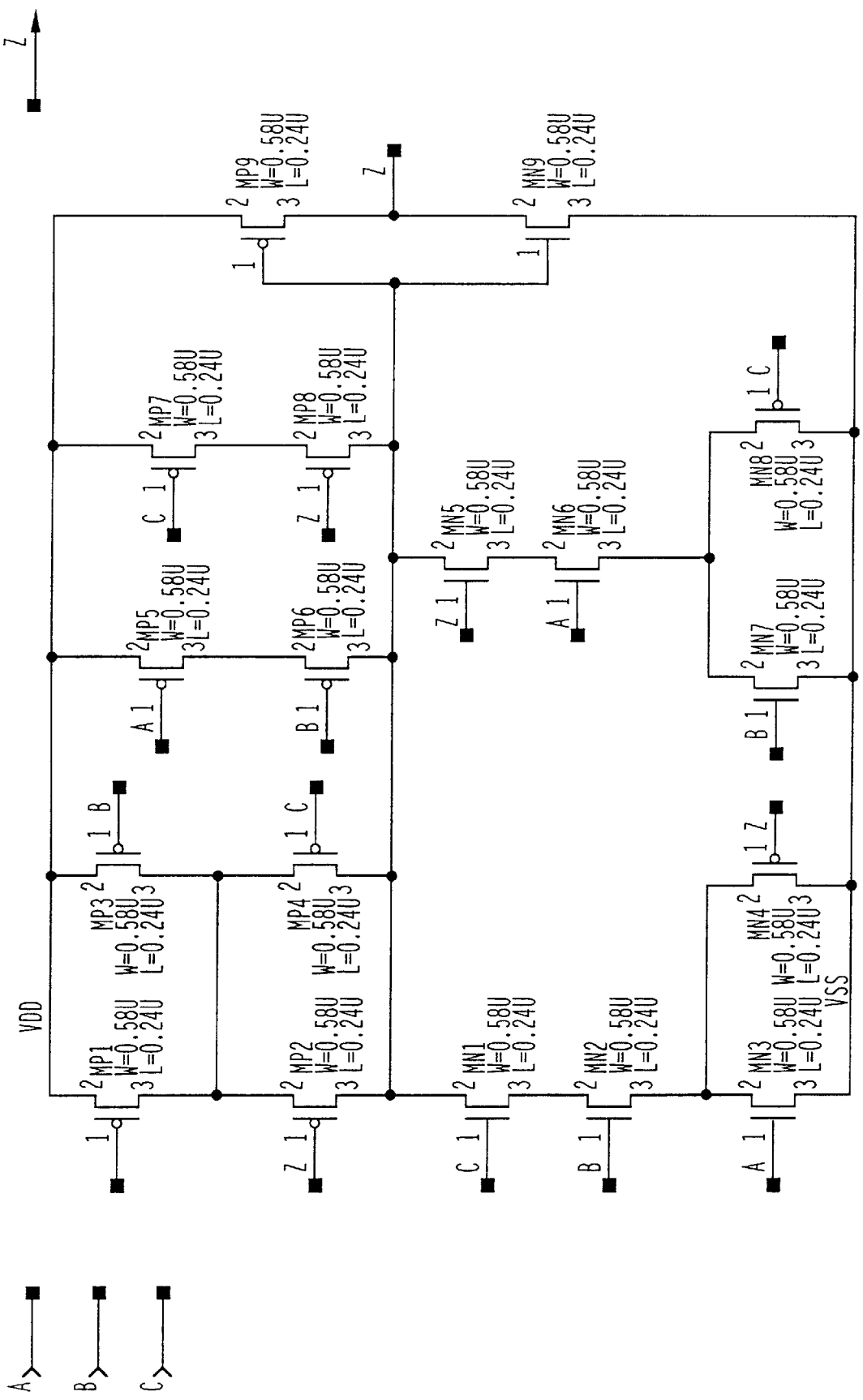
Figure 19:
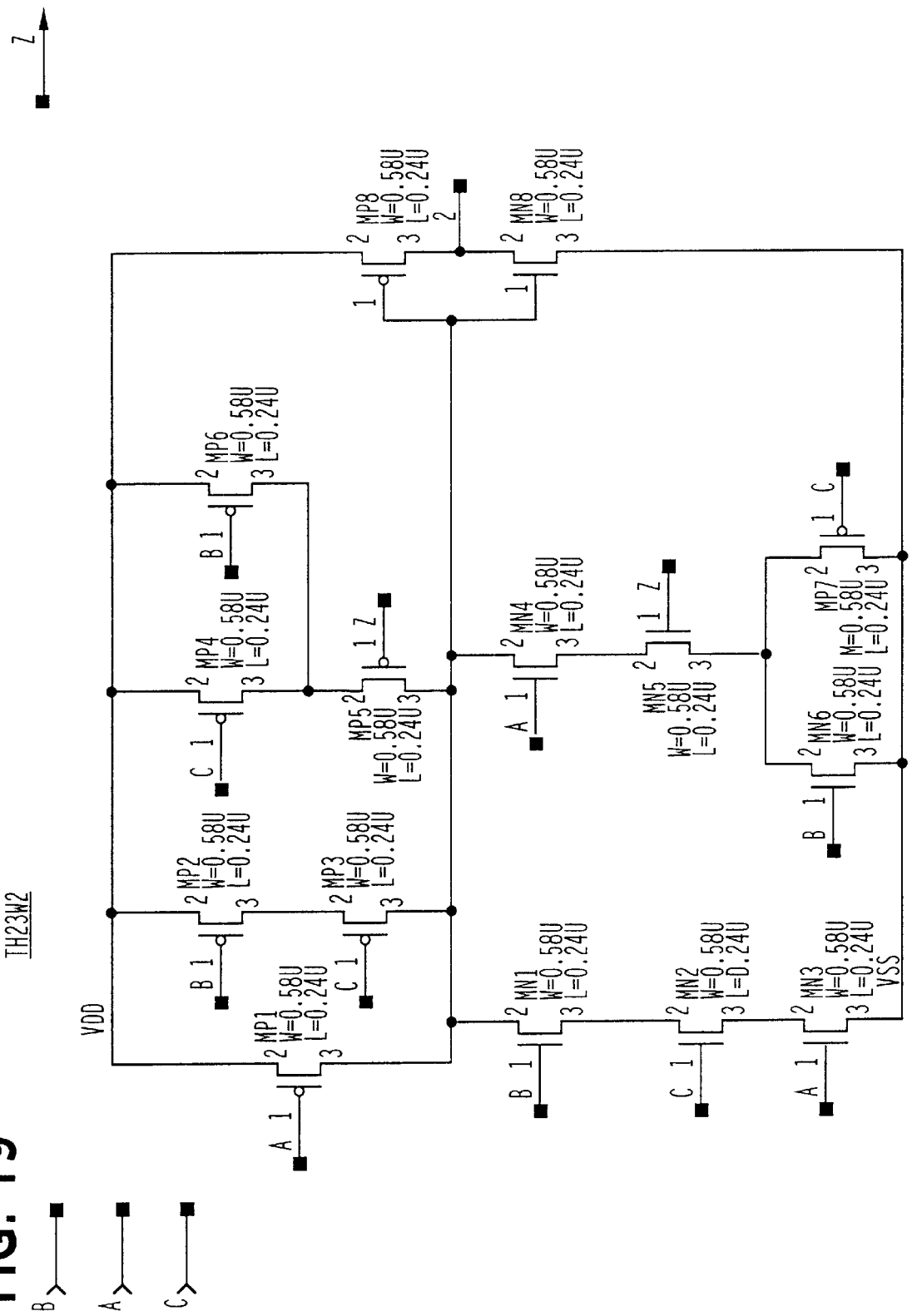
Figure 20:
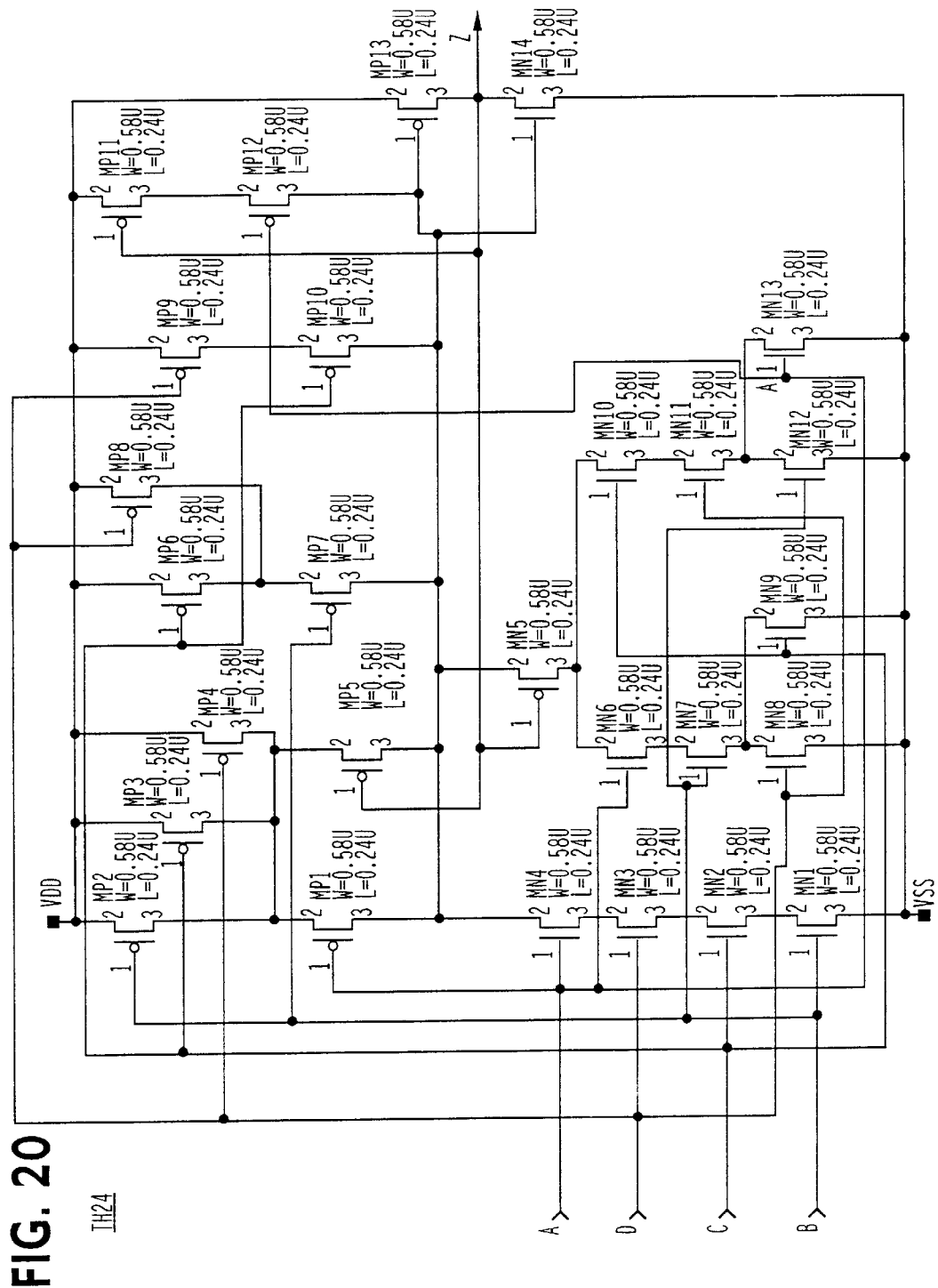
Figure 21:
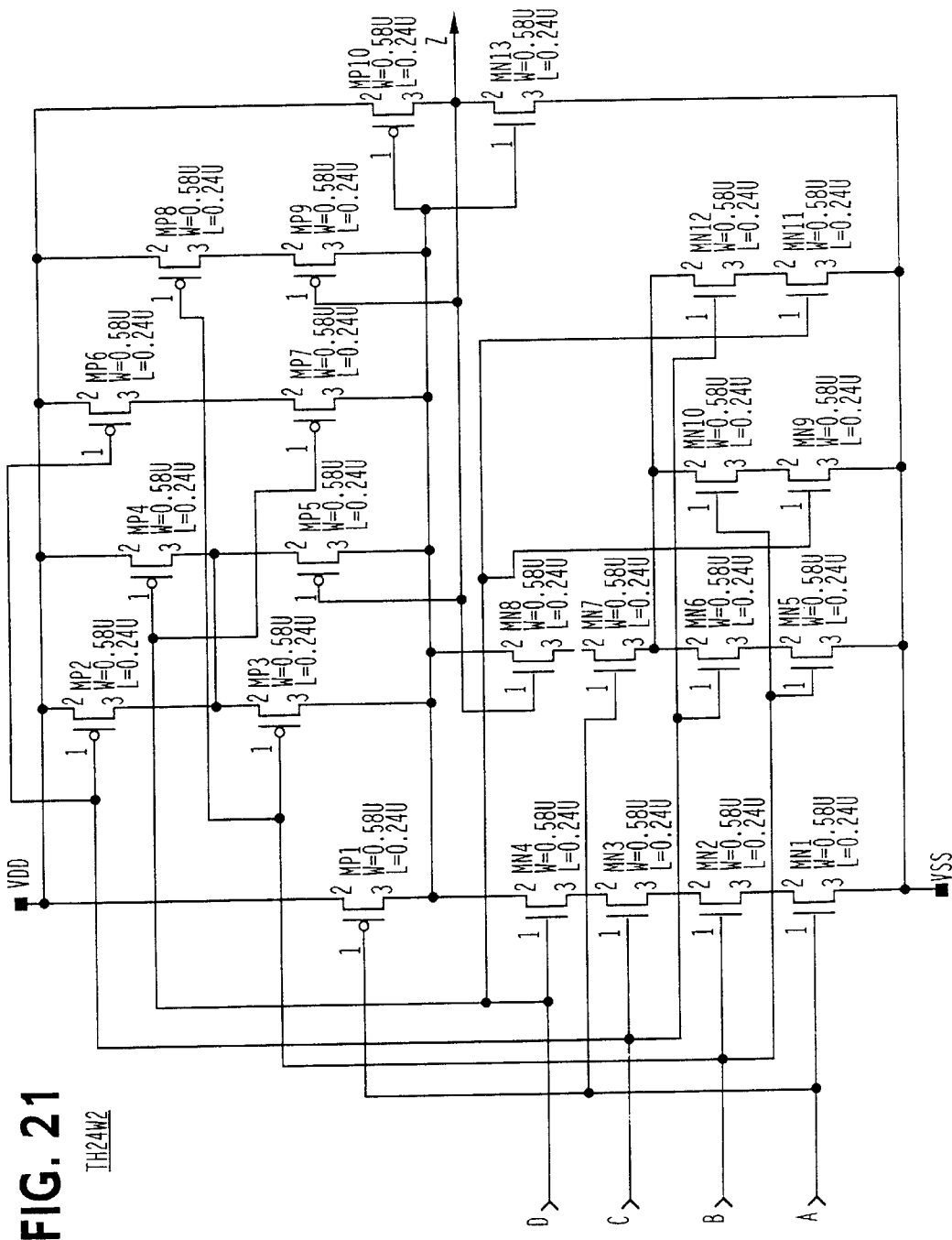
Figure 22:
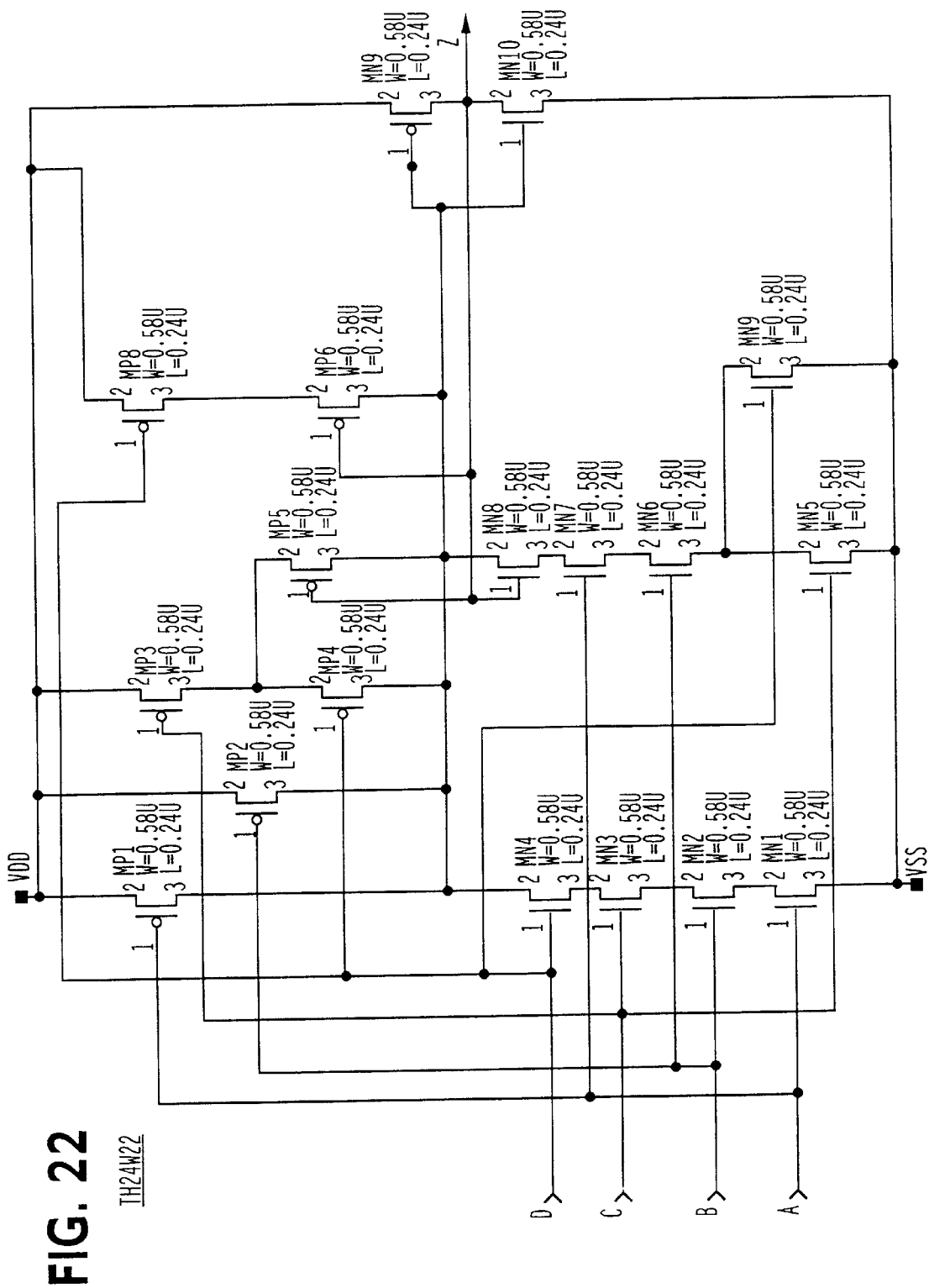
Figure 23:
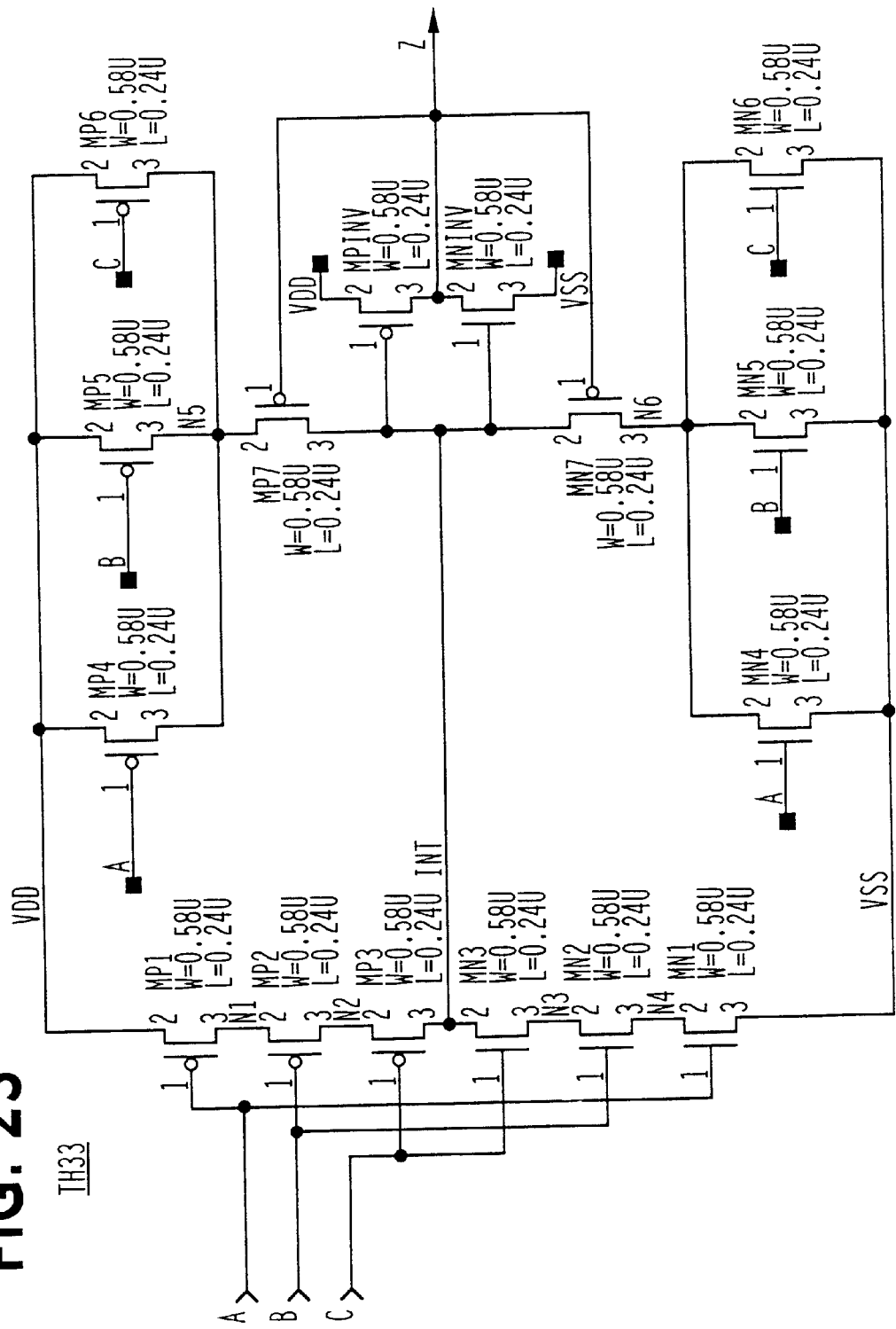
Figure 24:
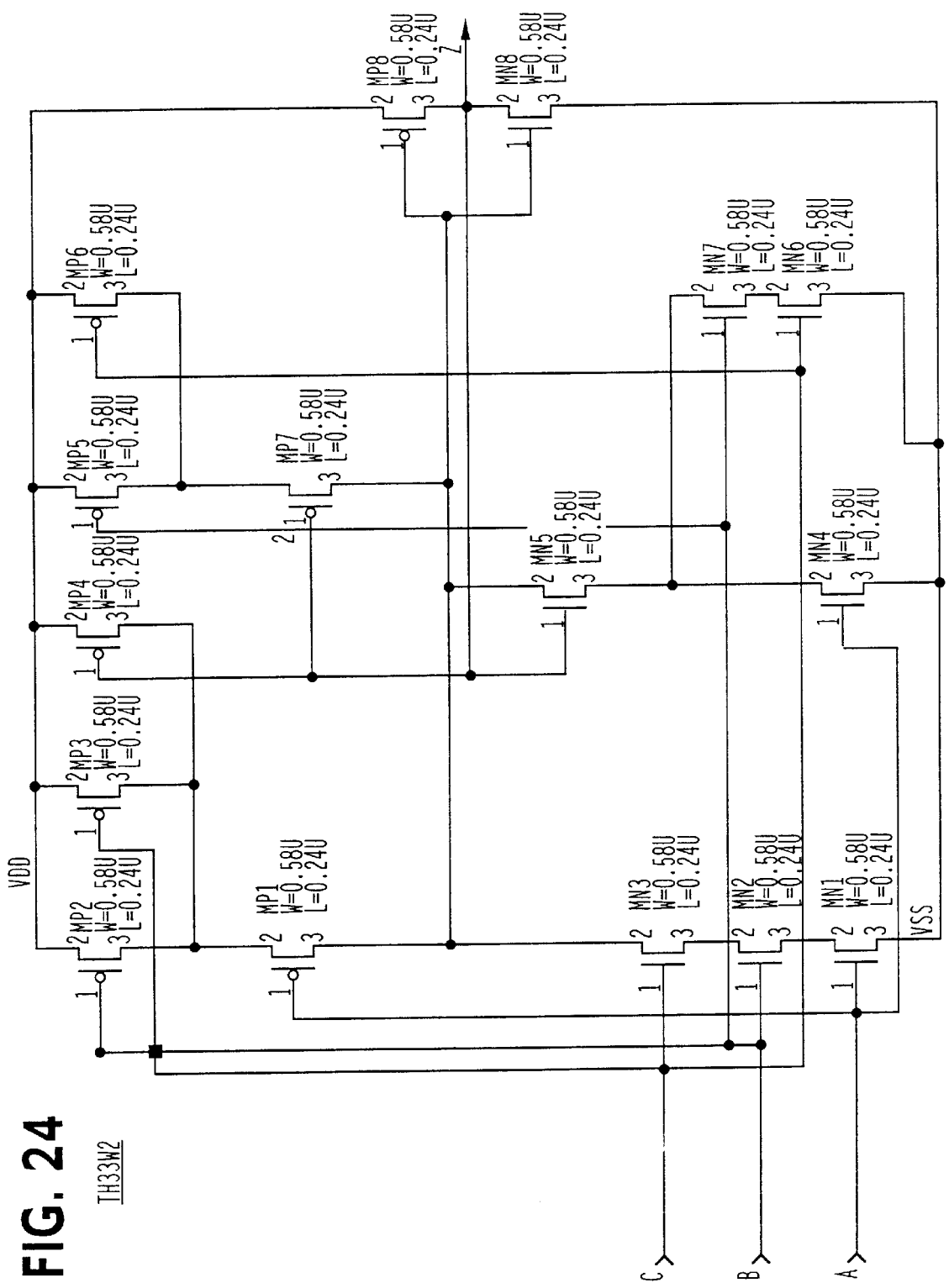
Figure 25:
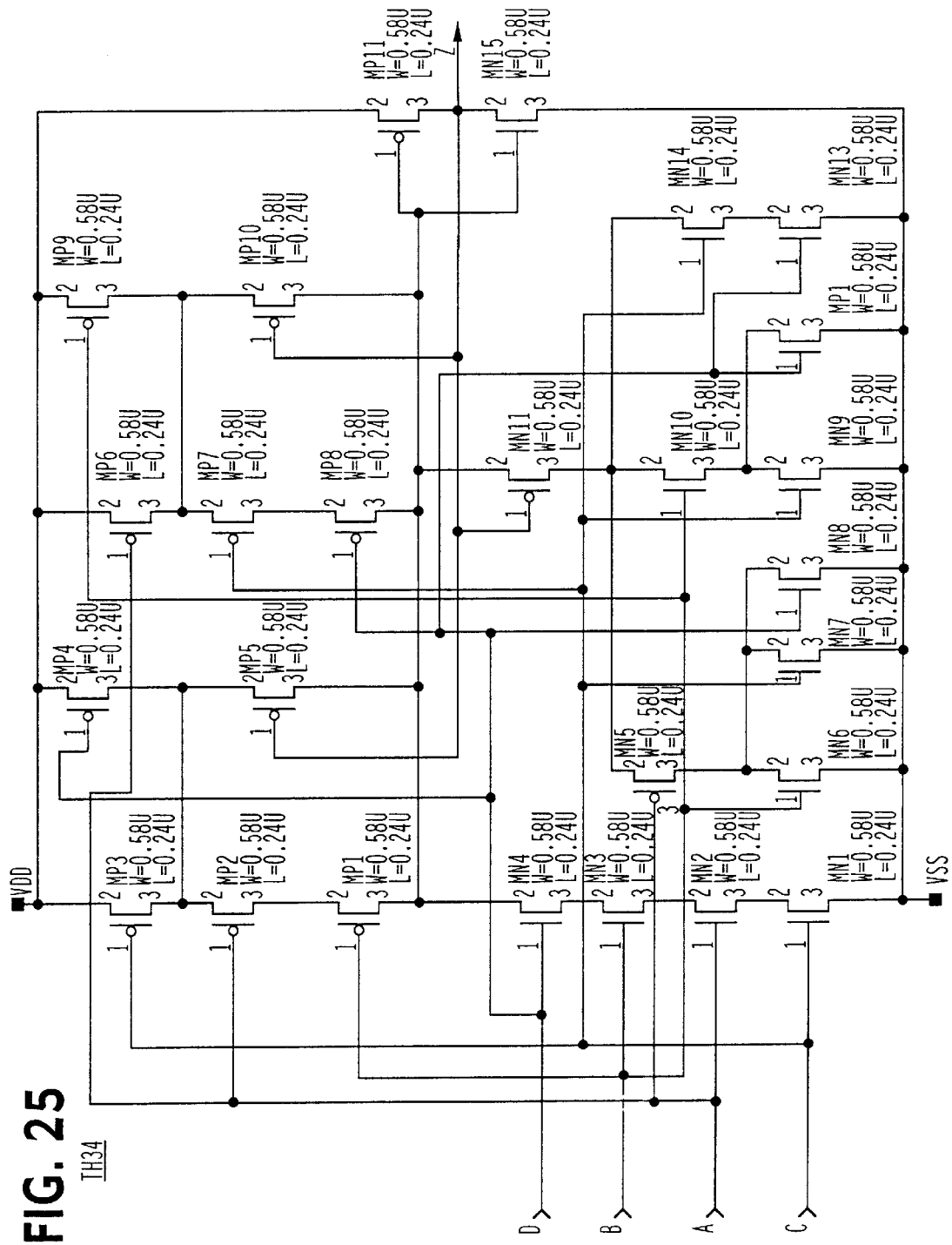
Figure 26:
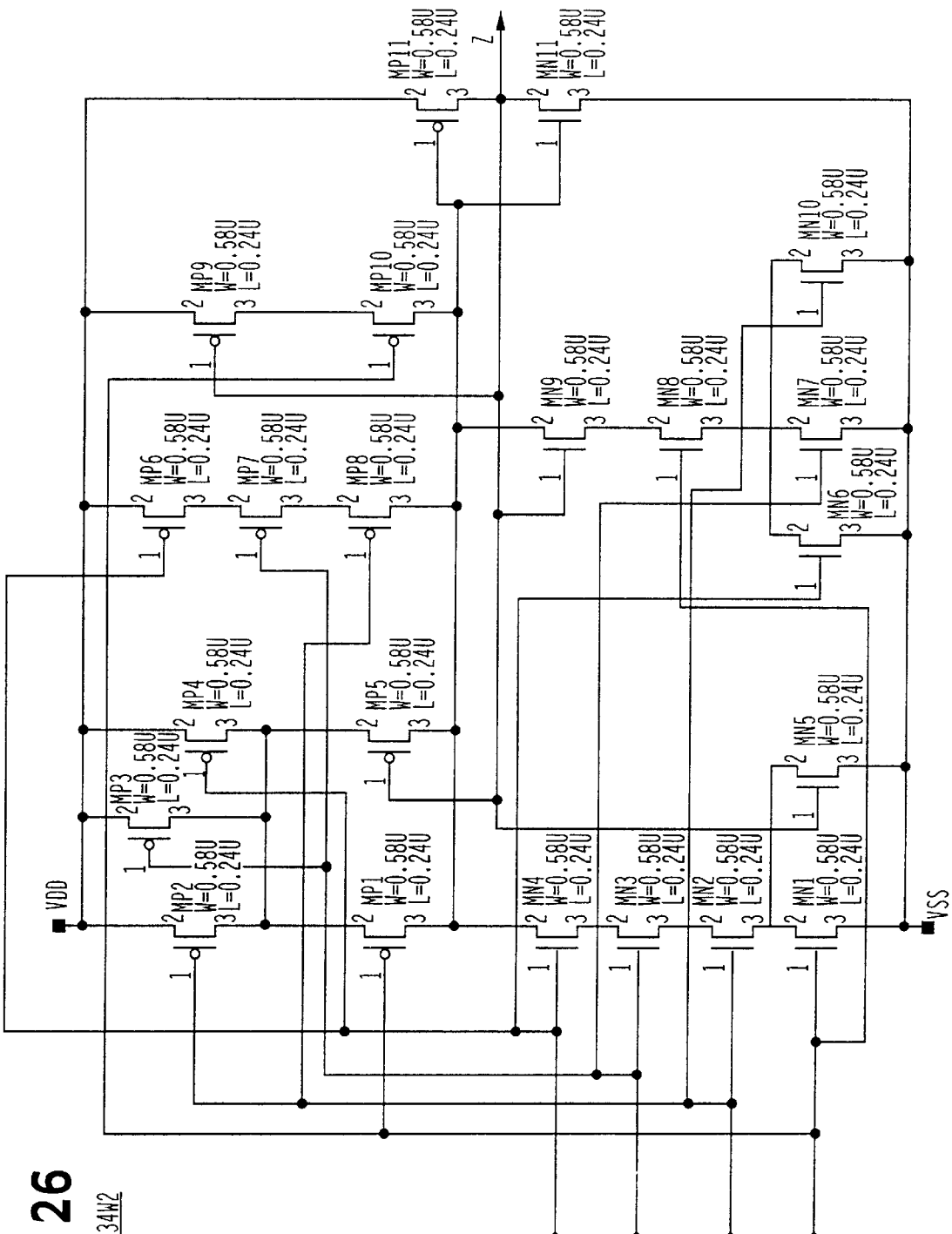
Figure 27:
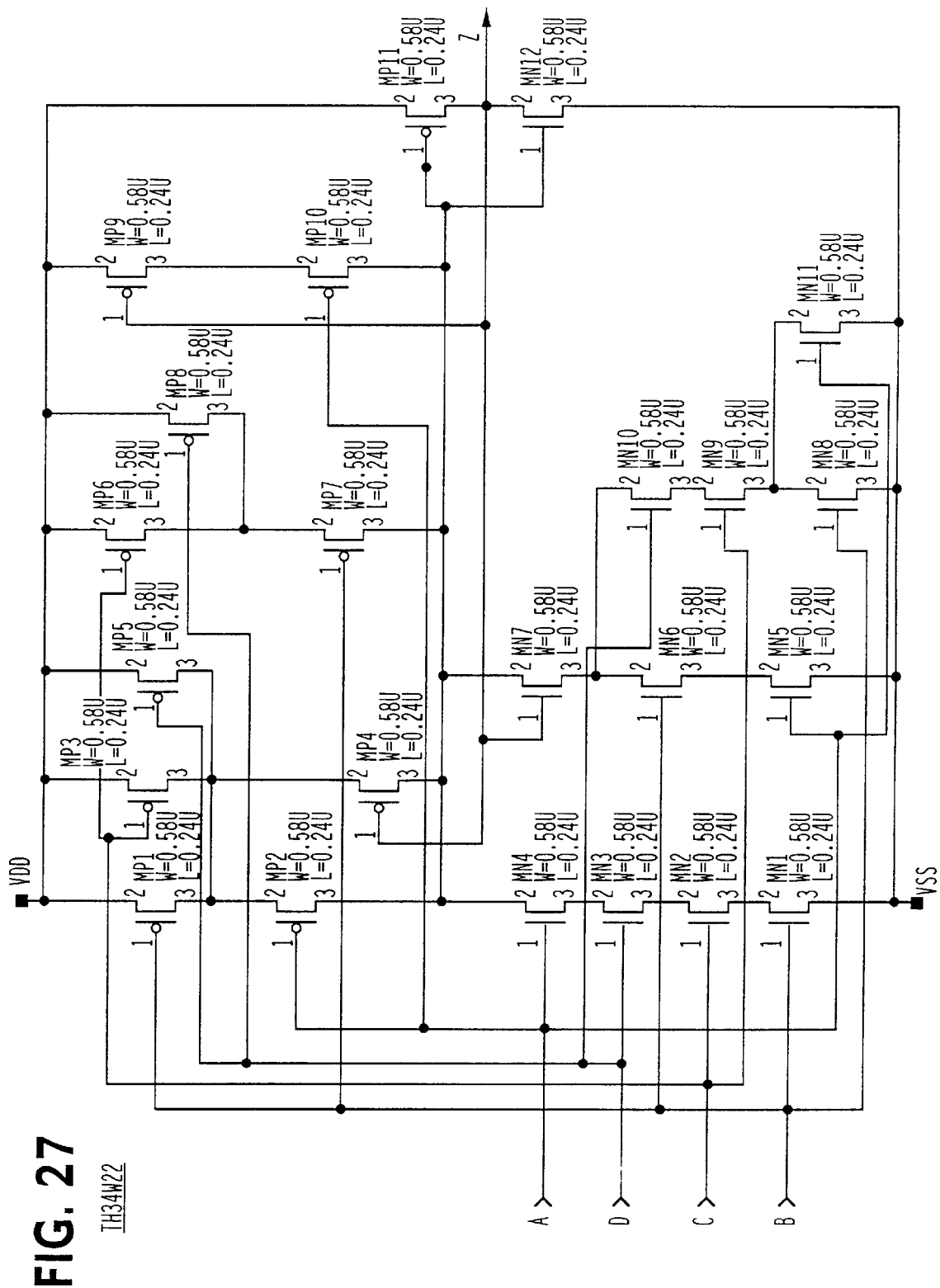
Figure 28:
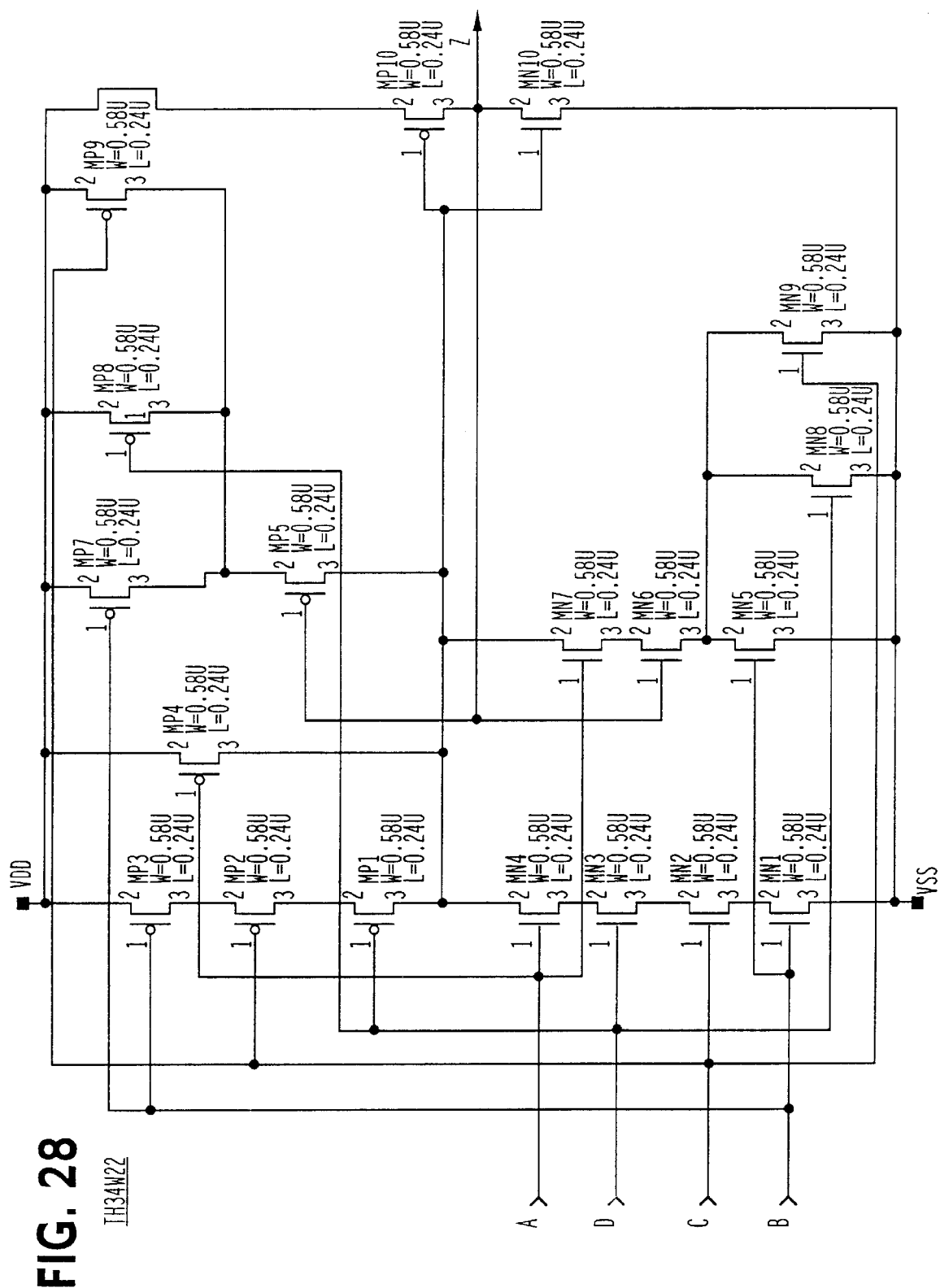
Figure 29:
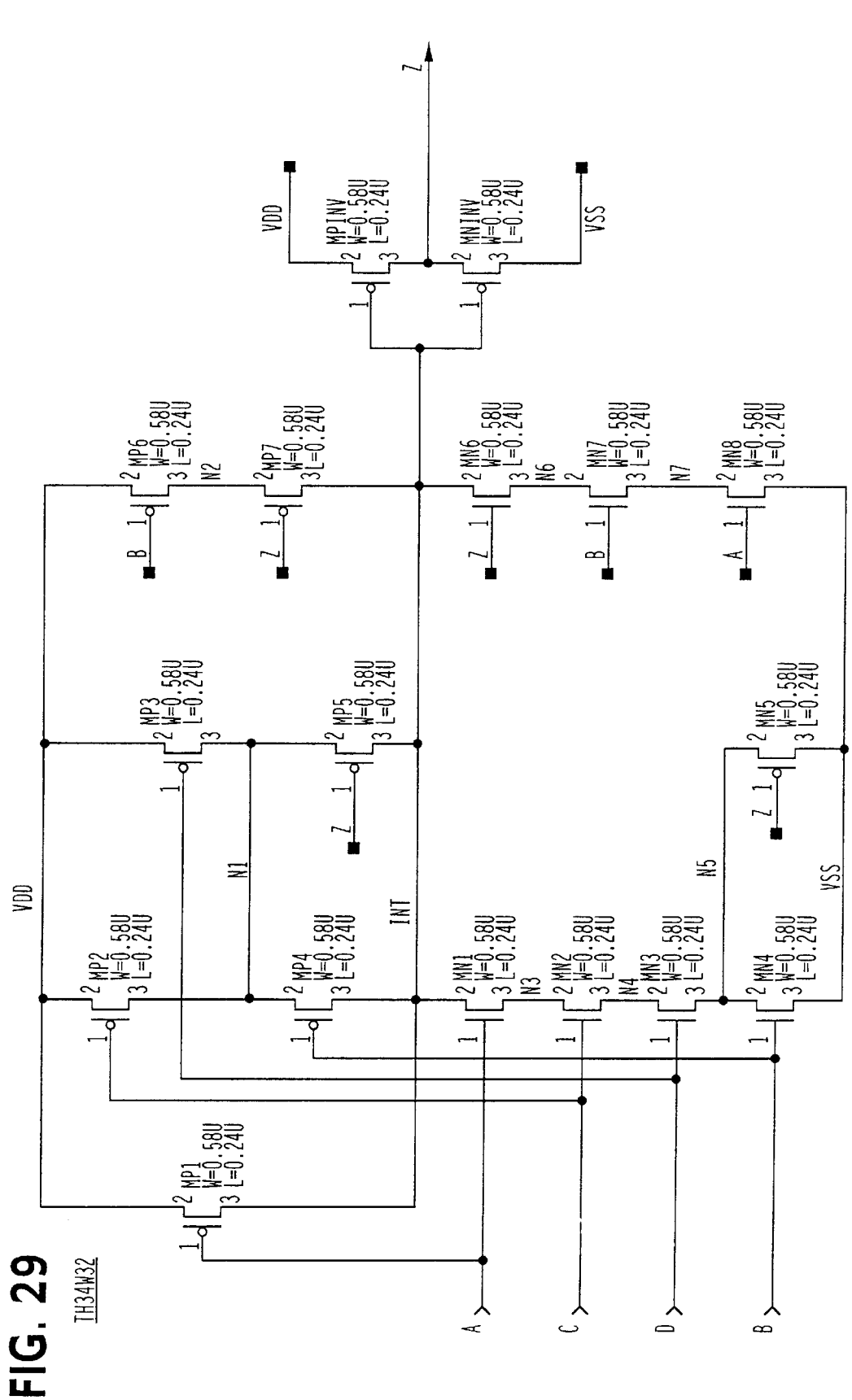
Figure 30:
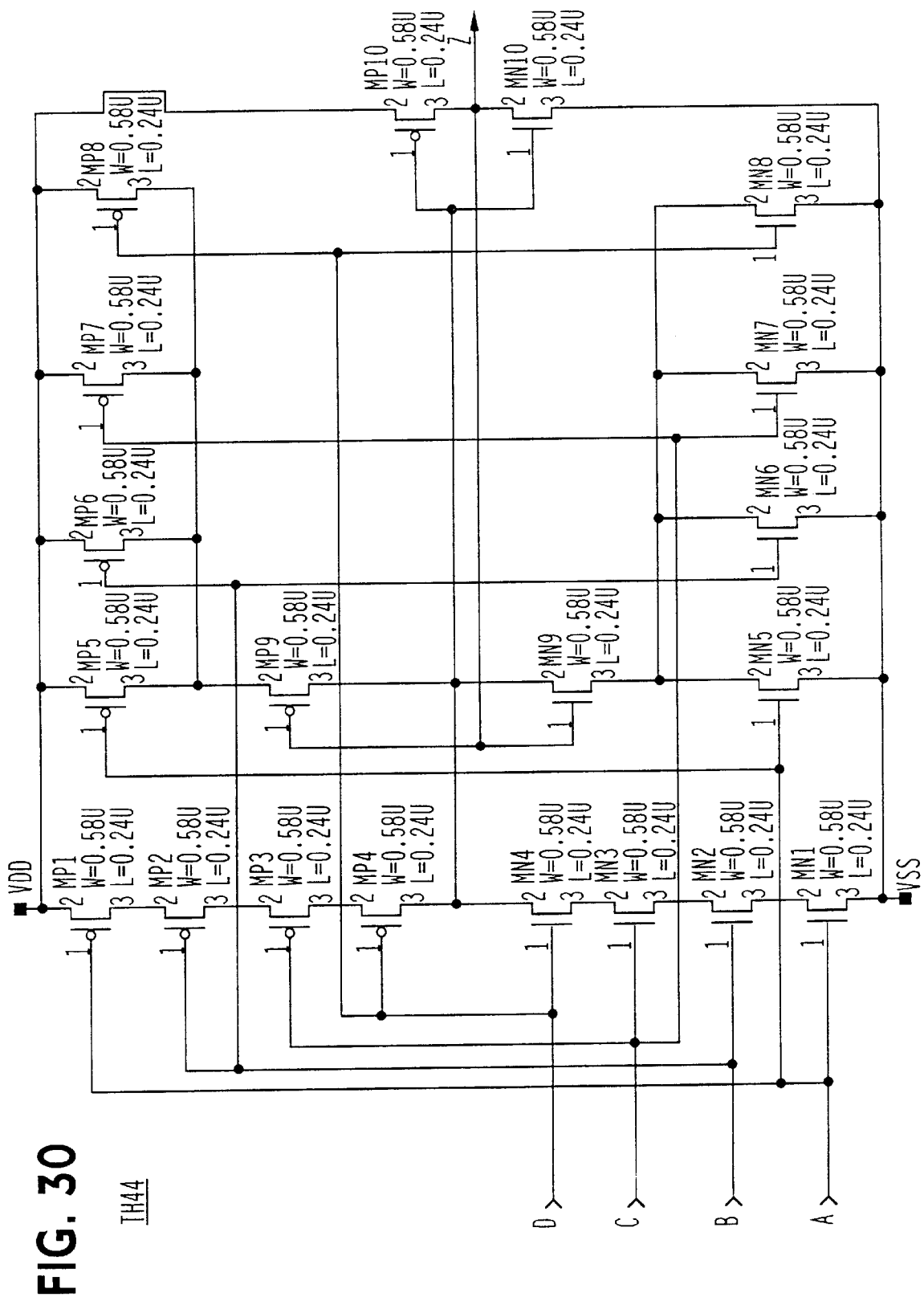
Figure 31:
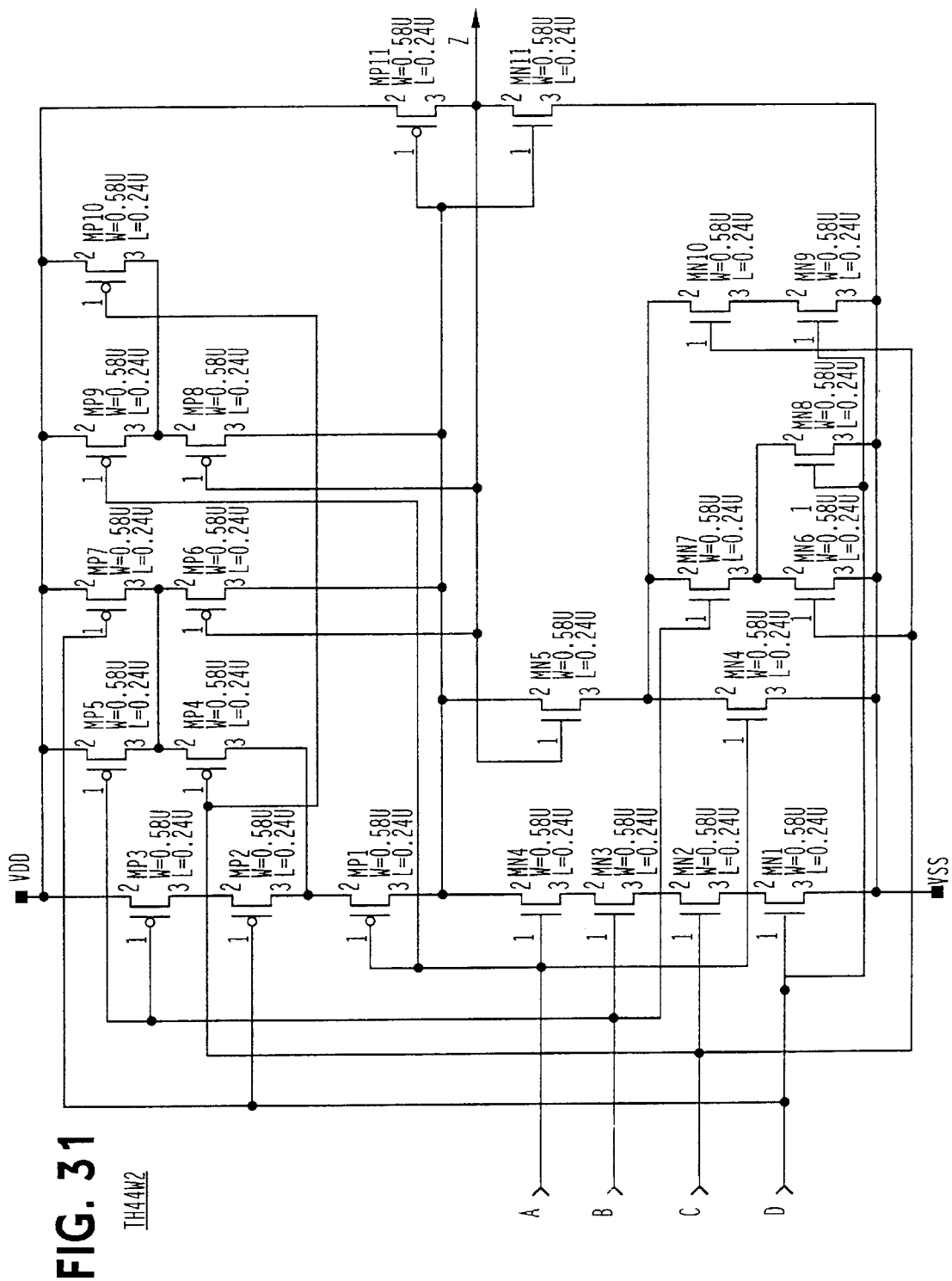
Figure 32:
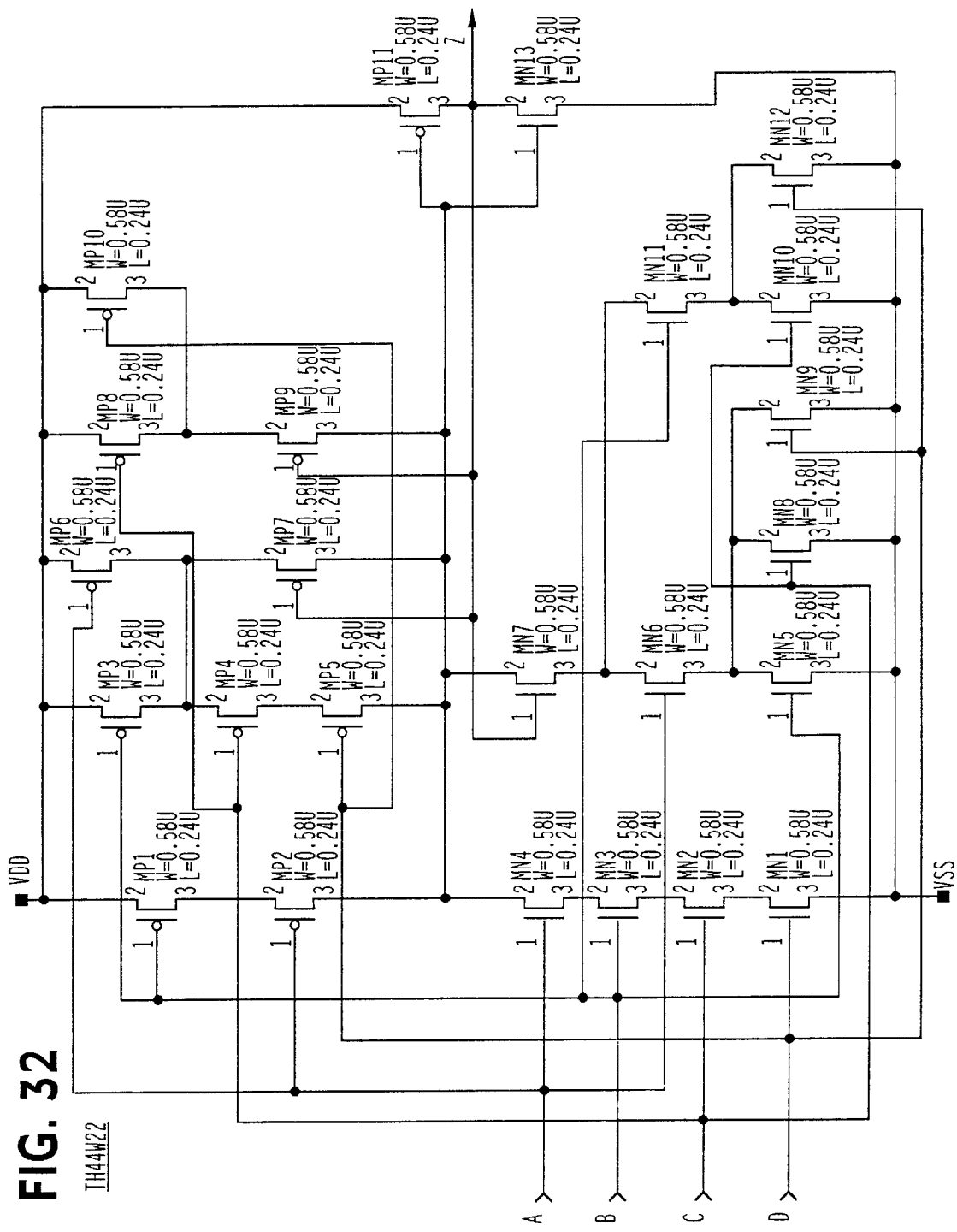
Figure 33:
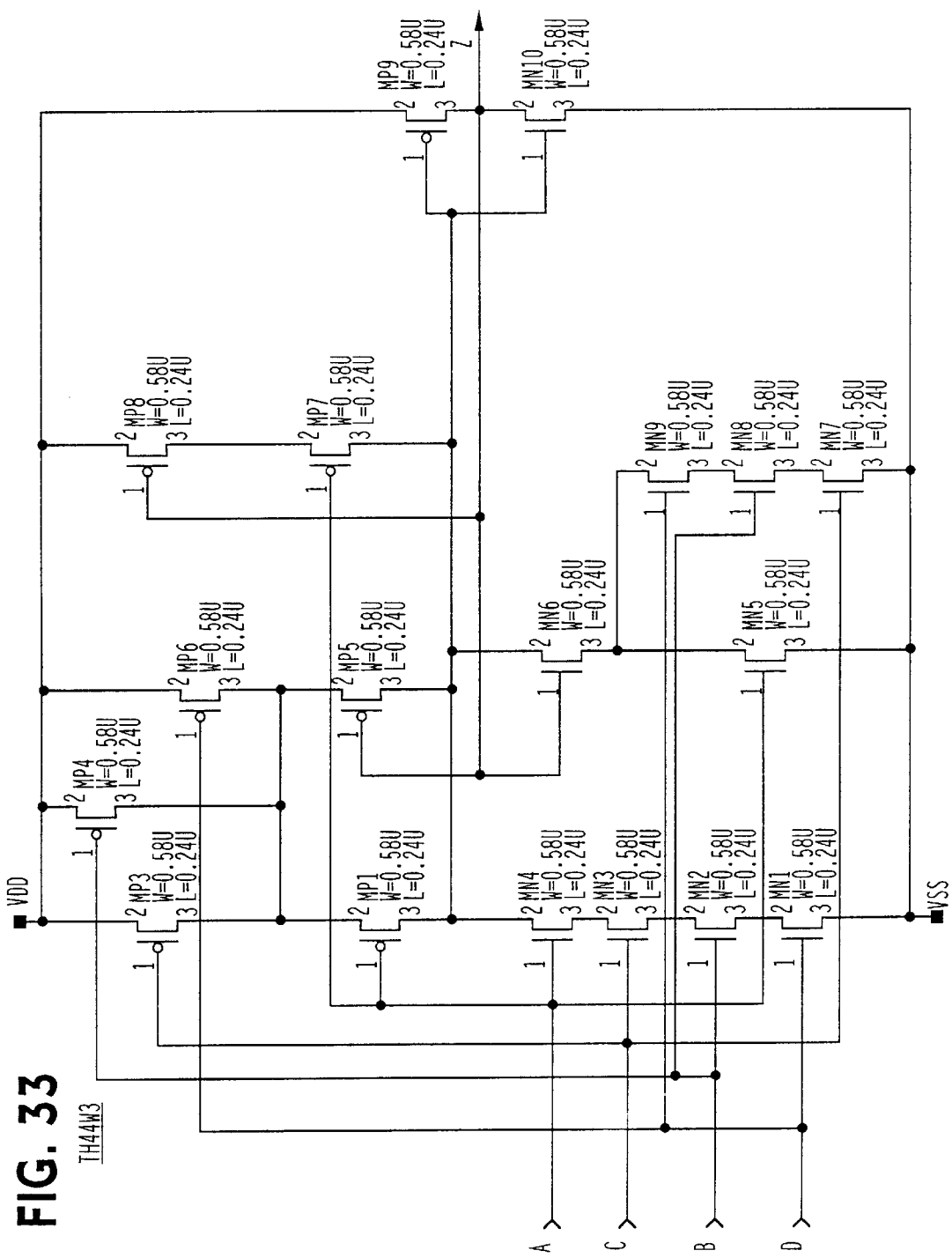
Figure 34:
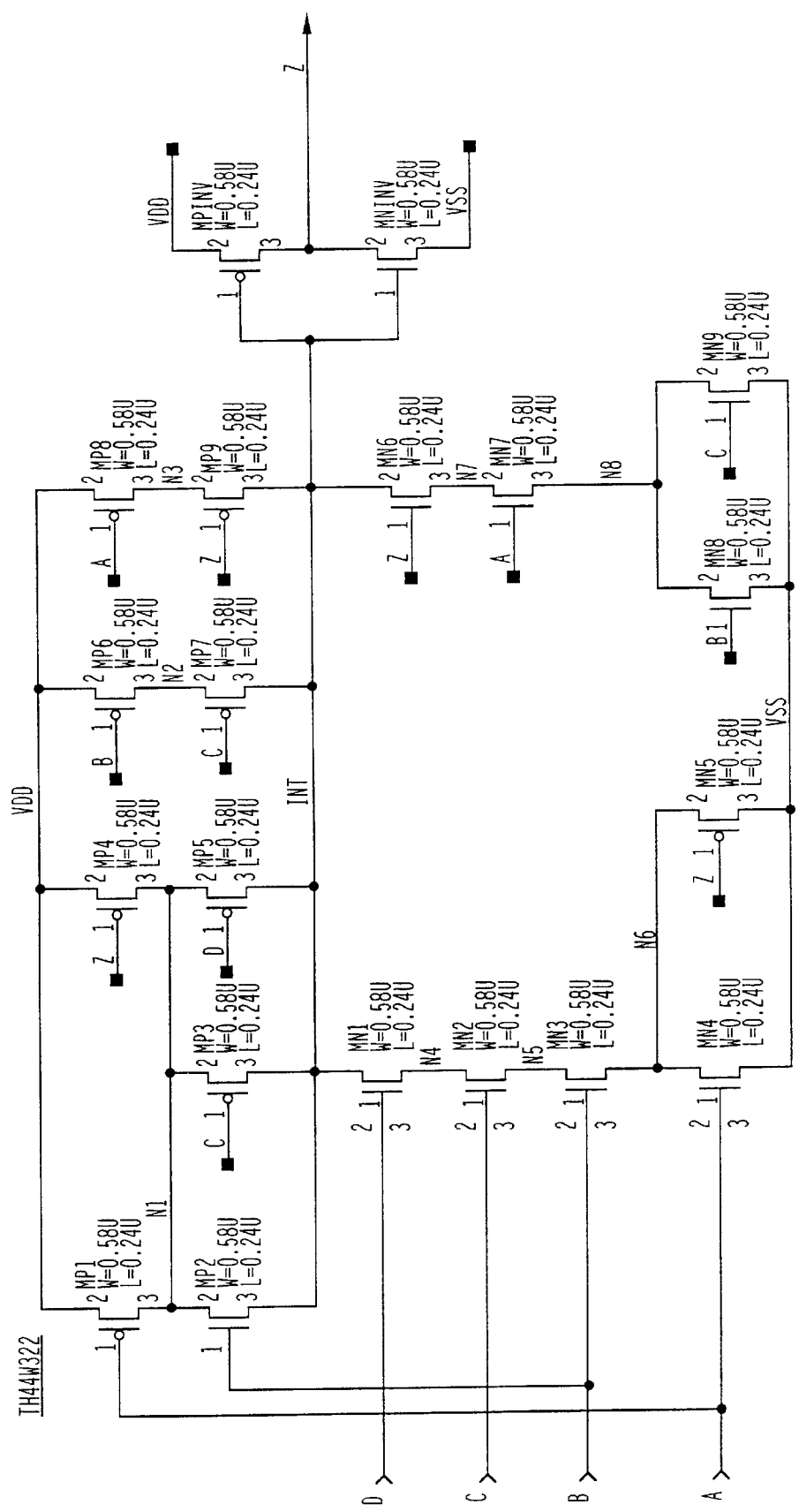
Figure 35:
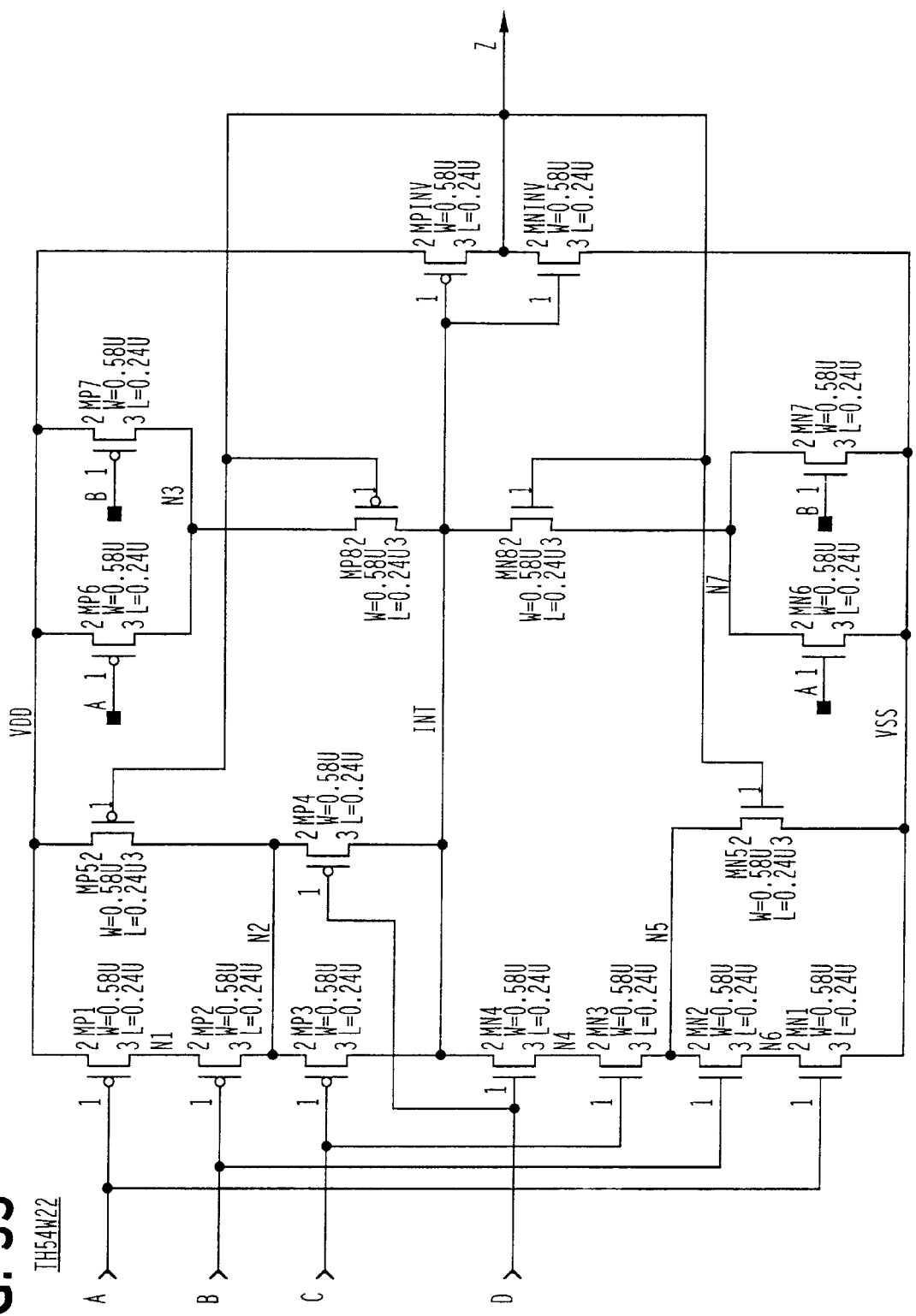
Figure 36:
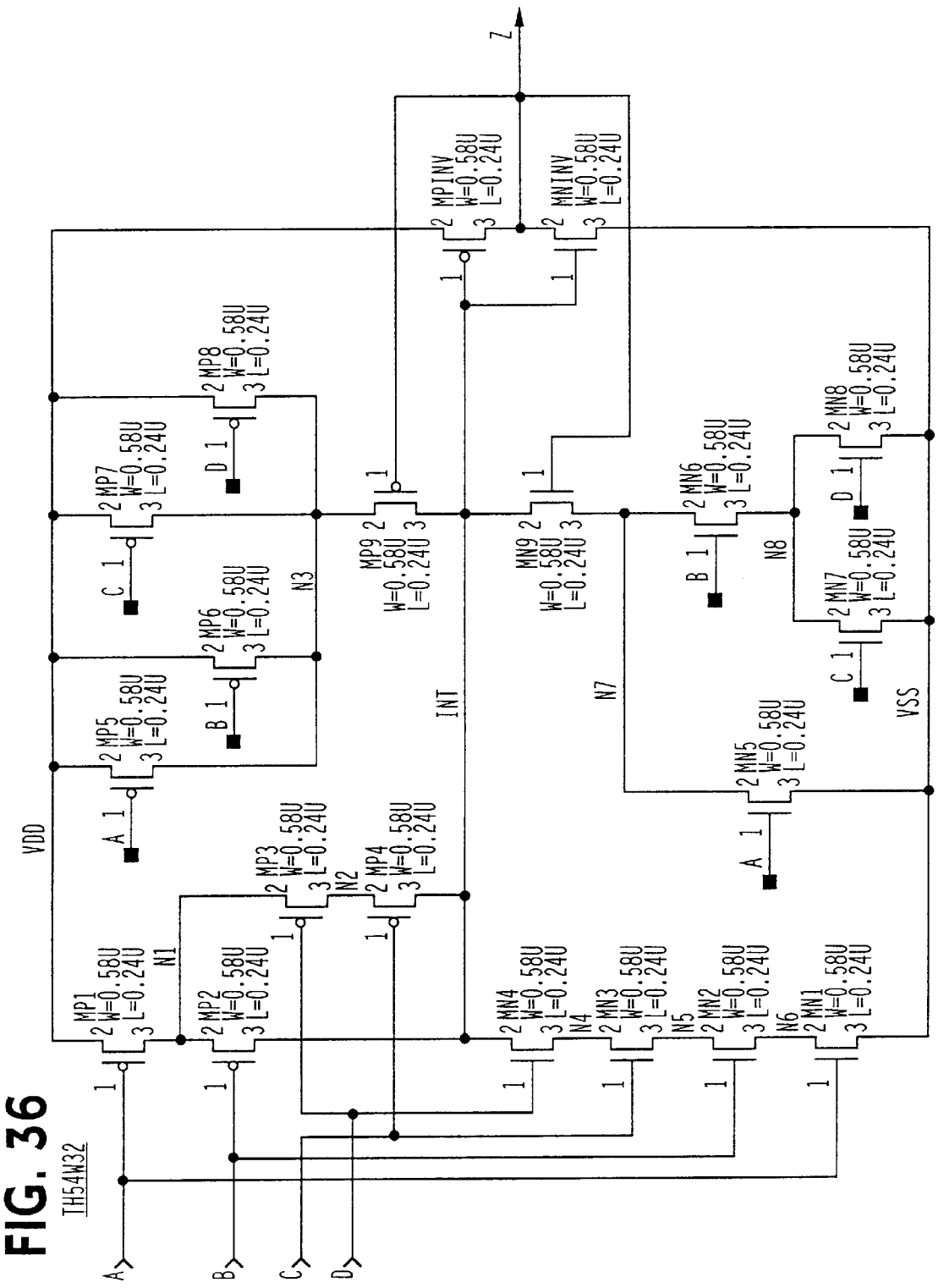
Figure 37:
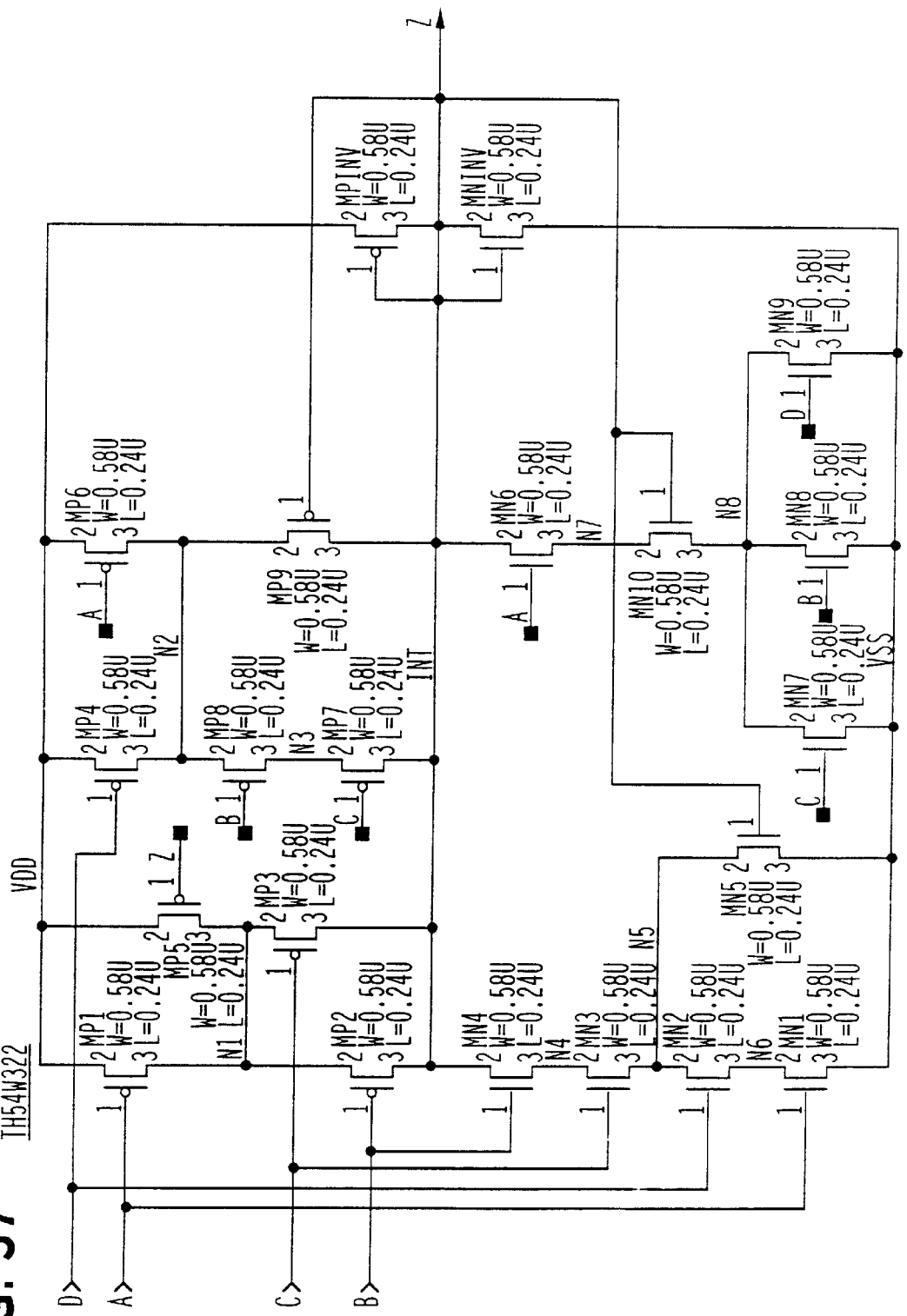
Figure 38:
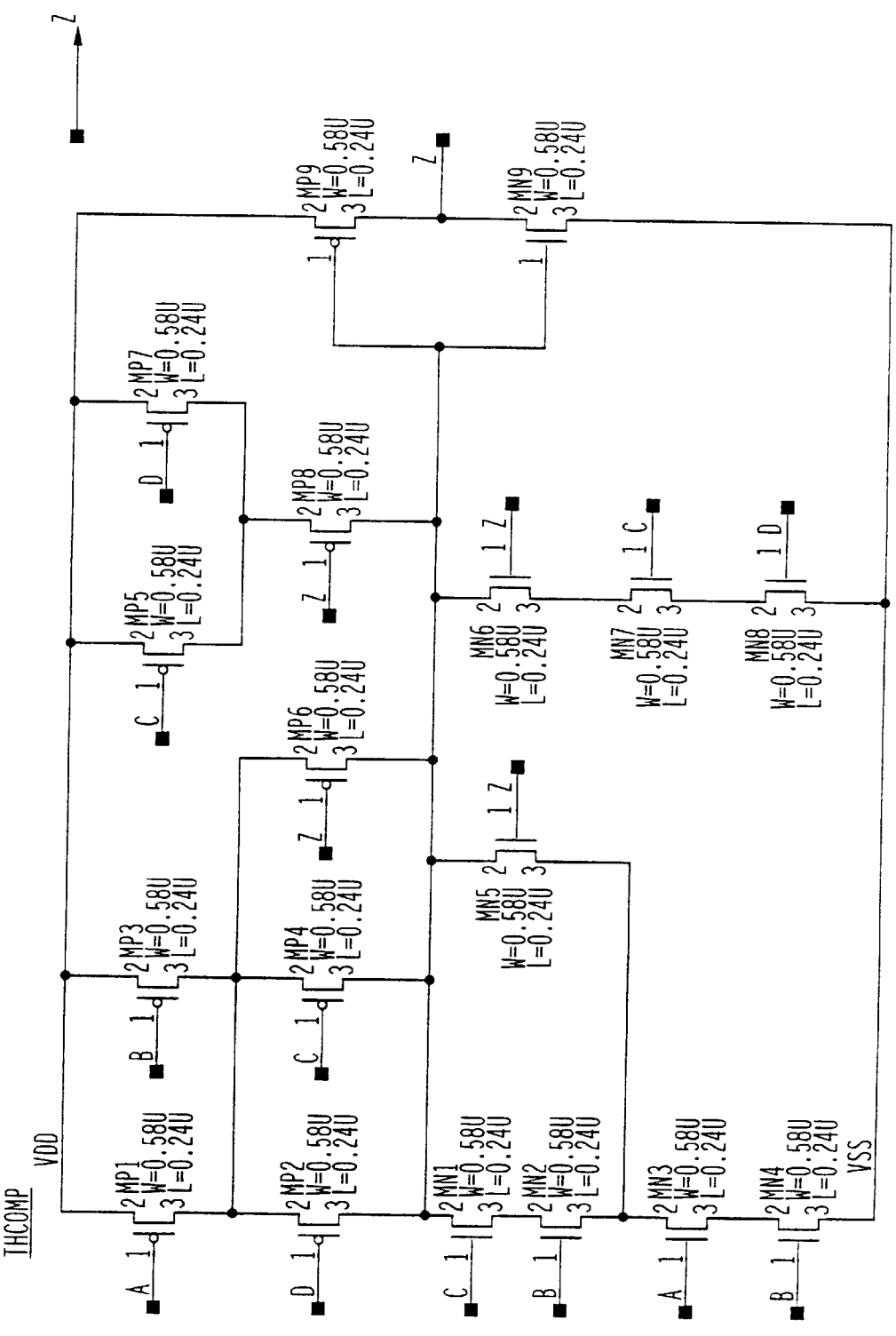
Figure 39:
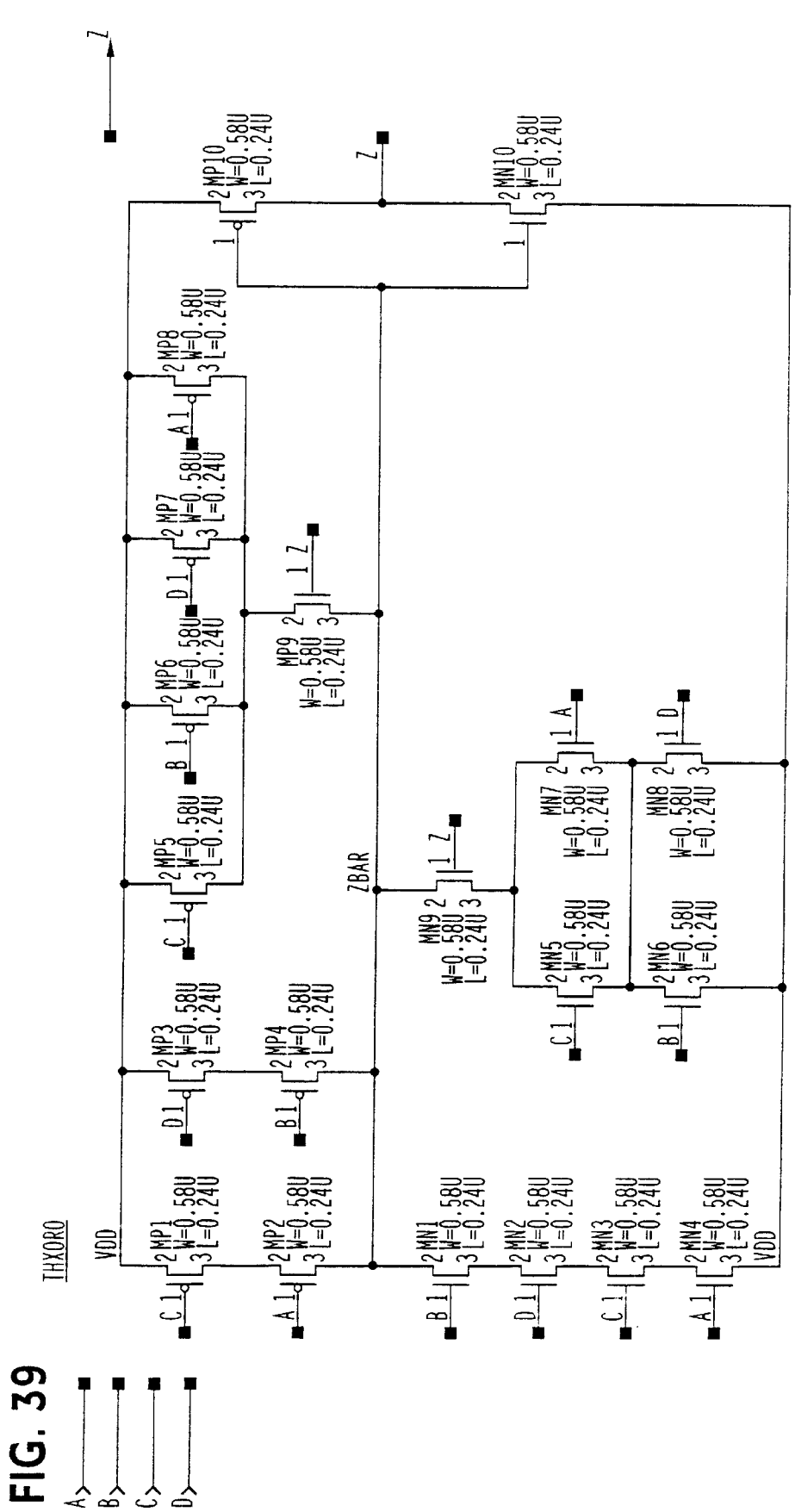
Figure 40:
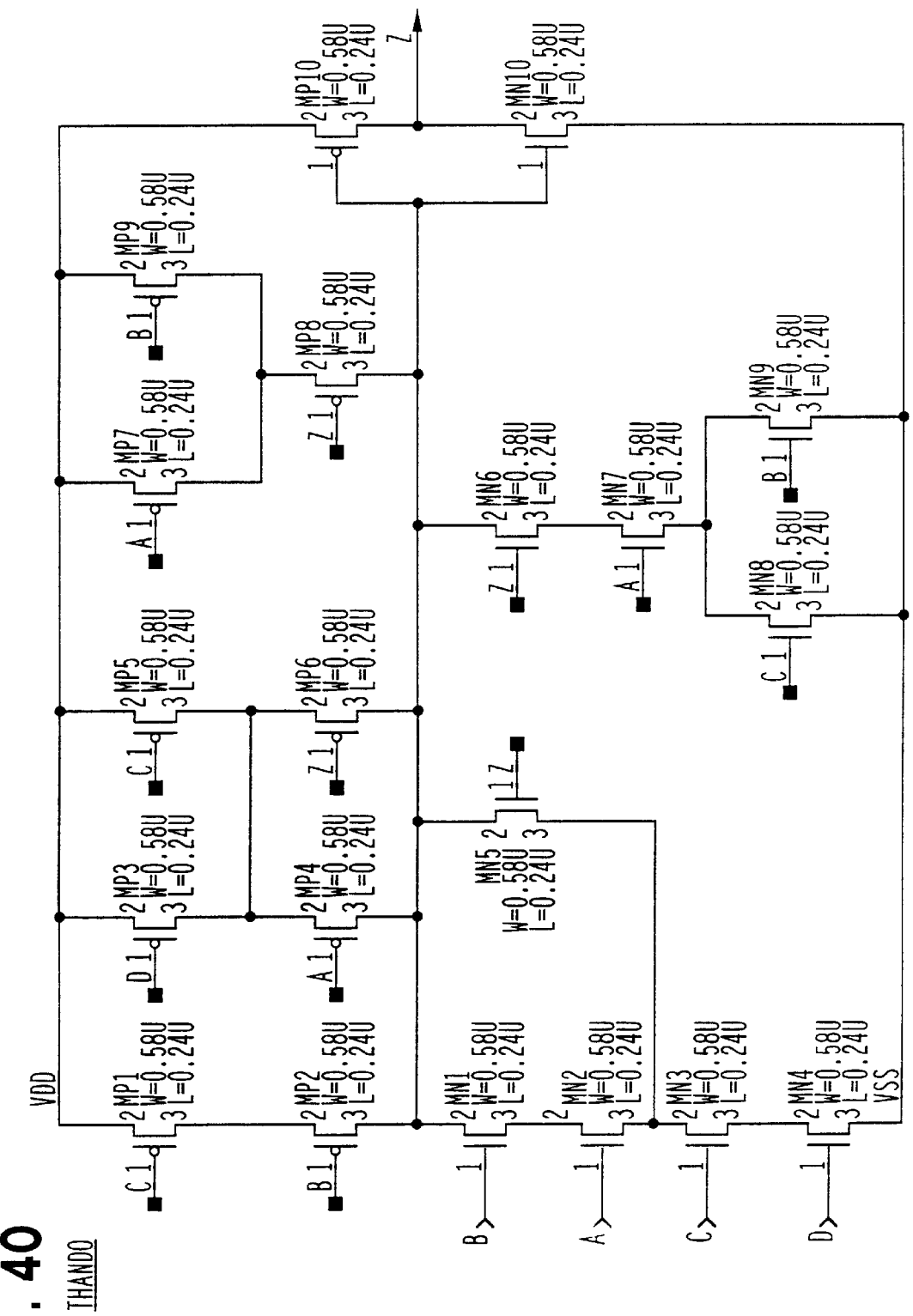
Figure 41:
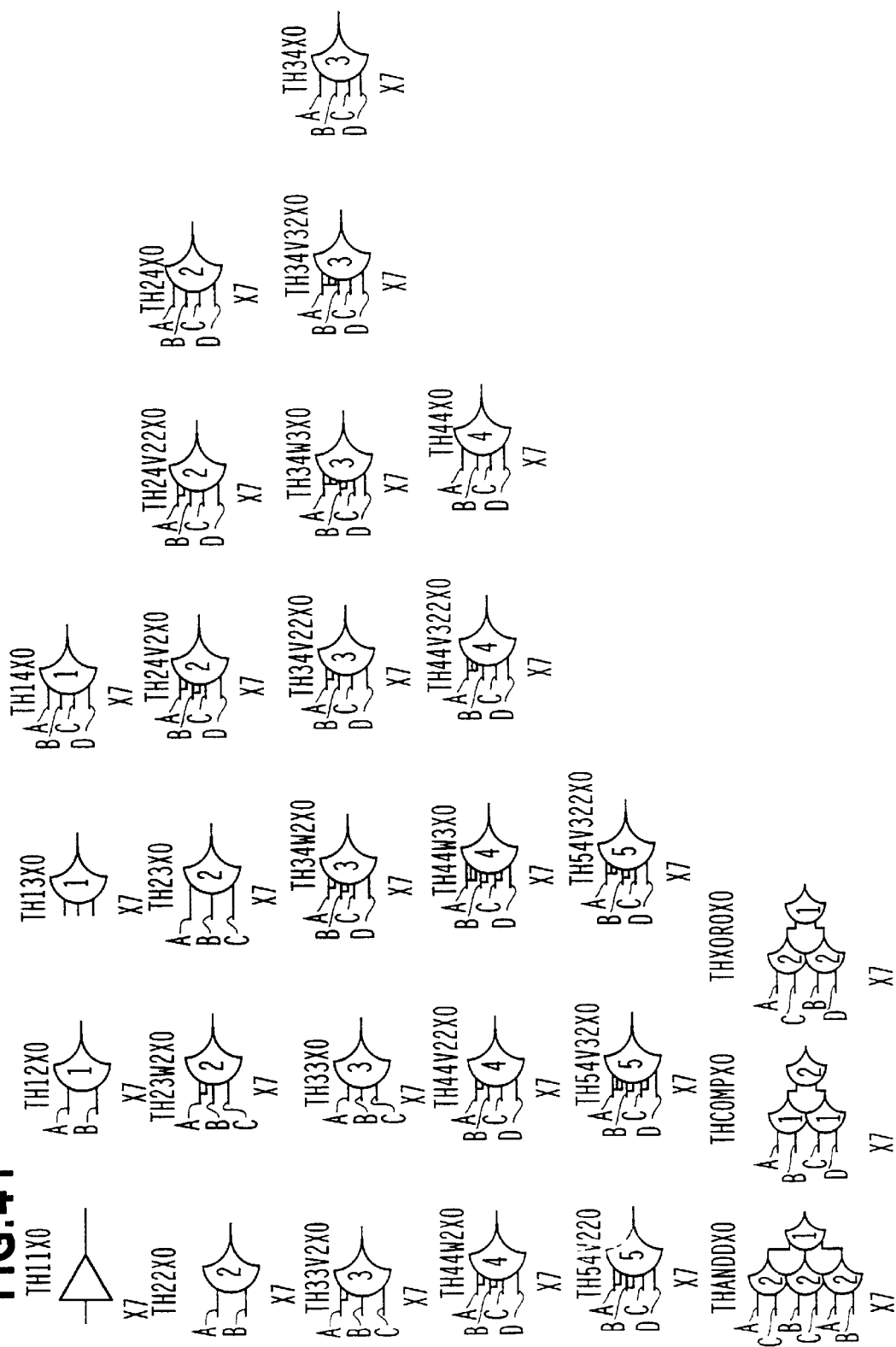
FIGS. 41–69 are schematics of a preferred implementation of a positive library used in conjunction with an embodiment of the present invention.
Figure 42:
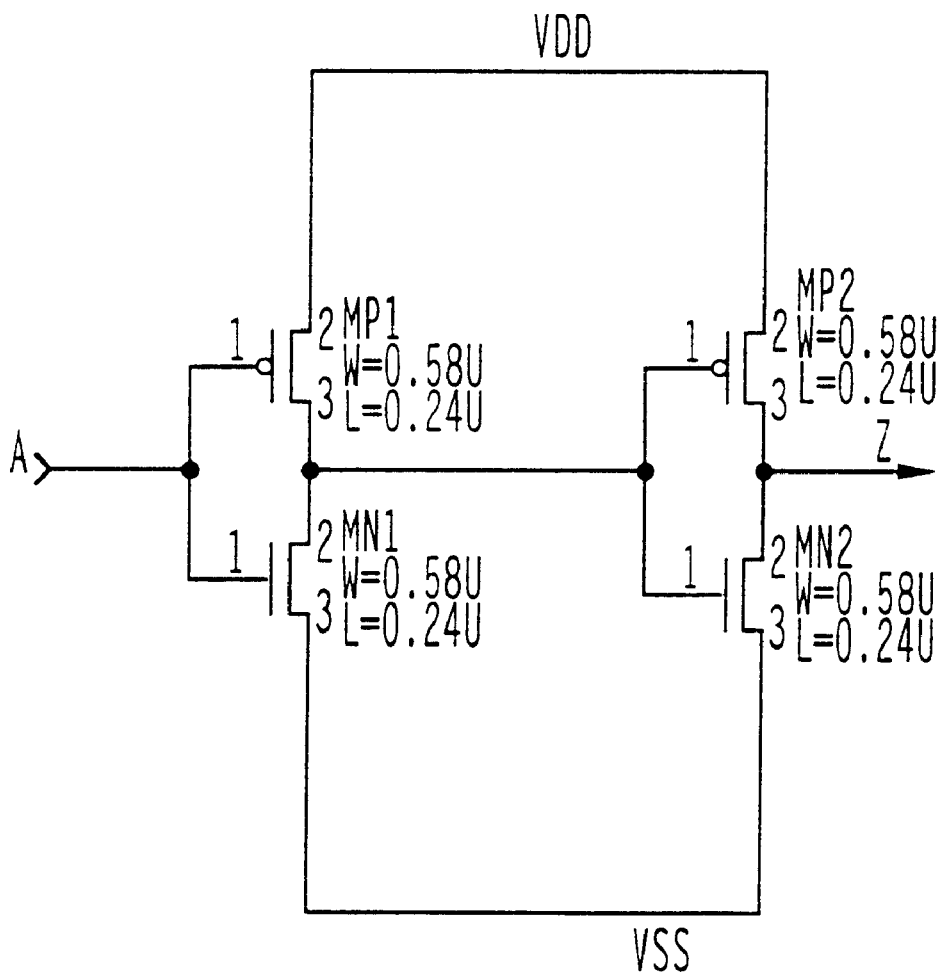
Figure 43:
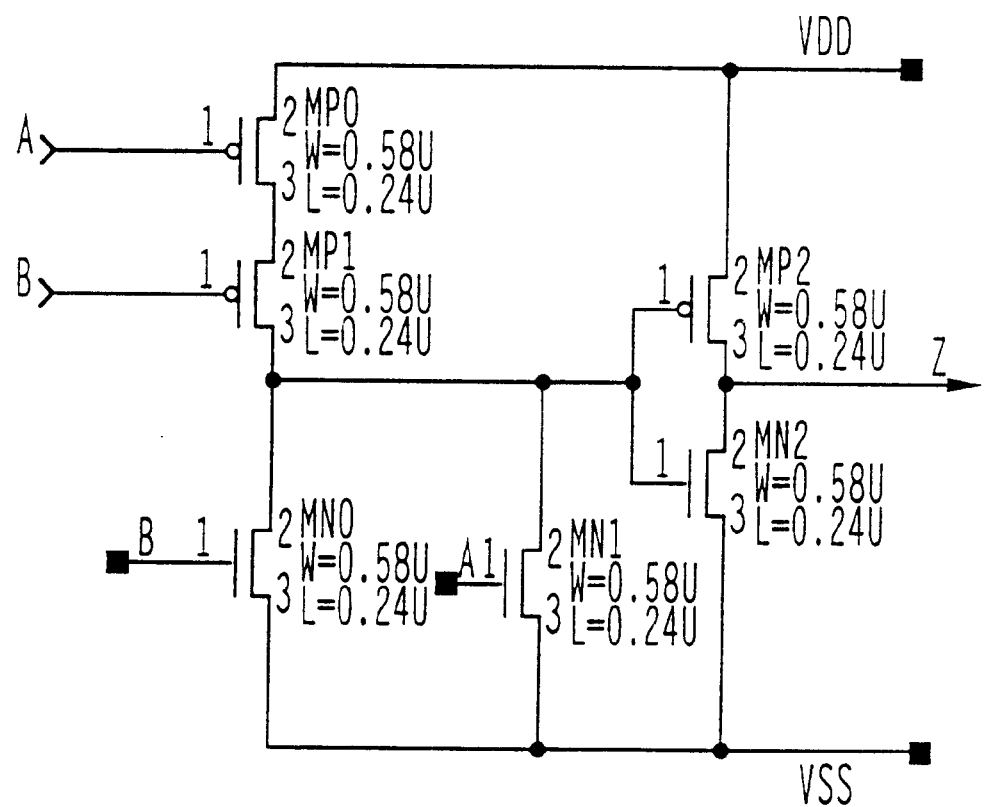
Figure 44:
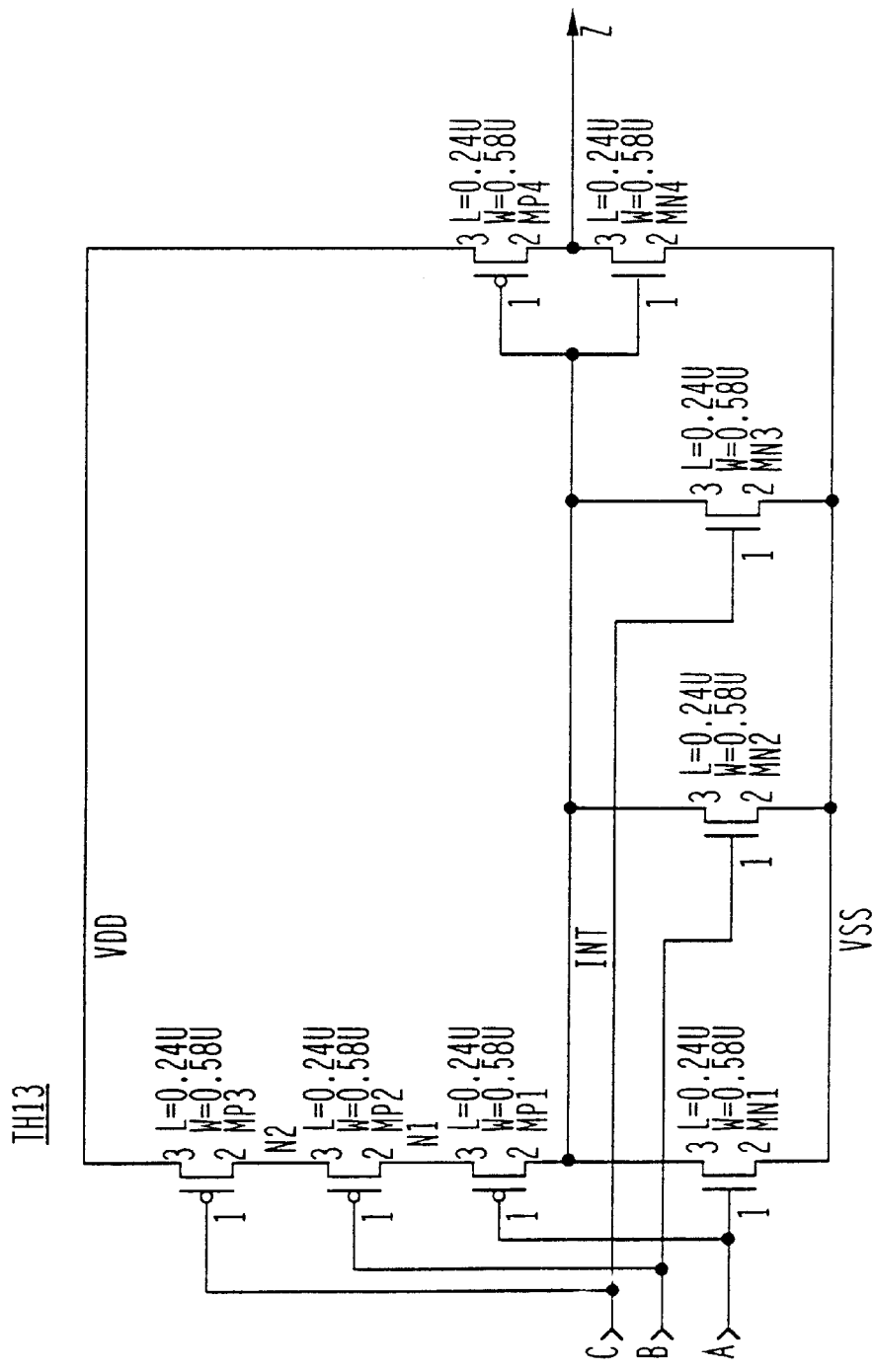
Figure 45:
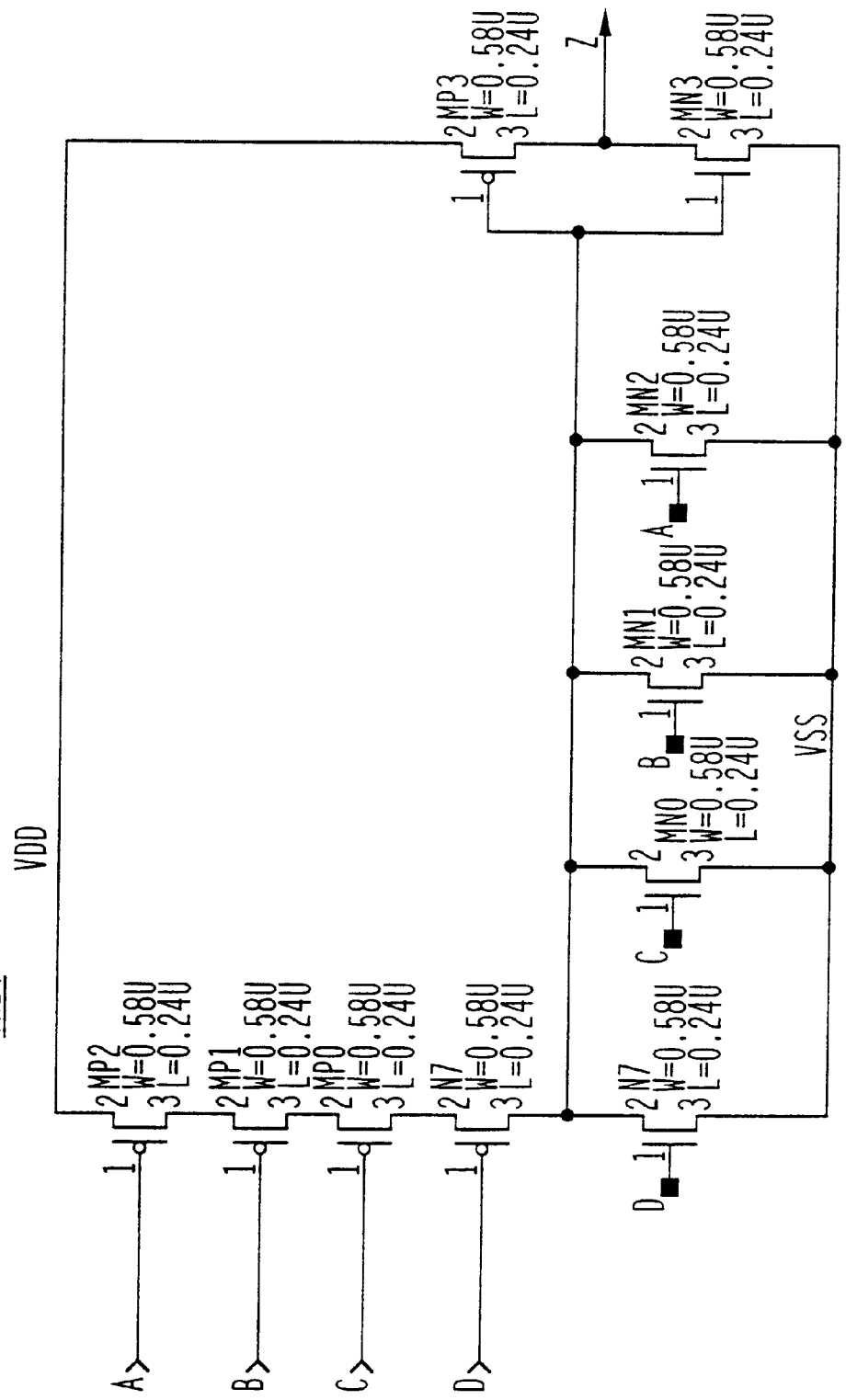
Figure 46:
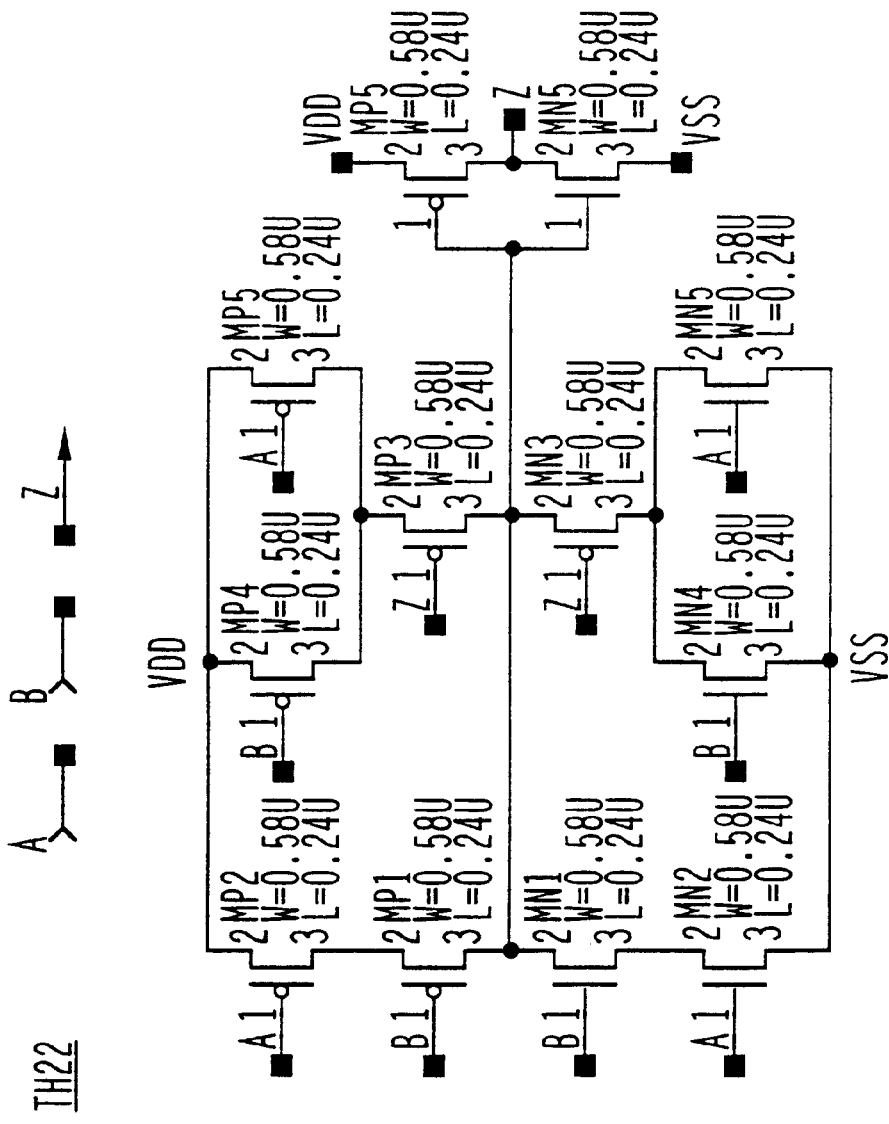
Figure 47:
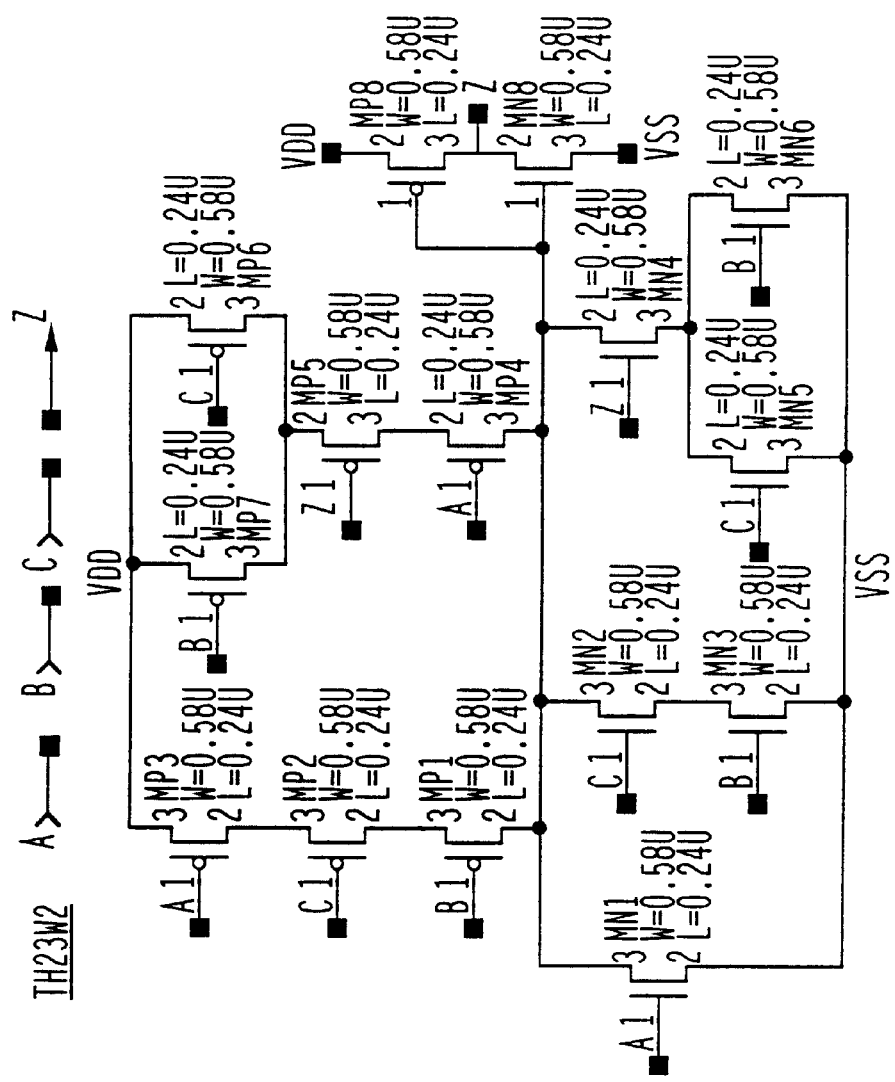
Figure 48:
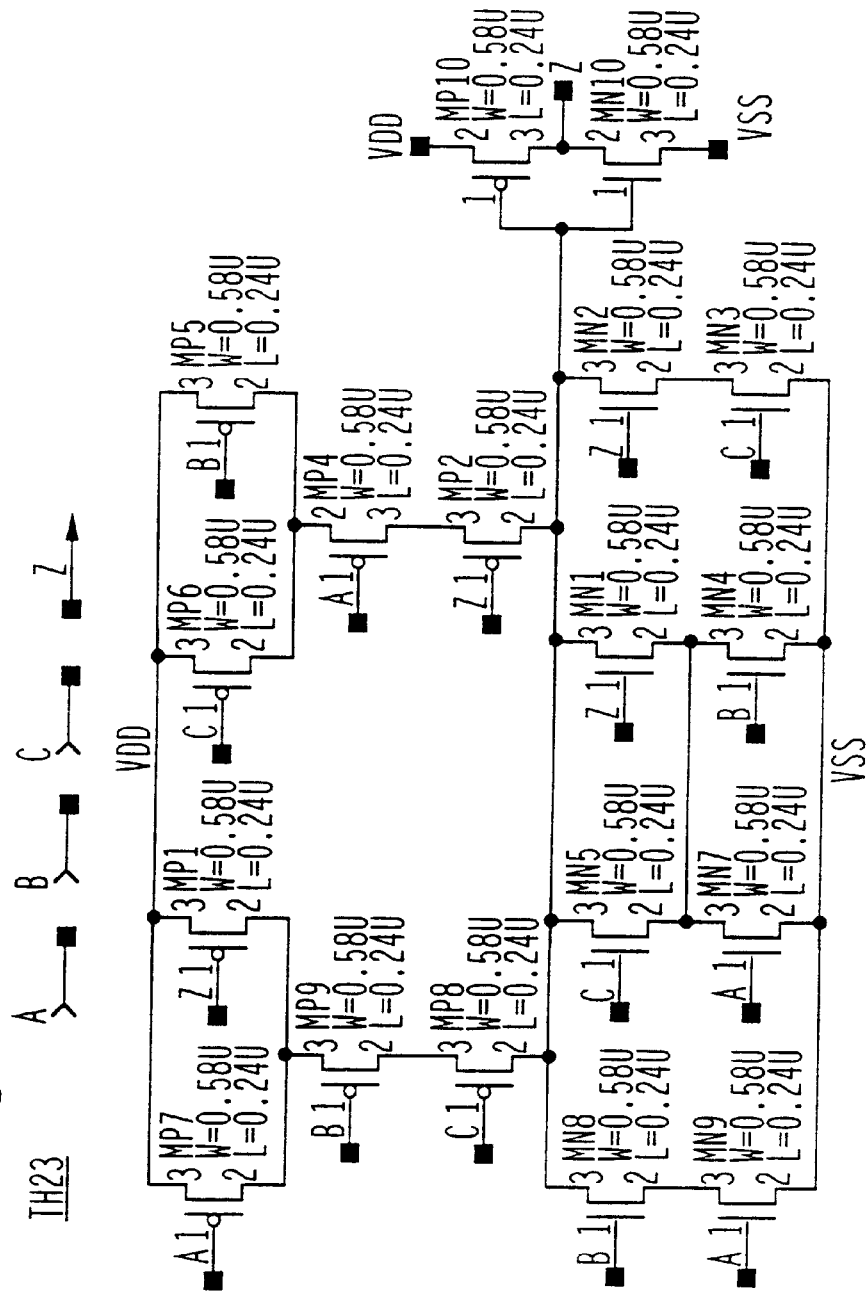
Figure 49:
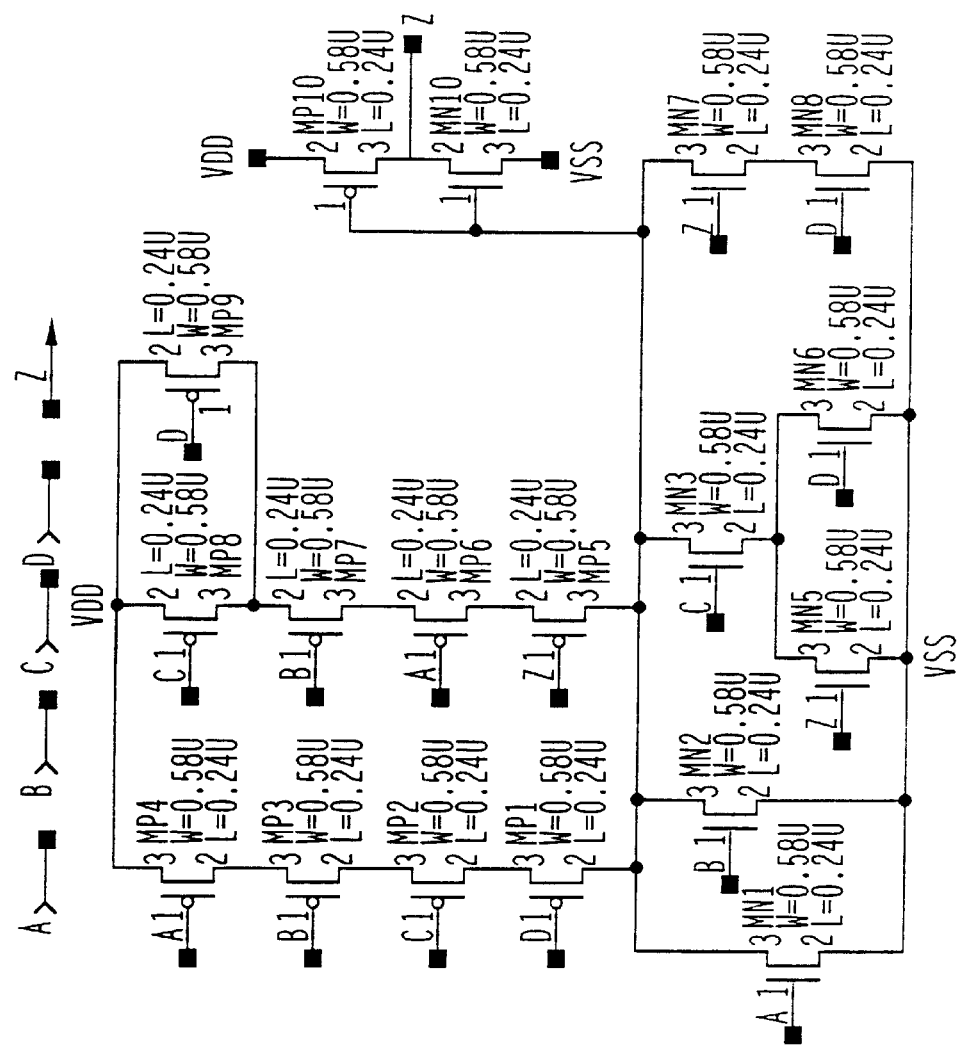
Figure 50:
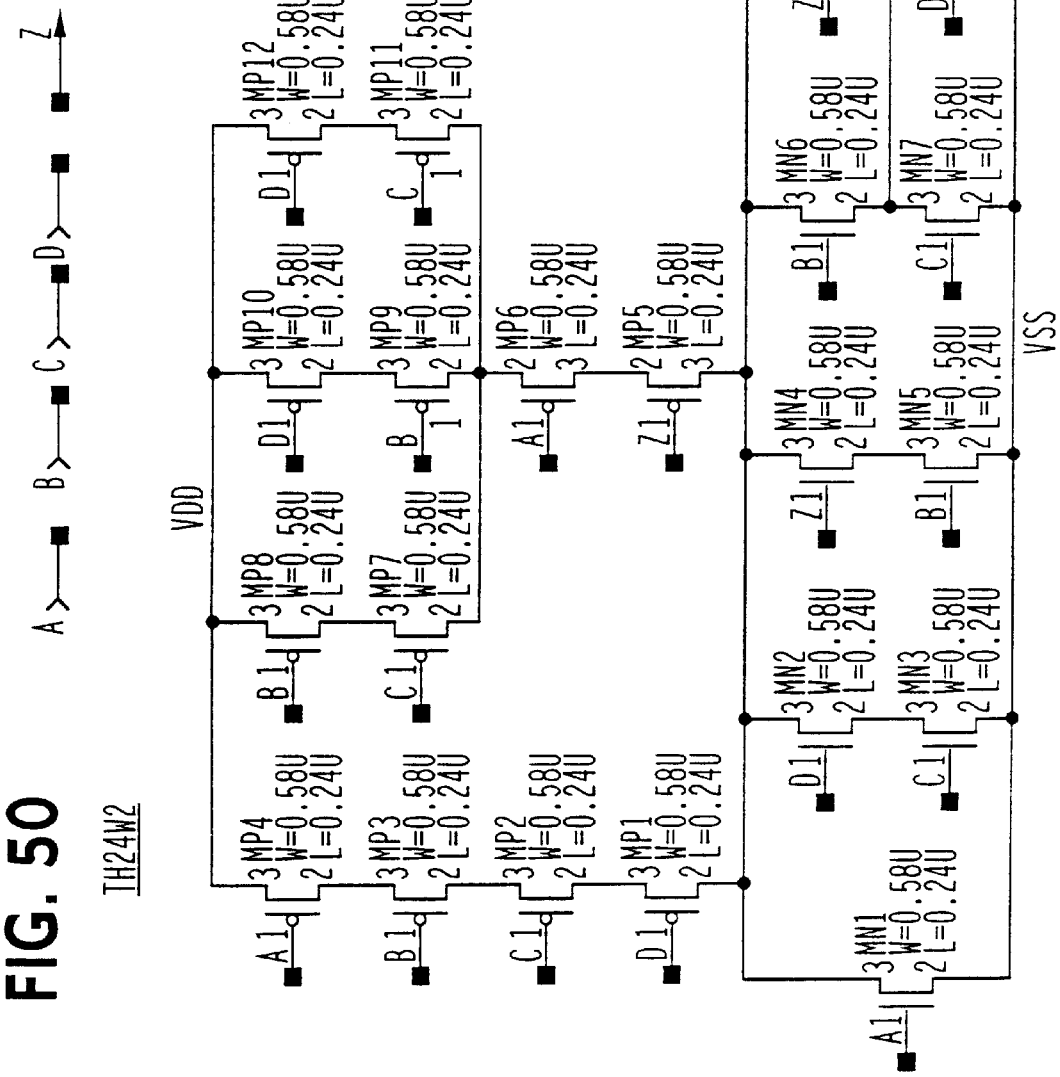
Figure 51:
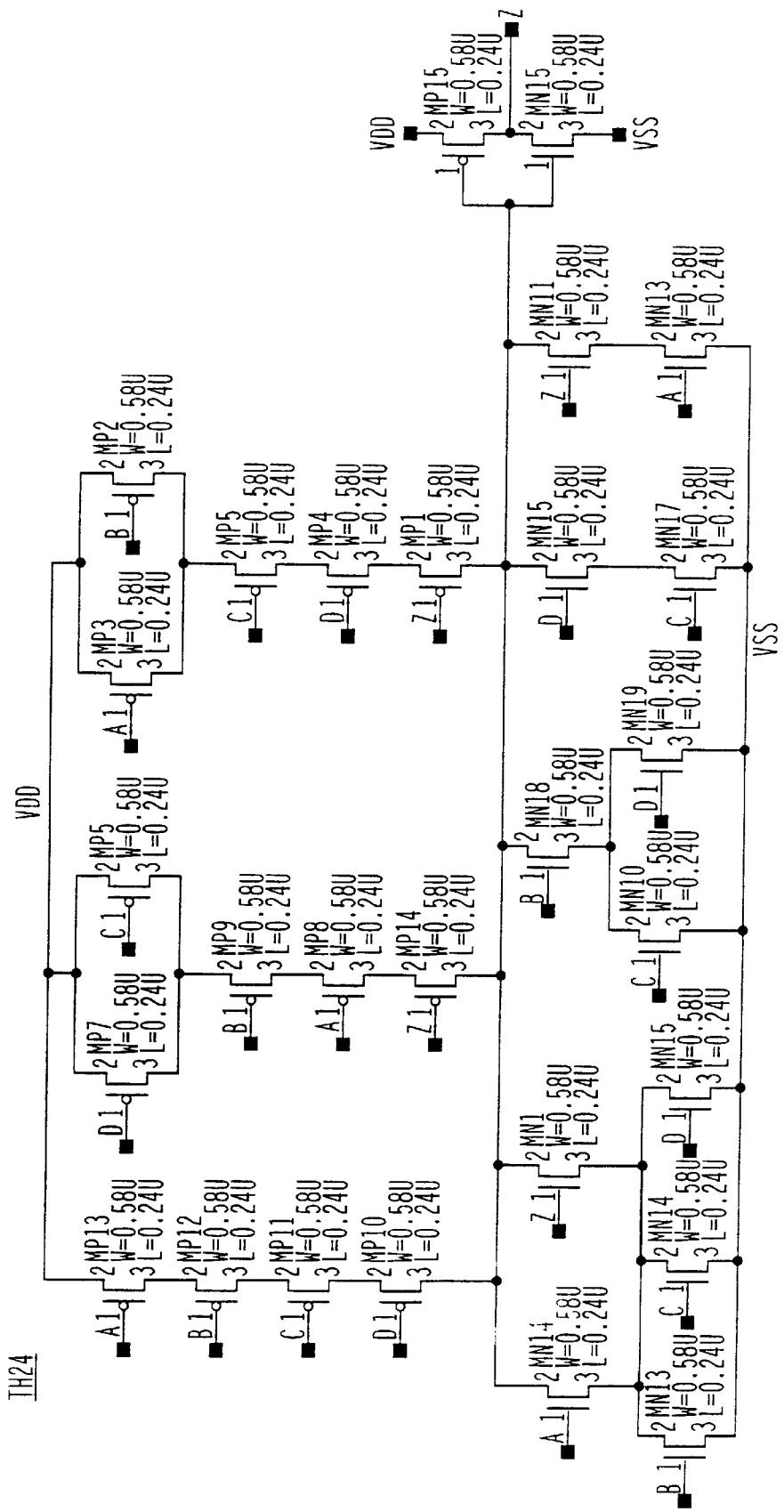
Figure 52:
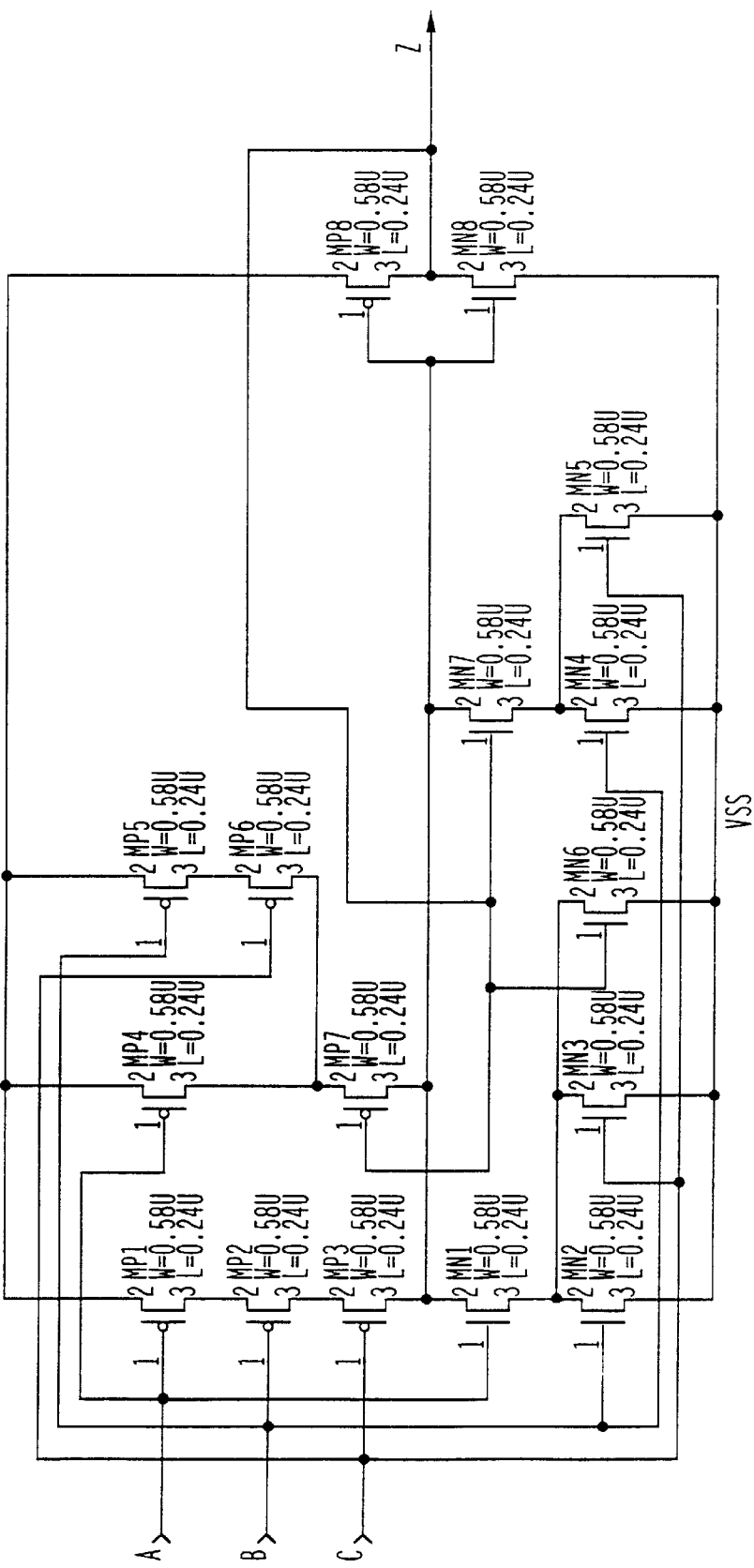
Figure 53:
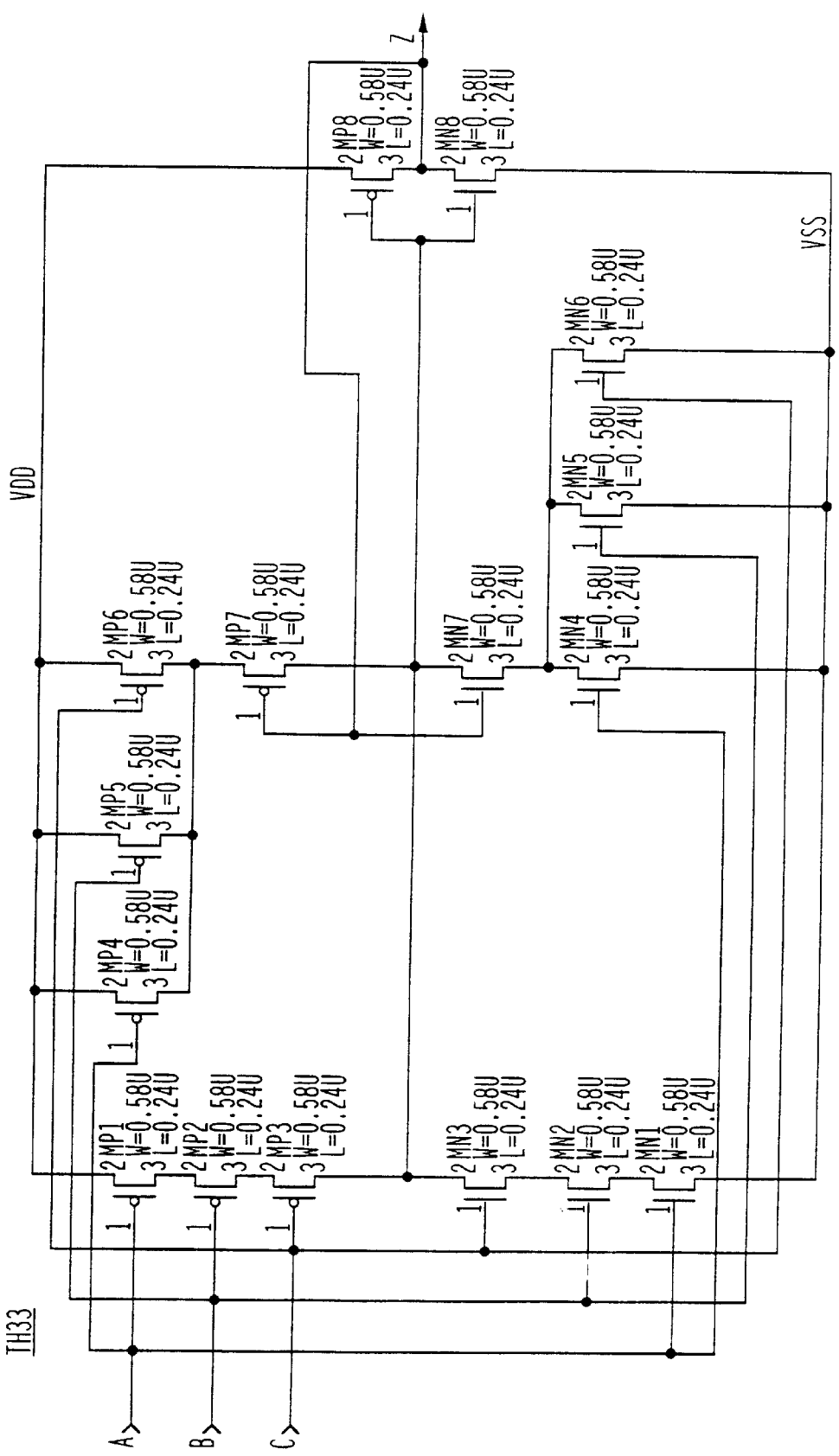
Figure 54:
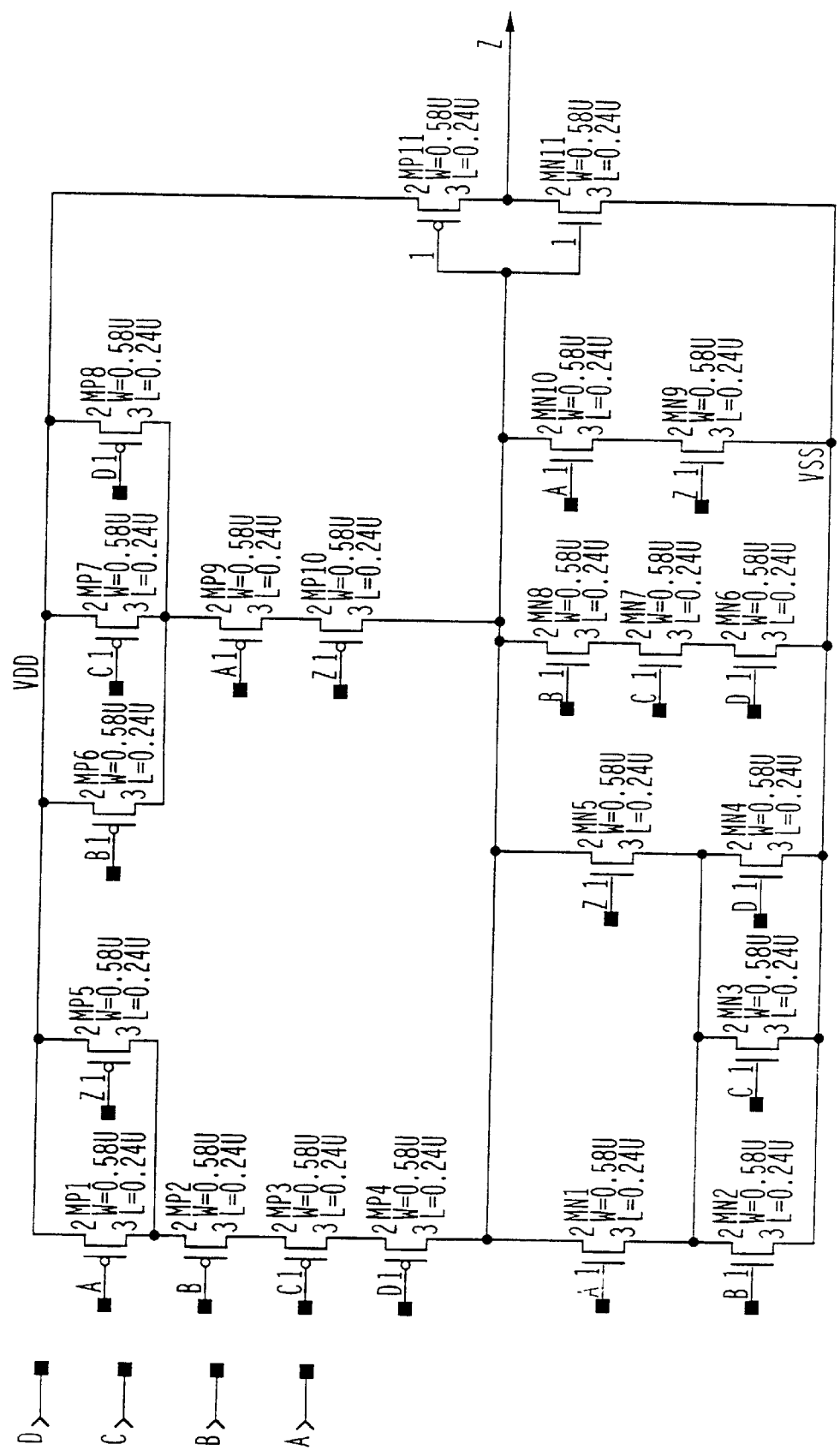
Figure 55:
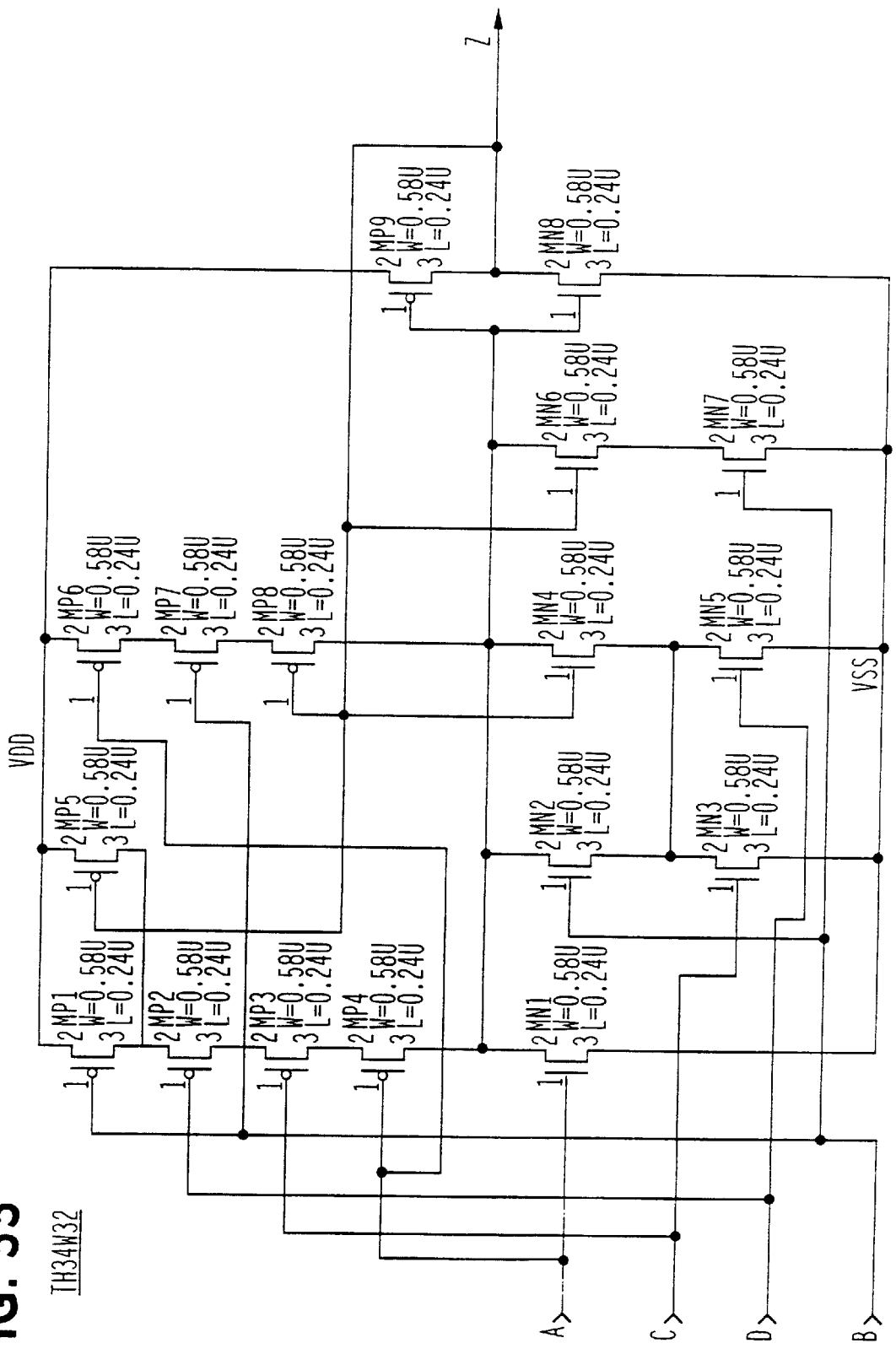
Figure 56:
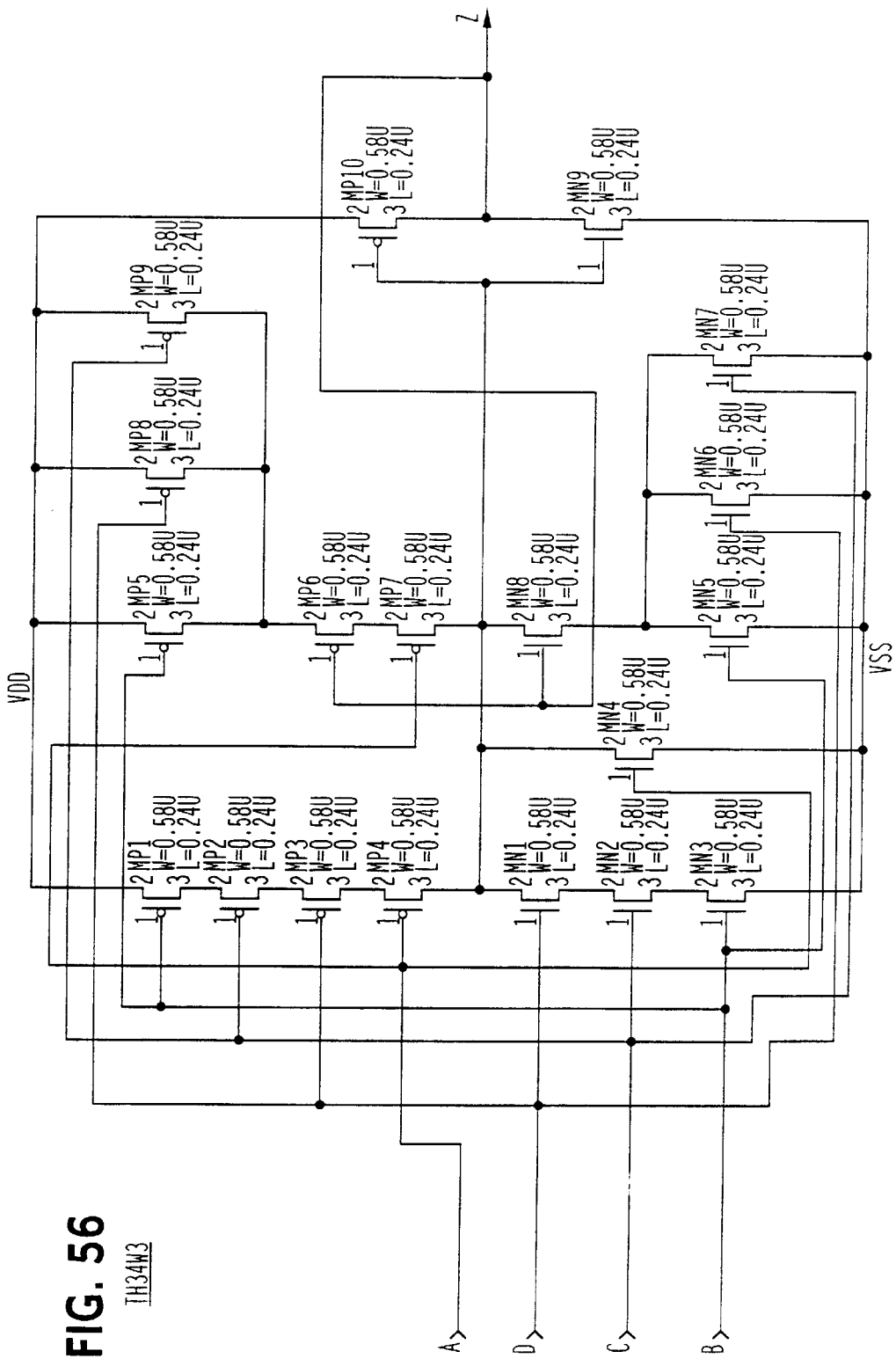
Figure 57:
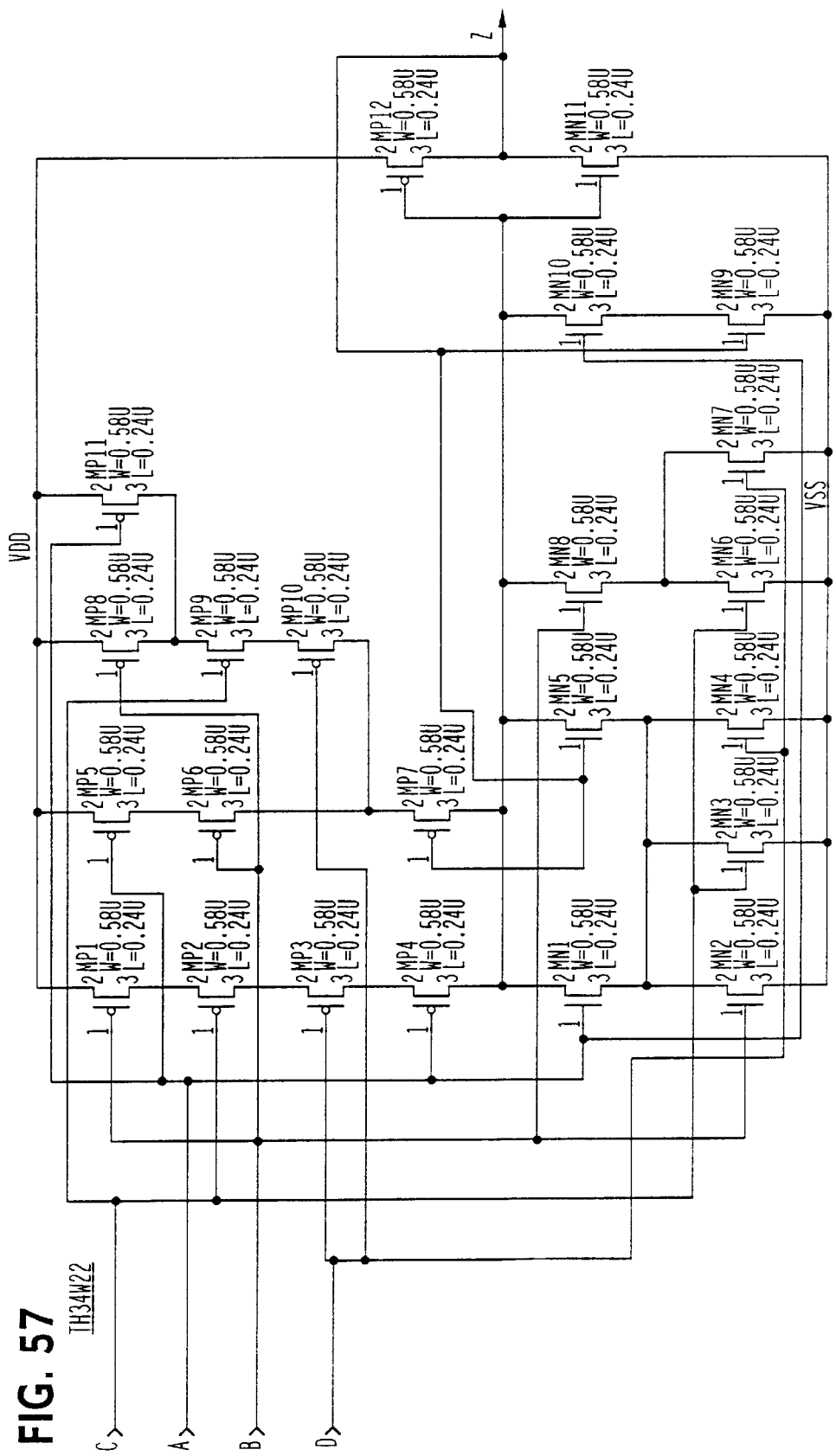
Figure 58:
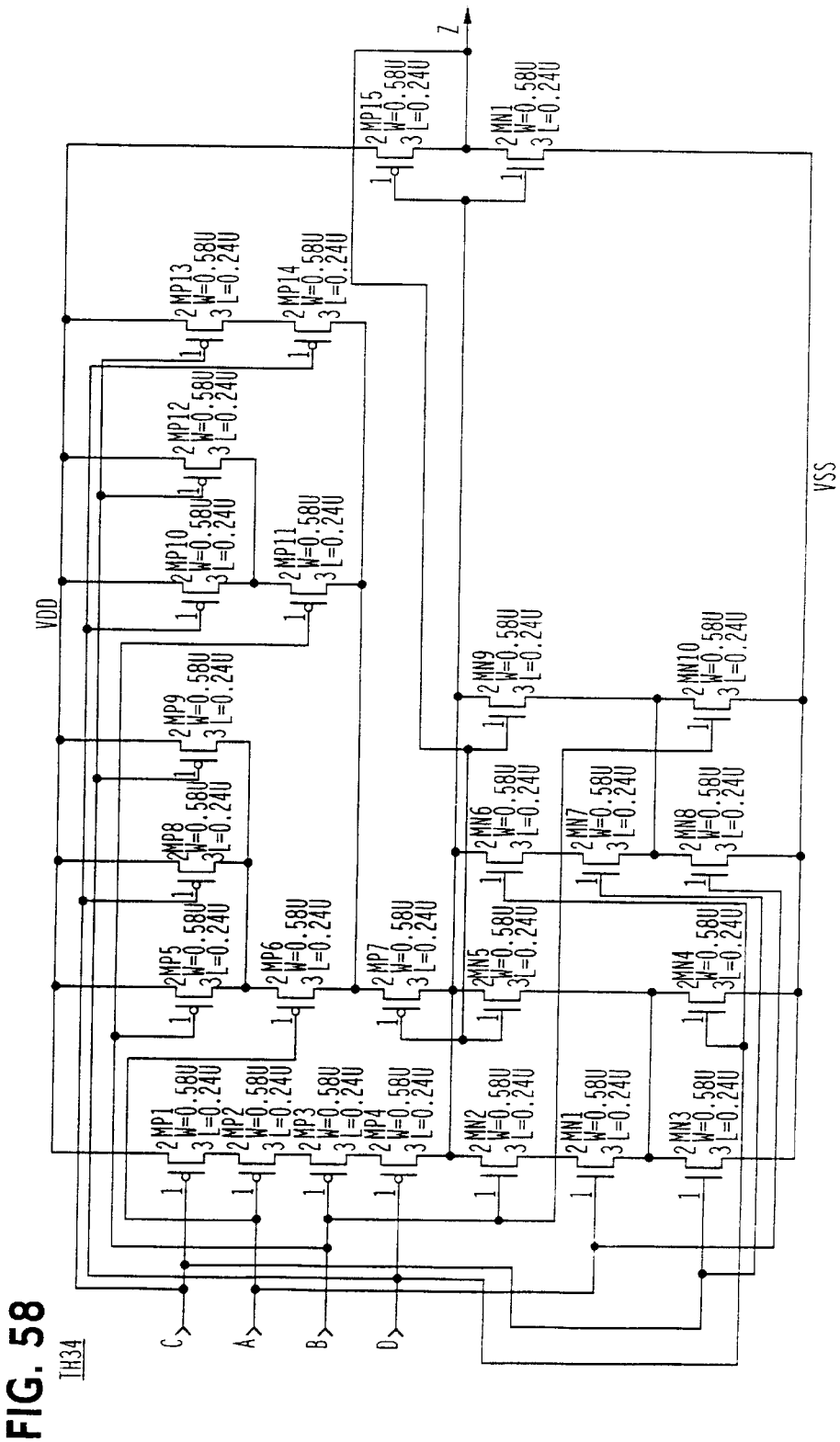
Figure 59:
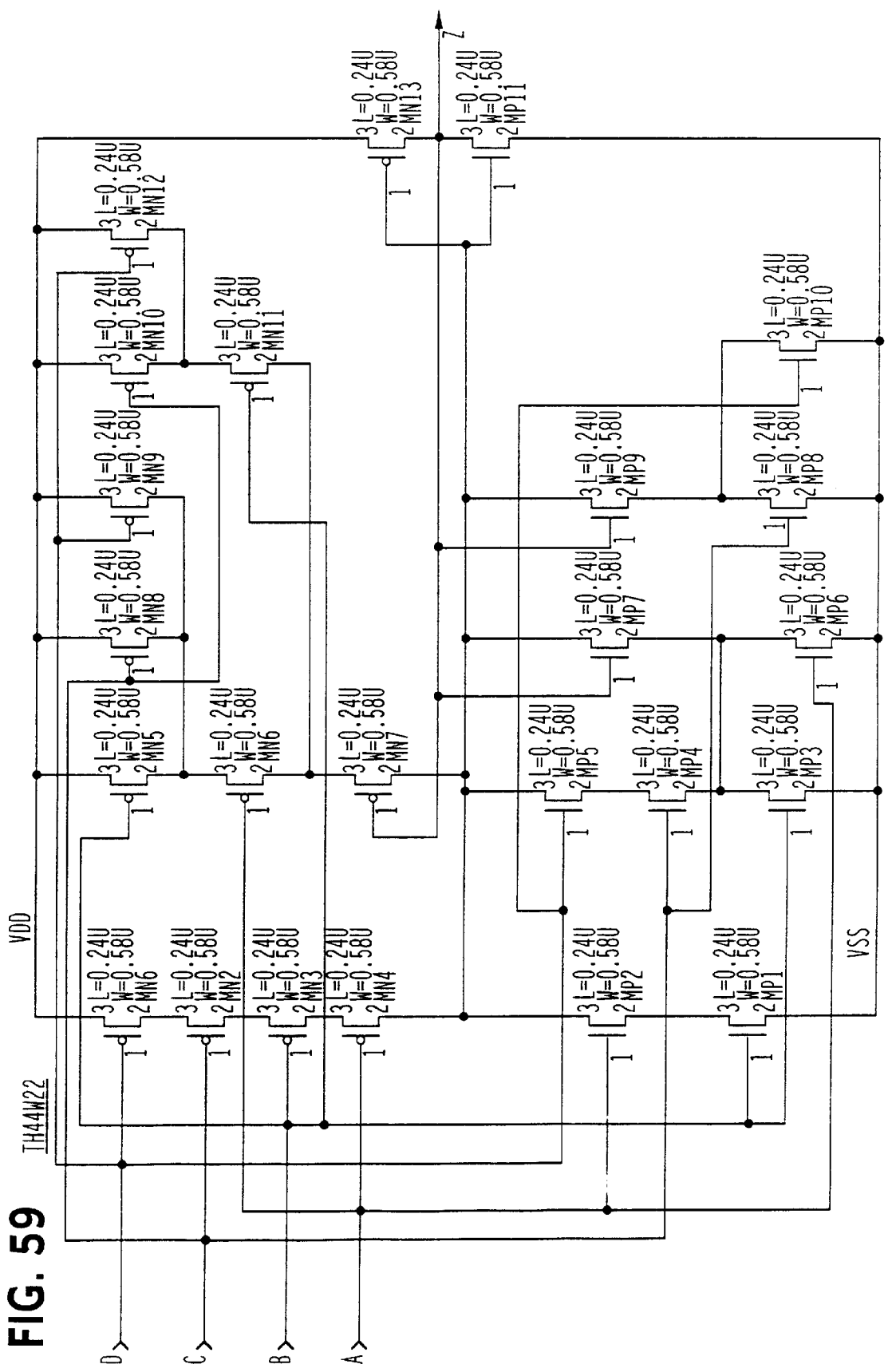
Figure 60:
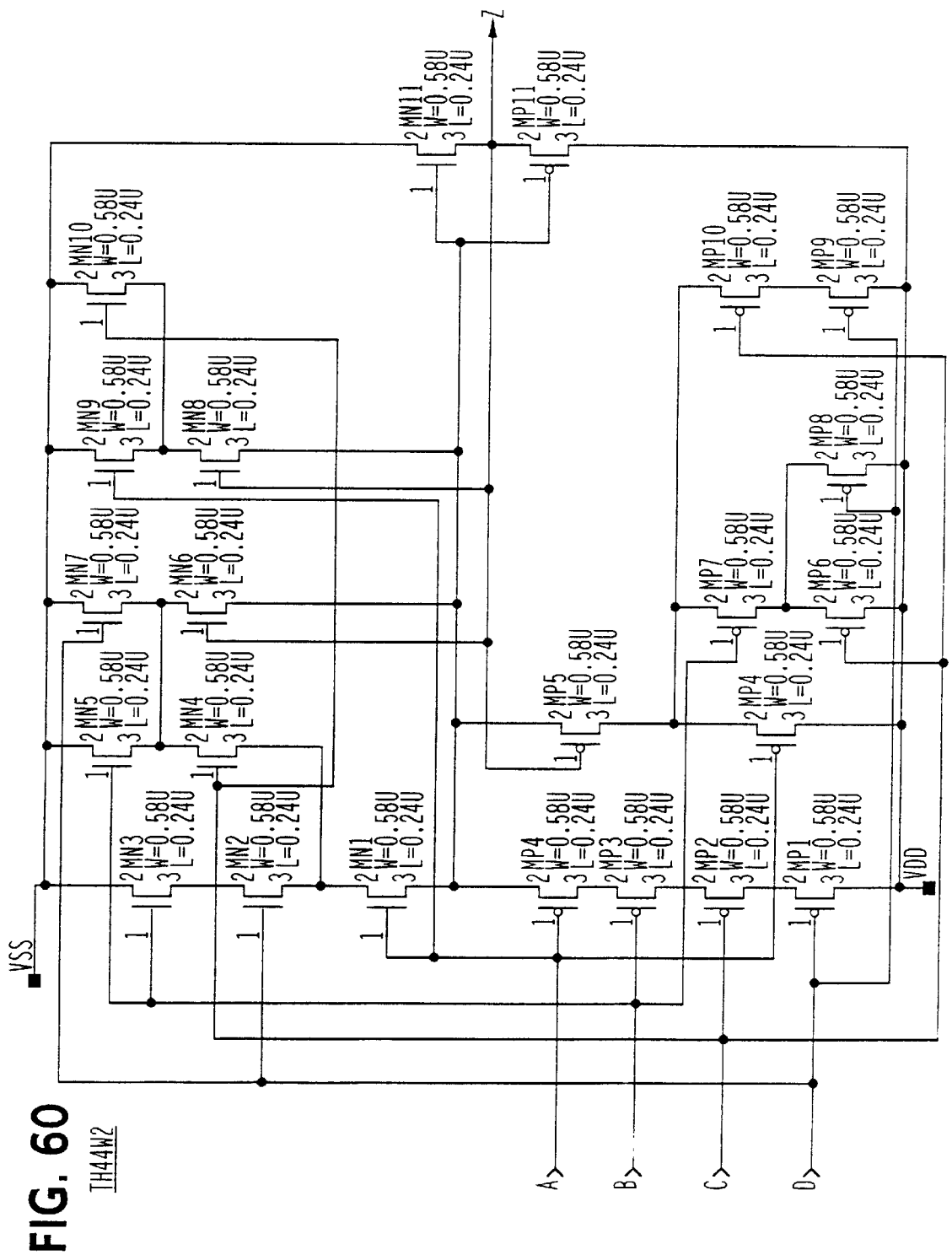
Figure 61:
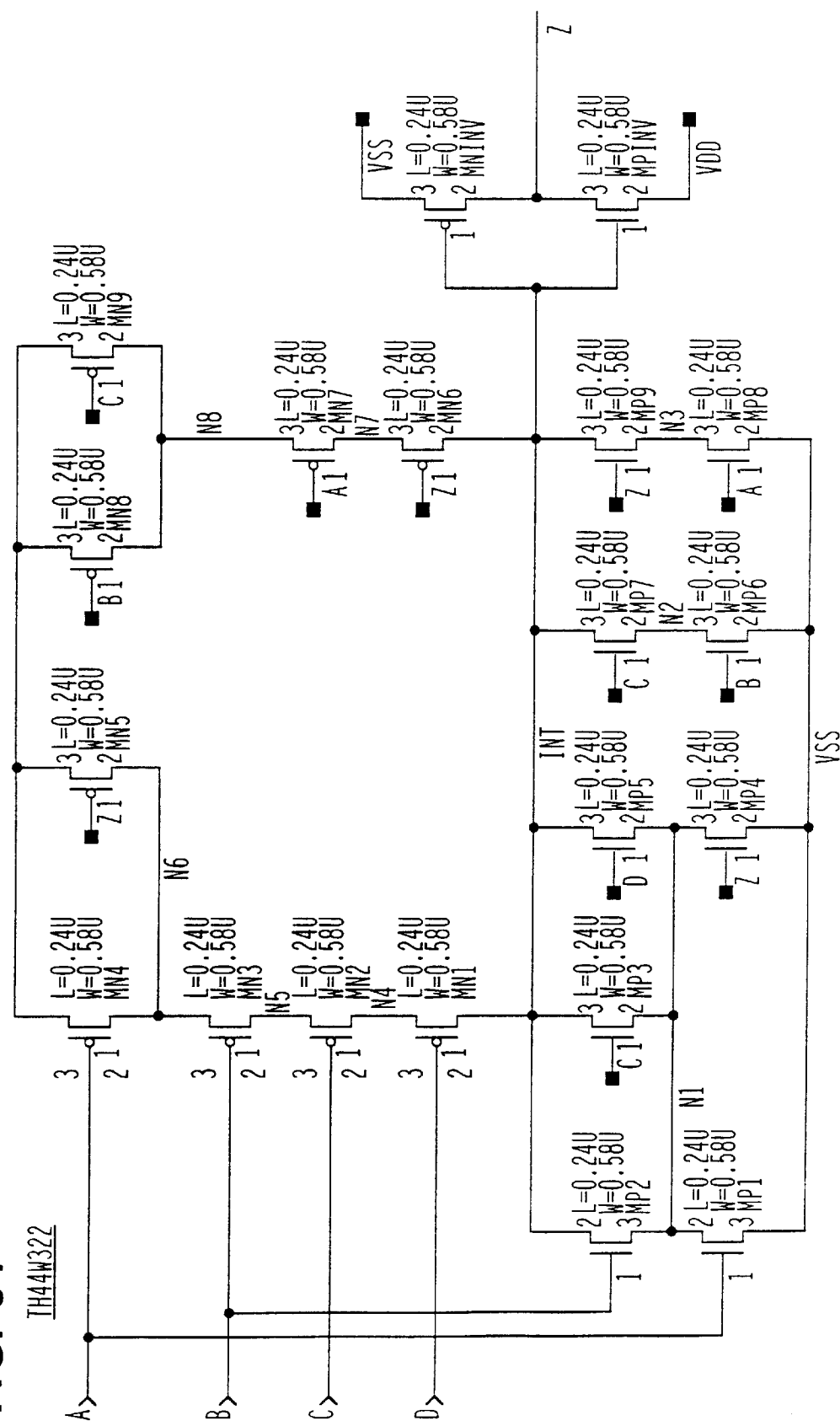
Figure 62:
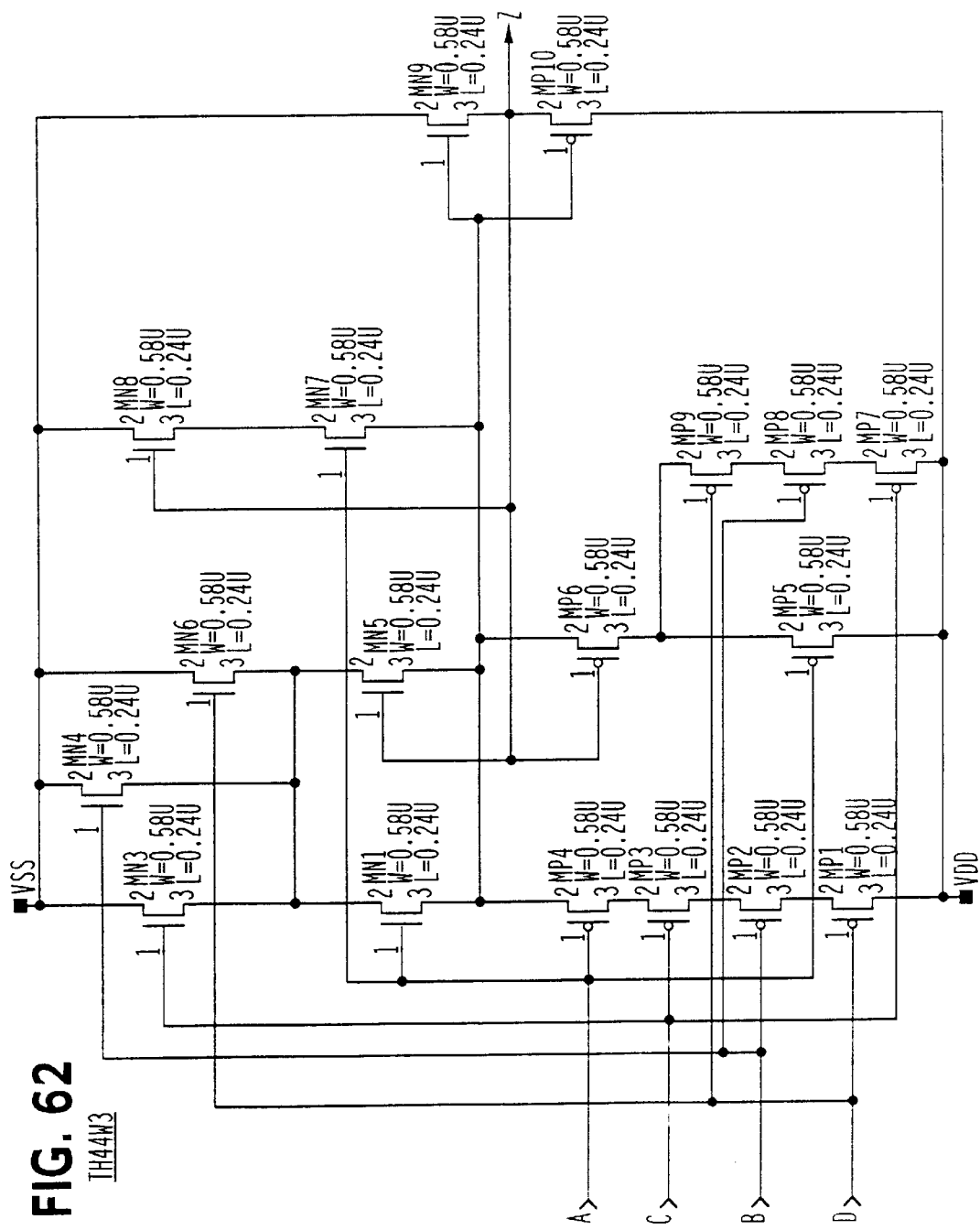
Figure 63:
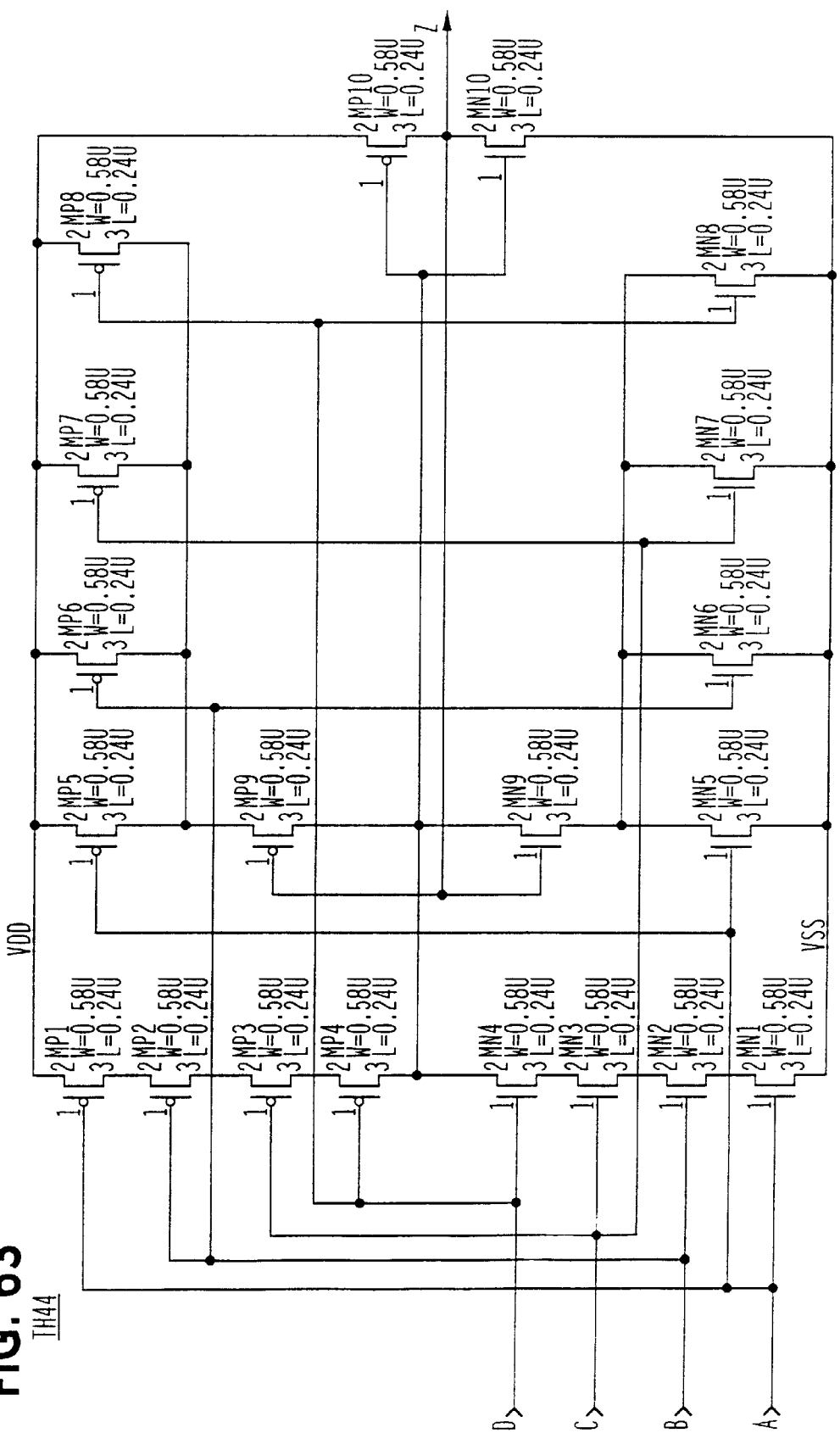
Figure 64:
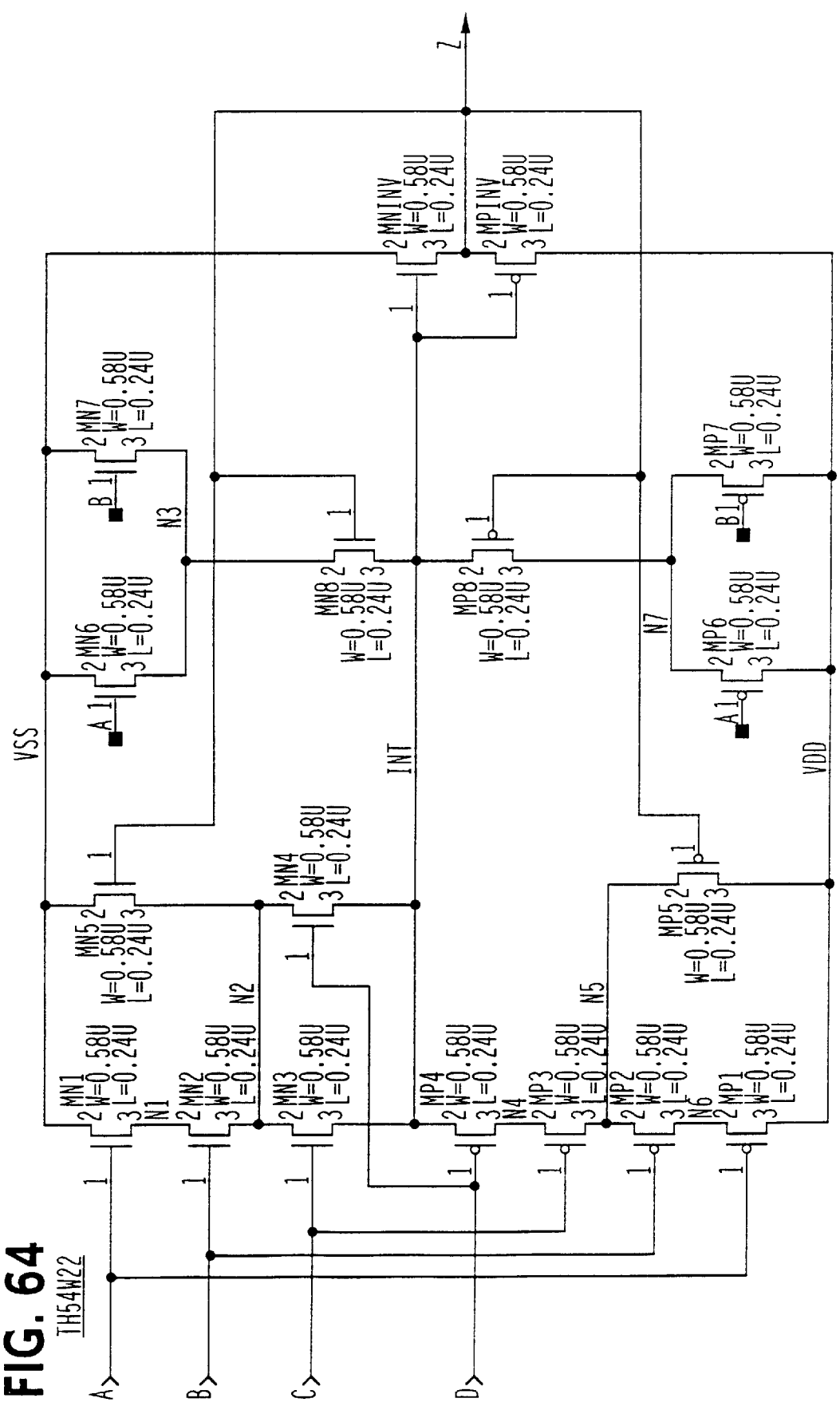
Figure 65:
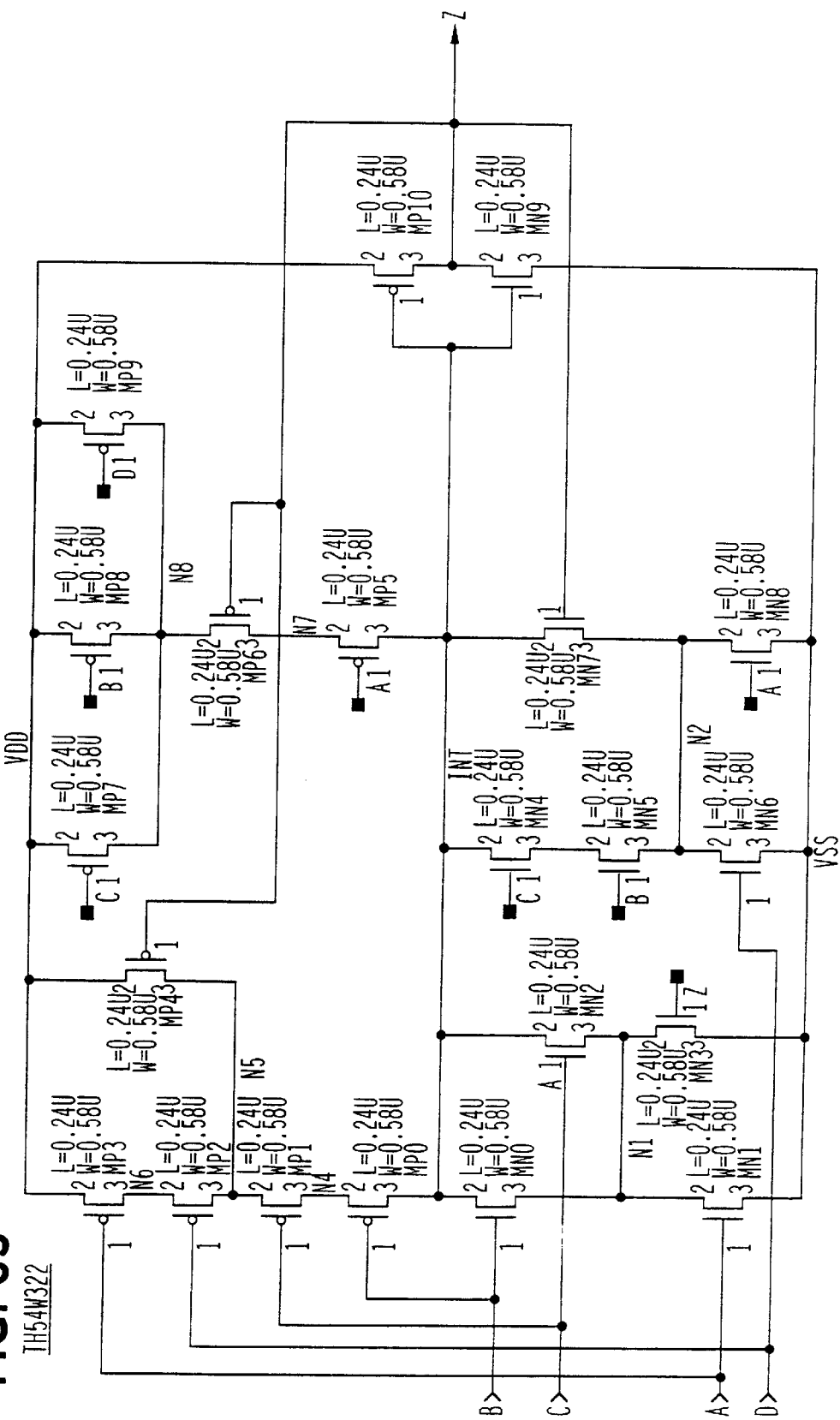
Figure 66:
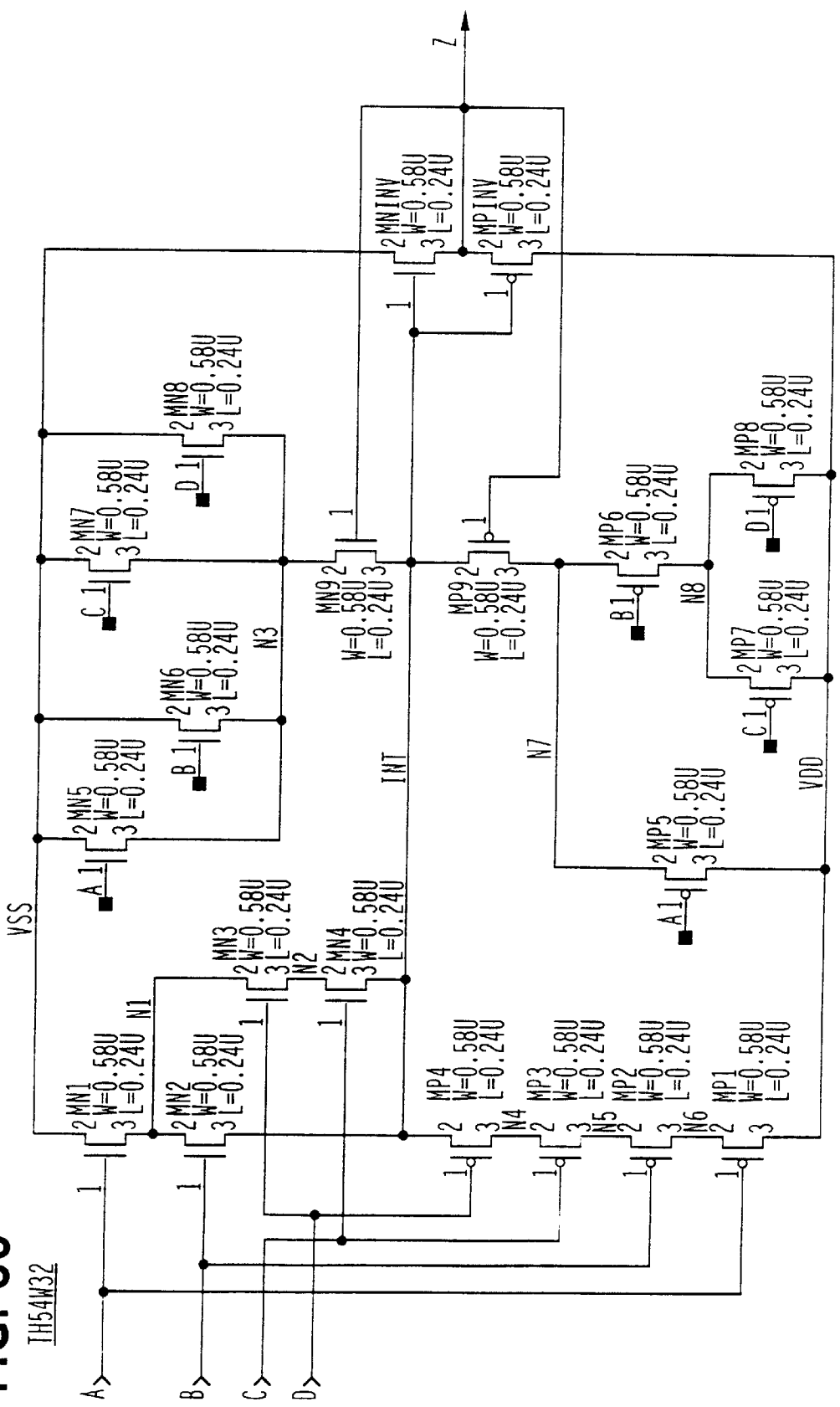
Figure 67:
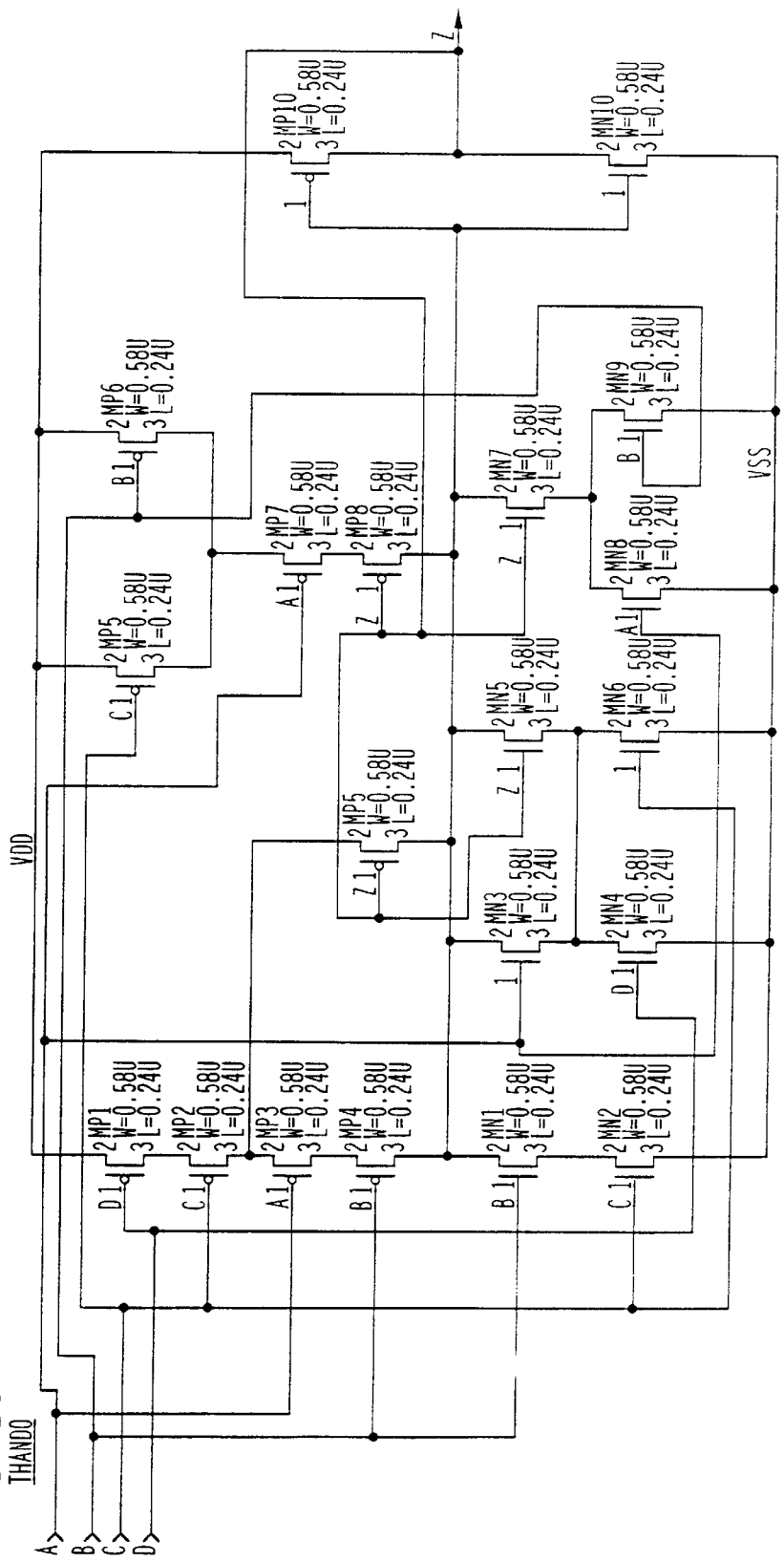
Figure 68:
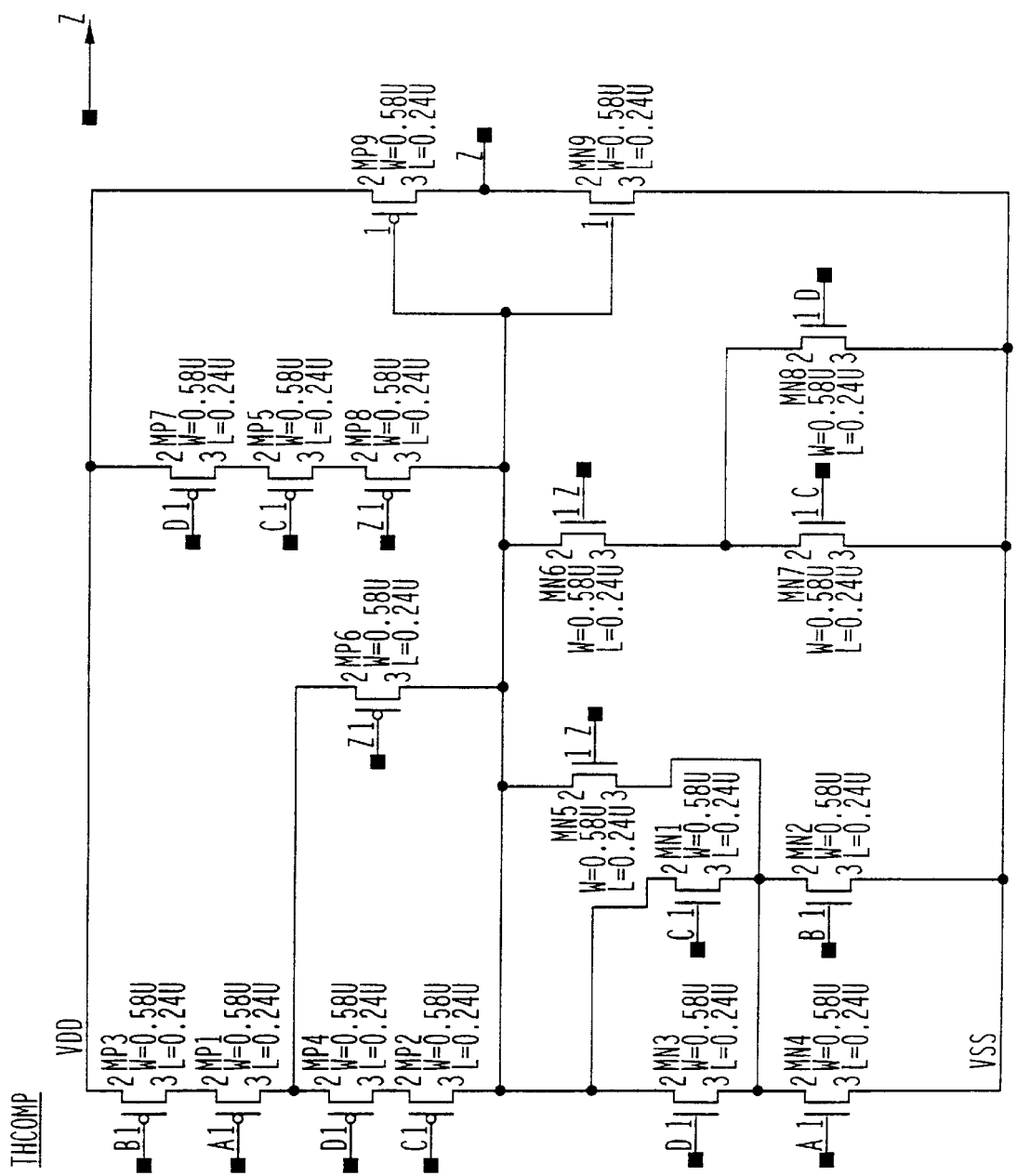
Figure 69:
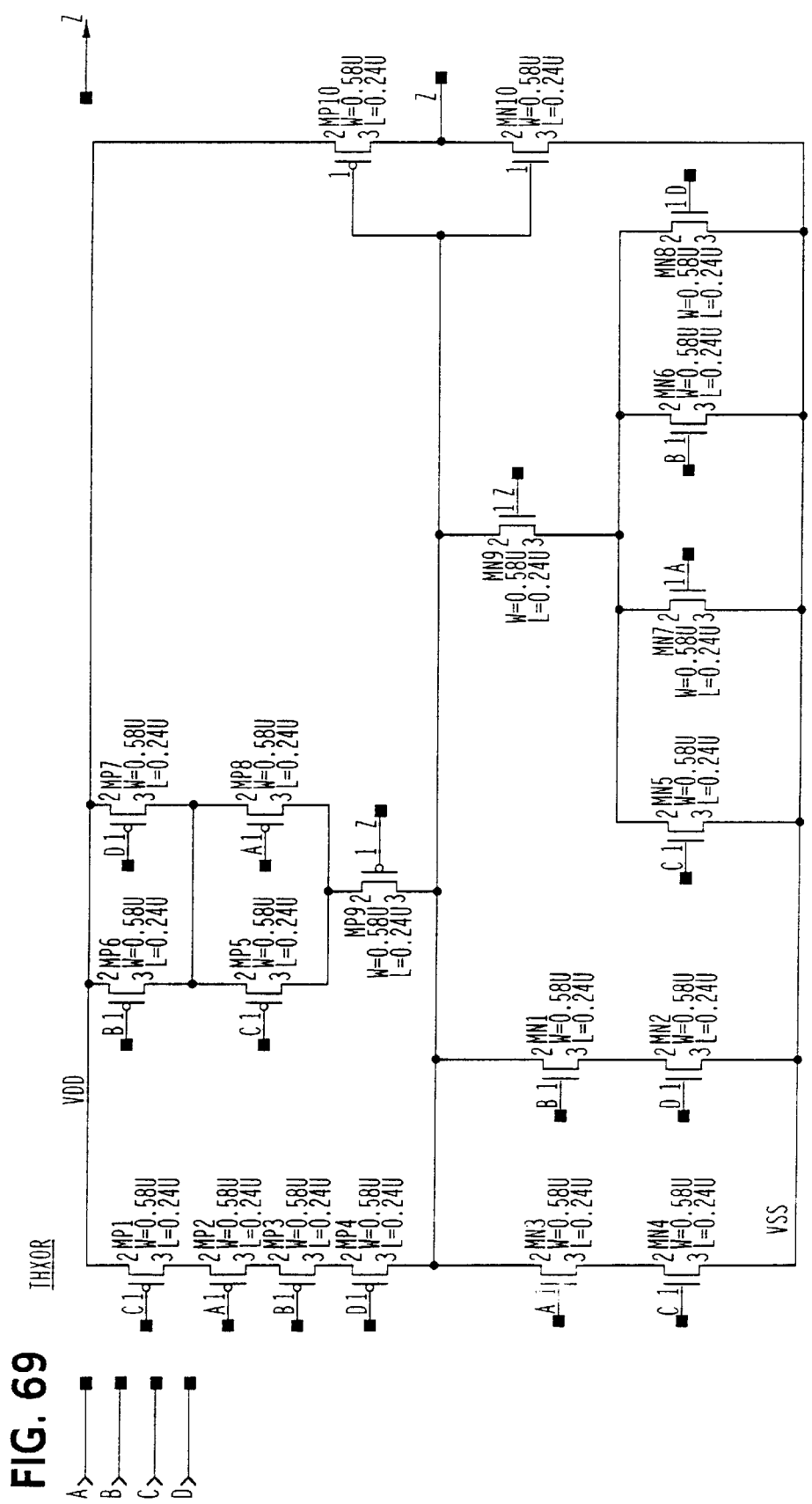

As discussed above, various libraries may be used in the present invention. FIG. 11 shows how the circuit 200 of FIG. 1 can be mapped into a Boolean library that includes CMOS implementations of 28 Boolean functions that characterize gates of the Theseus library noted above. For such pure Boolean libraries, optimization may be limited to AND optimization to remove duplicative testing; global completeness optimization will be ineffective, although one may still attempt such optimization as part of automated processing.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method for designing a multi-rail asynchronous circuit, comprising:

providing a circuit having n circuit paths;

defining a plurality of nodes, each node having an n-rail signal output and at least one n-rail signal input, each rail of the n-rail signal input being connected to a different one of the plurality of circuit paths;

adding completeness detection to each of the plurality of nodes, completion detection for a downstream one of said plurality of nodes being at least partially based on completion detection from an upstream one of said plurality of nodes;

wherein logic signals propagate through said plurality of circuit paths without being retarded by the completeness detection.

2. The method of claim 1, wherein said providing comprises converting a Boolean expression into the circuit.

3. The method of claim 2, wherein said converting further comprises:

mapping the Boolean expression into a library resulting in a plurality of circuits along a circuit path;

converting the circuits along the circuit path into unate circuits; and assigning a dual circuit to each of the unate circuits;

wherein the unate circuits comprise a first of the n circuit paths, the dual circuits comprise a second of the n circuit paths, and the unate circuits and the respective dual circuits define the plurality of nodes.

4. The method of claim 3, further comprising:

providing completeness detection circuitry to at least the primary inputs and those nodes that generate intermediate outputs; and optimizing the completeness detection circuitry.

5. The method of claim 4, wherein said optimizing comprises at least one of:

removing duplicate checking of the same signal;

testing whether the circuit is indicating for any primary input; and testing whether the circuit is indicating for any intermediate output between any of the plurality of nodes.

6. The method of claim 4, wherein said optimizing comprises:

removing duplicate checking of the same signal;

testing whether the circuit is indicating for any primary input; and testing whether the circuit is indicating for any intermediate output between any of the plurality of nodes.

7. A method for designing a multi-rail asynchronous circuit that operates using n-rail signals, the circuit including at least one primary input, at least one primary output, and at least one intermediate output, the method comprising:

providing a circuit having n circuit paths;

defining a plurality of nodes, each node having at least one n-rail signal output and at least one n-rail signal input, each of the n circuit paths providing a rail of the n-rail signal input;

adding completeness detection to at least those nodes that generate intermediate outputs, completion detection for a downstream one of said plurality of nodes being at least partially based on completion detection from an upstream one of said plurality of nodes; and optimizing the completeness detection;

wherein the circuit is capable of propagating logic signals through plurality of circuit paths without being retarded by the completeness detection.

8. The method of claim 7 wherein said optimizing comprises at least one of:

removing duplicate checking of the same signal;

testing whether the circuit is indicating for any primary input; and testing whether the circuit is indicating for any intermediate output between any of the plurality of nodes.

9. The method of claim 7, wherein said optimizing comprises:

removing duplicate checking of the same signal;

testing whether the circuit is indicating for any primary input; and testing whether the circuit is indicating for any intermediate output between any of the plurality of nodes.

10. A method for designing a dual-rail asynchronous circuit from a Boolean expression, comprising:

converting the Boolean expression into a corresponding first plurality of circuits along a first data path;

converting each of the plurality of circuits into an unate circuit;

providing a dual circuit along a second data path, each of said dual circuits being the dual of a corresponding unate circuit, each of the unate circuits and the corresponding one of the dual circuits defining a node; and adding completeness detection circuitry for at least each intermediate output between the nodes such that completion detection of at least one downstream node is based at least partially on completion detection of at least one upstream node;

wherein the completeness detection circuitry does not retard propagation of signals through the nodes.

11. The method of claim 10, further comprising optimizing the completeness detection circuitry, said optimizing comprising at least one of:

removing duplicate checking of the same signal;

testing whether the circuit is indicating for any primary input; and testing whether the circuit is indicating for any intermediate output.

12. The method of claim 10, further comprising optimizing the completeness detection circuitry, wherein said optimizing comprises:

removing duplicate checking of the same signal;

testing whether the circuit is indicating for any primary input;

testing whether the circuit is indicating for any intermediate output; and removing the completeness detection circuitry for any primary input and intermediate output for which the circuit is indicating.

13. A method for adding completeness to an n-rail asynchronous circuit including a plurality of nodes, comprising:

assigning to a completion tree at least all primary inputs to the plurality of nodes and intermediate outputs between any of the plurality of nodes;

optimizing the completion tree, comprising at least one of:

removing duplicate completion detection of any signal;

testing whether the plurality of nodes is indicating for any primary input; and testing whether the plurality of nodes is indicating for any intermediate output;

removing completion detection circuitry that proves unnecessary in response to a result of said optimizing; and designing the circuit based on a result of said removing.

14. A method for adding completion to an n-rail circuit including a plurality of nodes, each node including n rail circuits that define an n-rail output, the n-rail circuit having k primary inputs, comprising:

for each node:
providing circuit logic that can obtain a completion signal for each input to the node;
providing circuit logic that can issue a data signal representing the presence of DATA on the n rails of the n-rail output; and
inputting the output of the circuit logic for the data signal and completion signal for each input to the node into a completion detector;

testing, for each of the k inputs, whether the n-rail circuit is indicating; and removing completion detection for any of the k inputs for which the n-rail circuit is indicating.

15. The method of claim 14, further comprising:

removing the completion detector for a particular node if the n-rail circuit is inherently indicating for all inputs to the particular node.

16. The method of claim 14, said testing comprising:

for each tested input:
disabling the circuit logic that can obtain a completion signal for the tested input;
holding the tested input at NULL;
applying different combinations of DATA to the remaining ones of the k inputs;
determining whether any of the different combinations of DATA will produce a faulty positive such that the n-rail circuit is not indicating for the tested input.

17. The method of claim 16, wherein said determining further comprises receiving a completeness signal for the circuit.

18. The method of claim 16, wherein said determining further comprises receiving a completeness signal for the circuit and receiving DATA on all primary outputs of the circuit.

19. An n-rail asynchronous circuit, comprising:

a plurality of primary inputs to said circuit;

a plurality of nodes in a data path, each node representing at least one n-rail circuit, an output from an upstream node to a downstream node representing an intermediate output; and a completion detection circuit capable of receiving completion detection signals for each of said primary inputs to the circuit and each of said intermediate outputs for which the circuit is not inherently indicating.

20. A register for use in asynchronous n-rail circuits, comprising:

an input side configured to receive at least one n-rail signal and at least one completion signal;

an output side configured to output the at least one n-rail signal;

a plurality of gates configured to provide a circuit path from said input side to said output side in response to receipt of an external signal;

a first completion detector circuit configured to receive each of said at least one completion signal;

for each of the at least one n-rail signal, an individual completion detection circuit configured to receive the n-rails of the at least one signal and to output a completion signal; and a second completion detection circuit configured to receive the output of the first completion detection circuit, each of the individual completion circuits;

wherein said second completion circuit is configured to provide a completion signal for each of the at least one rail signal on said output side.

* * * * *